(12) United States Patent
Inoue et al.

(10) Patent No.: US 9,424,890 B2
(45) Date of Patent: Aug. 23, 2016

(54) SEMICONDUCTOR DEVICE AND DRIVING METHOD THEREOF

(71) Applicant: SEMICONDUCTOR ENERGY LABORATORY CO., LTD., Atsugi-shi, Kanagawa-ken (JP)

(72) Inventors: Hiroki Inoue, Kanagawa (JP); Kiyoshi Kato, Kanagawa (JP); Takanori Matsuzaki, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/951,937

(22) Filed: Nov. 25, 2015

(65) Prior Publication Data

US 2016/0155480 A1  Jun. 2, 2016

(30) Foreign Application Priority Data

Dec. 1, 2014 (JP) ................................. 2014-242844

(51) Int. Cl.
| | |
|---|---|
| *G11C 11/24* | (2006.01) |
| *G11C 5/10* | (2006.01) |
| *H01L 27/06* | (2006.01) |
| *H01L 27/108* | (2006.01) |
| *G11C 7/12* | (2006.01) |

(52) U.S. Cl.
CPC .. *G11C 5/10* (2013.01); *G11C 7/12* (2013.01); *H01L 27/0629* (2013.01); *H01L 27/108* (2013.01)

(58) Field of Classification Search
CPC ...................... G11C 11/401–11/4099
USPC ....................... 365/149, 49.12, 174
See application file for complete search history.

(56) References Cited

U.S. PATENT DOCUMENTS

| | | | |
|---|---|---|---|
| 8,289,753 B2 | 10/2012 | Yamazaki et al. | |
| 8,328,105 B2 | 12/2012 | Fujita | |
| 8,343,799 B2 | 1/2013 | Ito et al. | |
| 8,411,480 B2 | 4/2013 | Nagatsuka et al. | |
| 8,422,272 B2 | 4/2013 | Inoue et al. | |
| 8,487,303 B2 | 7/2013 | Takemura | |
| 8,563,973 B2 | 10/2013 | Inoue et al. | |
| 8,614,916 B2 | 12/2013 | Nagatsuka et al. | |
| 8,634,228 B2 | 1/2014 | Matsuzaki et al. | |
| 2007/0217260 A1 | 9/2007 | Kitagawa | |
| 2010/0060560 A1* | 3/2010 | Sambandan | G06F 3/038 345/92 |
| 2011/0063266 A1* | 3/2011 | Chung | G09G 3/3233 345/205 |
| 2011/0101339 A1 | 5/2011 | Yamazaki et al. | |

(Continued)

FOREIGN PATENT DOCUMENTS

JP  2012-256400  12/2012

*Primary Examiner* — Han Yang
(74) *Attorney, Agent, or Firm* — Nixon Peabody LLP; Jeffrey L. Costellia

(57) ABSTRACT

A semiconductor device capable of inhibiting incorrect data readout is provided. In a memory cell including a first transistor, a second transistor, and a third transistor, the potential of a fourth wiring is set to GND when data is written, and the potential is set to VDD when data is read out, for example. Note that the potential of a third wiring is set to GND when data is written and when data is read out, for example. When data is read out, the first transistor is off, so that a first capacitor and a fourth capacitor are connected in series. The potential of a second electrode of the second capacitor increases in this state, and thus part of charges accumulated in the second capacitor transfers to the first capacitor, so that the potential of a node increases.

17 Claims, 33 Drawing Sheets

(56) References Cited

U.S. PATENT DOCUMENTS

| | | |
|---|---|---|
| 2012/0033488 A1 | 2/2012 | Nagatsuka et al. |
| 2014/0269063 A1 | 9/2014 | Nagatsuka et al. |
| 2014/0269099 A1 | 9/2014 | Nagatsuka et al. |
| 2014/0286073 A1 | 9/2014 | Onuki |
| 2014/0355339 A1 | 12/2014 | Inoue et al. |

* cited by examiner

FIG. 30A
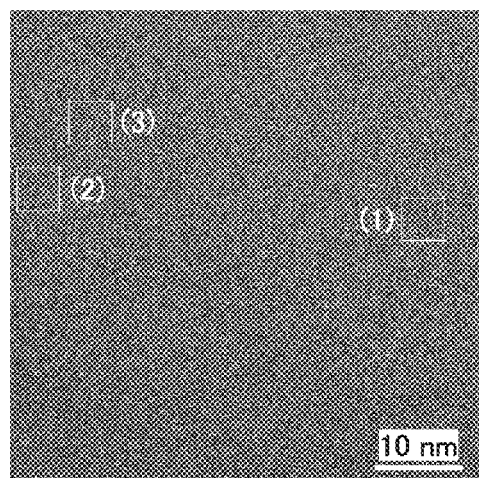
FIG. 30B    FIG. 30C    FIG. 30D
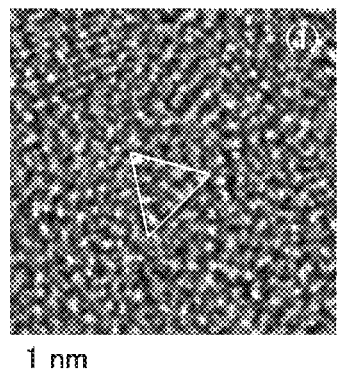 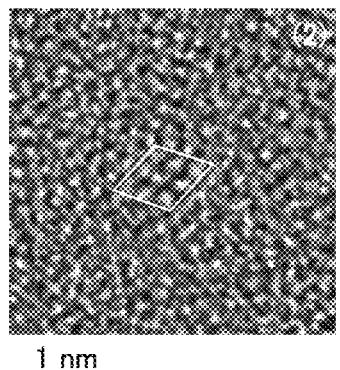 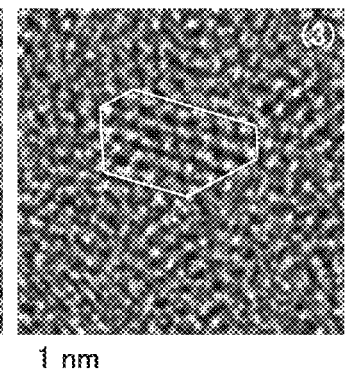

SEMICONDUCTOR DEVICE AND DRIVING METHOD THEREOF

BACKGROUND OF THE INVENTION

1. Field of the Invention

The present invention relates to an object or a method. In particular, the present invention relates to, for example, a semiconductor device, a driving method thereof, or a manufacturing method thereof. In particular, the present invention relates to a semiconductor device including an oxide semiconductor.

2. Description of the Related Art

Patent Document 1 describes a semiconductor device that includes a transistor using an oxide semiconductor film and a transistor using single crystal silicon. Patent Document 1 also describes a transistor using an oxide semiconductor film has extremely low off-state leakage current.

REFERENCE

Patent Document

[Patent Document 1] Japanese Published Patent Application No. 2012-256400

SUMMARY OF THE INVENTION

An object of one embodiment of the present invention is to provide a semiconductor device in which incorrect data readout hardly occurs, a driving method thereof, or a manufacturing method thereof. Another object of one embodiment of the present invention is to provide a highly reliable semiconductor device with high retention characteristics, a driving method thereof, or a manufacturing method thereof. Another object of one embodiment of the present invention is to provide a device, a driving method thereof, or a manufacturing method thereof.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a semiconductor device including a first transistor, a second transistor, a third transistor, a first capacitor, and a second capacitor. One of a source and a drain of the first transistor is electrically connected to a first wiring. The other of the source and the drain of the first transistor is electrically connected to a gate of the second transistor. The other of the source and the drain of the first transistor is electrically connected to a first electrode of the first capacitor. The other of the source and the drain of the first transistor is electrically connected to a first electrode of the second capacitor. One of a source and a drain of the second transistor is electrically connected to a second wiring. The third transistor and the second transistor are electrically connected in series. A second electrode of the first capacitor is electrically connected to a third wiring. A second electrode of the second capacitor is electrically connected to a fourth wiring.

One embodiment of the present invention is a semiconductor device with the above structure in which a gate of the first transistor is electrically connected to a fifth wiring, and a gate of the third transistor is electrically connected to a sixth wiring.

One embodiment of the present invention is a semiconductor device with the above structure in which the other of the source and the drain of the second transistor is electrically connected to one of a source and a drain of the third transistor, and the other of the source and the drain of the third transistor is electrically connected to the first wiring.

One embodiment of the present invention is a semiconductor device with the above structure in which the other of the source and the drain of the second transistor is electrically connected to one of a source and a drain of the third transistor, and the other of the source and the drain of the third transistor is electrically connected to a seventh wiring.

One embodiment of the present invention is a semiconductor device with the above structure in which the one of the source and the drain of the second transistor is electrically connected to one of a source and a drain of the third transistor, the other of the source and the drain of the second transistor is electrically connected to the first wiring, and the other of the source and the drain of the third transistor is electrically connected to the second wiring.

One embodiment of the present invention is a semiconductor device with the above structure in which the one of the source and the drain of the second transistor is electrically connected to one of a source and a drain of the third transistor, the other of the source and the drain of the second transistor is electrically connected to a seventh wiring, and the other of the source and the drain of the third transistor is electrically connected to the second wiring.

One embodiment of the present invention is a semiconductor device with the above structure in which the first transistor includes an oxide semiconductor layer including a channel formation region.

One embodiment of the present invention is a semiconductor device including a first memory cell, a second memory cell, and a third memory cell. Each of the first memory cell, the second memory cell, and the third memory cell includes a first transistor, a second transistor, a third transistor, a first capacitor, and a second capacitor. In the first memory cell, one of a source and a drain of the first transistor is electrically connected to a first wiring. In the second memory cell, one of a source and a drain of the first transistor is electrically connected to a second wiring. In the third memory cell, one of a source and a drain of the first transistor is electrically connected to the first wiring. In each of the first memory cell, the second memory cell, and the third memory cell, the other of the source and the drain of the first transistor is electrically connected to a gate of the second transistor. In each of the first memory cell, the second memory cell, and the third memory cell, the other of the source and the drain of the first transistor is electrically connected to a first electrode of the first capacitor. In each of the first memory cell, the second memory cell, and the third memory cell, the other of the source and the drain of the first transistor is electrically connected to a first electrode of the second capacitor. In the first memory cell, one of a source and a drain of the second transistor is electrically connected to a third wiring. In the second memory cell, one of a source and a drain of the second transistor is electrically connected to a fourth wiring. In the third memory cell, one of a source and a drain of the second transistor is electrically connected to the third wiring. In each of the first memory cell, the second memory cell, and the third memory cell, the third transistor and the second transistor are electrically connected in series. In the first memory cell, a second electrode of the first capacitor is electrically connected to a fifth wiring. In the second memory cell, a second electrode of the first capacitor is electrically connected to the fifth wiring. In the third memory cell, a second electrode of the first capacitor is electrically connected to the fifth wiring. In the first memory cell, a second electrode of the second capacitor is electrically connected to a sixth wiring. In the second memory cell, a second electrode of the second capacitor is electrically connected to the sixth wiring. In the third memory cell, a second electrode of the second capacitor is electrically connected to a seventh wiring.

One embodiment of the present invention is a semiconductor device with the above structure in which in the first memory cell, a gate of the first transistor is electrically connected to an eighth wiring, in the second memory cell, a gate of the first transistor is electrically connected to the eighth wiring, in the third memory cell, a gate of the first transistor is electrically connected to a ninth wiring, in the first memory cell, a gate of the third transistor is electrically connected to a tenth wiring, in the second memory cell, a gate of the third transistor is electrically connected to the tenth wiring, and in the third memory cell, a gate of the third transistor is electrically connected to an eleventh wiring.

One embodiment of the present invention is a semiconductor device with the above structure in which in each of the first memory cell, the second memory cell, and the third memory cell, the other of the source and the drain of the second transistor is electrically connected to one of a source and a drain of the third transistor; in the first memory cell, the other of the source and the drain of the third transistor is electrically connected to the first wiring; in the second memory cell, the other of the source and the drain of the third transistor is electrically connected to the second wiring; and in the third memory cell, the other of the source and the drain of the third transistor is electrically connected to the first wiring.

One embodiment of the present invention is a semiconductor device with the above structure in which in each of the first memory cell, the second memory cell, and the third memory cell, the other of the source and the drain of the second transistor is electrically connected to one of a source and a drain of the third transistor; in the first memory cell, the other of the source and the drain of the third transistor is electrically connected to the third wiring; in the second memory cell, the other of the source and the drain of the third transistor is electrically connected to the fourth wiring; and in the third memory cell, the other of the source and the drain of the third transistor is electrically connected to the third wiring.

One embodiment of the present invention is a semiconductor device with the above structure in which in each of the first memory cell, the second memory cell, and the third memory cell, the other of the source and the drain of the second transistor is electrically connected to one of a source and a drain of the third transistor; in the first memory cell, the other of the source and the drain of the third transistor is electrically connected to a twelfth wiring; in the second memory cell, the other of the source and the drain of the third transistor is electrically connected to a thirteenth wiring; and in the third memory cell, the other of the source and the drain of the third transistor is electrically connected to the twelfth wiring.

One embodiment of the present invention is a semiconductor device with the above structure in which in each of the first memory cell, the second memory cell, and the third memory cell, the one of the source and the drain of the second transistor is electrically connected to the one of the source and the drain of the third transistor; in the first memory cell, the other of the source and the drain of the second transistor is electrically connected to a twelfth wiring; in the second memory cell, the other of the source and the drain of the second transistor is electrically connected to a thirteenth wiring; in the third memory cell, the other of the source and the drain of the second transistor is electrically connected to the twelfth wiring; in the first memory cell, the other of the source and the drain of the third transistor is electrically connected to the third wiring; in the second memory cell, the other of the source and the drain of the third transistor is electrically connected to the fourth wiring; and in the third memory cell, the other of the source and the drain of the third transistor is electrically connected to the third wiring.

One embodiment of the present invention is a semiconductor device with the above structure in which in each of the first memory cell, the second memory cell, and the third memory cell, the first transistor includes an oxide semiconductor layer including a channel formation region.

One embodiment of the present invention is a method for driving a semiconductor device including a memory cell. The memory cell includes a first transistor, a second transistor, a third transistor, a first capacitor, and a second capacitor. One of a source and a drain of the first transistor is electrically connected to a first wiring. The other of the source and the drain of the first transistor is electrically connected to a gate of the second transistor. The other of the source and the drain of the first transistor is electrically connected to a first electrode of the first capacitor. The other of the source and the drain of the first transistor is electrically connected to a first electrode of the second capacitor. One of a source and a drain of the second transistor is electrically connected to a second wiring. The other of the source and the drain of the second transistor is electrically connected to one of a source and a drain of the third transistor. The other of a source and a drain of the third transistor is electrically connected to the first wiring. The method includes a step of supplying a first potential to a second electrode of the first capacitor and a second electrode of the second capacitor when data is written to the memory cell, and a step of supplying the first potential to the second electrode of the first capacitor and a second potential to the second electrode of the second capacitor.

One embodiment of the present invention is a method for driving a semiconductor device with the above structure and steps, in which the first transistor is an N-channel transistor, the second transistor is a P-channel transistor, and the second potential is higher than the first potential.

One embodiment of the present invention is a method for driving a semiconductor device with the above structure and steps, in which when the data is read out from the memory cell, the second potential is supplied to the second wiring.

A semiconductor device of one embodiment of the present invention can prevent incorrect data readout even when the potential of a gate of a second transistor is changed in data retaining operation. A semiconductor device of one embodiment of the present invention can have high retention characteristics and high reliability. A semiconductor device of one embodiment of the present invention can achieve power reduction.

BRIEF DESCRIPTION OF THE DRAWINGS

FIGS. 30A to 30D are Cs-corrected high-resolution TEM images of a plane of a CAAC-OS.

DETAILED DESCRIPTION OF THE INVENTION

Figure 1A:
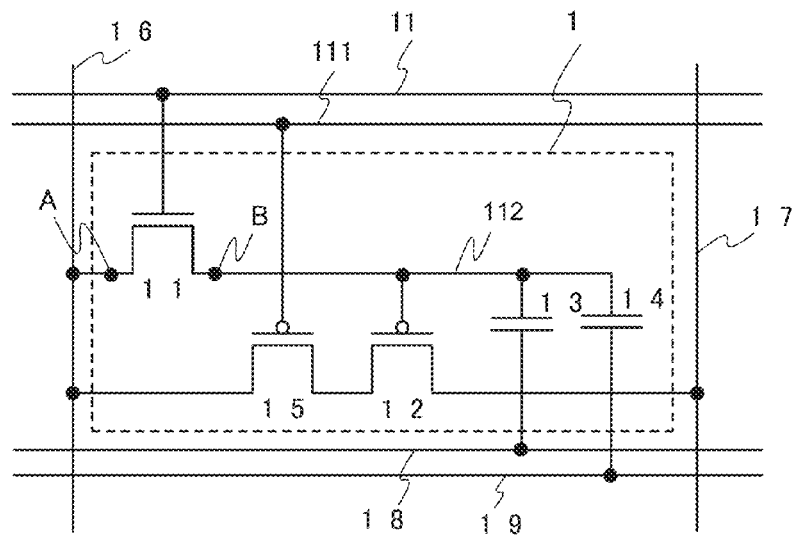
FIG. 1A is a circuit diagram of a memory cell.

Embodiments of the present invention are described below with reference to the drawings. Note that the present invention is not limited to the following description. It is readily appreciated by those skilled in the art that various changes and modifications are possible without departing from the spirit and the scope of the present invention. Therefore, the present invention should not be construed as being limited to the following description of the embodiments. Note that in describing the structure of the present invention with reference to the drawing, reference numerals denoting the same portions are used in different drawings in common in some cases.

Although the block diagram attached to this specification shows components classified by their functions in independent blocks, it is difficult to classify actual components according to their functions completely and it is possible for one component to have a plurality of functions.

A gate, a source, and a drain of a transistor are terminals of the transistor, and also referred to as a gate terminal, a source terminal, and a drain terminal, respectively. As to a source and a drain, which of the two terminals is a source or a drain is determined by a voltage applied between these terminals, not by a structure of a transistor. In other words, one terminal is a source and the other terminal is a drain at some instant, but the one terminal is a drain and the other terminal is a source at the other instant. For this reason, when circuit configurations are described in this specification, a source and a drain of a transistor are also referred to as a first terminal and a second terminal.

Note that what is described (or part thereof) in one embodiment can be applied to, combined with, or exchanged with another content in the same embodiment and/or what is described (or part thereof) in another embodiment or other embodiments.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

Note that the ordinal numbers such as "first" and "second" in this specification are used for convenient differentiation and do not denote a particular order.

Embodiment 1

A memory cell 100 included in a semiconductor device is described. The memory cell 100 illustrated in FIG. 1A includes a first transistor 101, a second transistor 102, a first capacitor 103, a second capacitor 104, and a third transistor 105. For example, the semiconductor device is a memory device. Note that the semiconductor device is not limited to a memory device that mainly functions as a memory, and may have other functions. For example, the semiconductor device is a central processing unit (CPU) including the memory cell 100. For example, the semiconductor device is a computer (e.g., a personal computer or a microcomputer) including the central processing unit. For example, the semiconductor device is an electronic device including, in addition to the computer, a physical device, an electromagnetic device, a visual device, an auditory device, or the like.

A first terminal of the first transistor 101 is electrically connected to a first wiring 106. A second terminal of the first transistor 101 is electrically connected to a gate of the second transistor 102. The second terminal of the first transistor 101 is electrically connected to a first electrode of the first capacitor 103. The second terminal of the first transistor 101 is electrically connected to a first electrode of the second capacitor 104. A first terminal of the second transistor 102 is electrically connected to a second wiring 107. A second terminal of the second transistor 102 is electrically connected to a first terminal of the third transistor 105. A second terminal of the third transistor 105 is electrically connected to the first wiring 106. That is, the second transistor 102 and the third transistor 105 are electrically connected in series. A second electrode of the first capacitor 103 is electrically connected to a third wiring 108. A second electrode of the second capacitor 104 is electrically connected to a fourth wiring 109. A gate of the first transistor 101 is electrically connected to a fifth wiring 110. A gate of the third transistor 105 is electrically connected to a sixth wiring 111.

The expression "a terminal of a first circuit element is electrically connected to a terminal of a second circuit element" means that the terminal of the first circuit element is connected to the terminal of the second circuit element through an electrical pathway without passing through at least one of the first circuit element and the second circuit element. For example, in FIG. 1A, when the first terminal of the first transistor 101 is electrically connected to the first wiring 106 and the second terminal of the first transistor 101 is electrically connected to the gate of the second transistor 102, it is primarily determined that a node A is the first terminal and a node B is the second terminal. The above expression defines connection with such an electrical pathway, but does not exclude a structure in which the second terminal of the first transistor 101 (the node B) is electrically connected to the first wiring 106 in FIG. 1A, for example.

The expression "the terminal of the first circuit element is connected to the terminal of the second circuit element through an electrical pathway without passing through at least one of the first circuit element and the second circuit element" includes the case where the terminal of the first circuit element is directly connected to the terminal of the second circuit element and the case where the terminal of the first circuit element is indirectly connected to the terminal of the second circuit element through a third circuit element. For example, in the case where the electrical pathway is composed of only elements capable of transmitting a signal or a voltage from/to the terminal of the first circuit element to/from the terminal of the second circuit element without substantially changing an amplitude and a phase of the signal and substantially changing a level of the voltage, such as wirings and electrodes, it can be defined that the terminal of the first circuit element is directly connected to the terminal of the second circuit element. In the case where the electrical pathway includes a circuit element, such as a transistor, a capacitor, a diode, or a resistor, it can be defined that the terminal of the first circuit element is indirectly connected to the terminal of the second circuit element.

The second terminal of the first transistor 101, the gate of the second transistor 102, the first electrode of the first capacitor 103, and the first electrode of the second capacitor 104 are electrically connected to one another. Part of or the whole electrical pathway of this connection is referred to as a node 112. The node 112 is, in practice, a wiring or an electrode, or part thereof. The node 112 may include part of the second terminal of the first transistor 101, part of the gate of the second transistor 102, part of the first electrode of the first capacitor 103, and part of the first electrode of the second capacitor 104.

In FIG. 1A, the first transistor 101 is an N-channel transistor, and the second transistor 102 and the third transistor 105 are P-channel transistors.

Figure 1B:
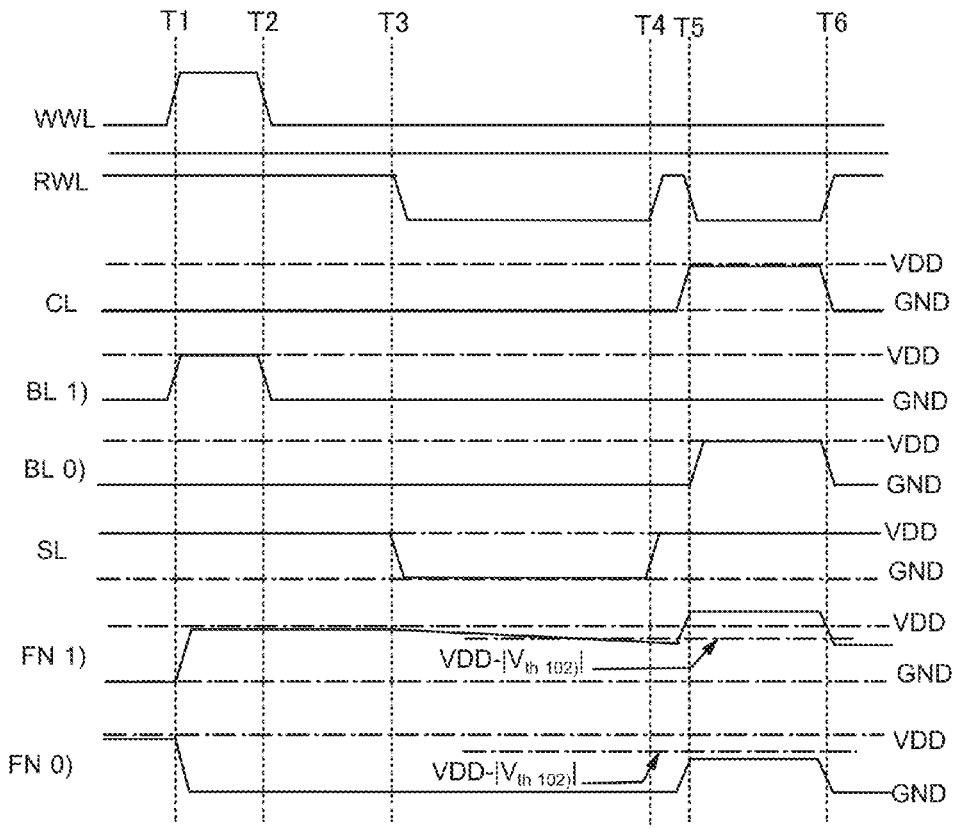
FIG. 1B is a timing chart of the memory cell.

Operation of the memory cell 100 illustrated in FIG. 1A is described with reference to the timing chart in FIG. 1B. The first wiring 106 in FIG. 1A is also referred to as a bit line. In FIG. 1B, a signal of the bit line for writing data "1" to the memory cell 100 is denoted by BL(1), and a signal of the bit line for writing data "0" to the memory cell 100 is denoted by BL(0). The second wiring 107 in FIG. 1A is also referred to as a source line. In FIG. 1B, a signal of the source line is denoted by SL. The fourth wiring 109 in FIG. 1A is also referred to as a capacitor wiring. In FIG. 1B, a signal of the capacitor wiring is denoted by CL. The fifth wiring 110 in FIG. 1A is also referred to as a write word line. In FIG. 1B, a signal of the write word line is denoted by WWL. The sixth wiring 111 in FIG. 1A is also referred to as a read word line. In FIG. 1B, a signal of the read word line is denoted by RWL. The node 112 in FIG. 1A is also referred to as a floating node. In FIG. 1B, a potential of the floating node for writing data "1" to the memory cell 100 is denoted by FN(1), and a potential of the floating node for writing data "0" to the memory cell 100 is denoted by FN(0).

The potential of the third wiring 108 is a fixed potential. For example, the potential of the third wiring 108 is kept at GND. The third wiring 108 is also referred to as a common wiring. Note that it is not necessary to keep the third wiring 108 at a fixed potential throughout power supply to the semiconductor device as long as the third wiring 108 is kept at a fixed potential at least during a period from time T1 to time T2 and a period from time T5 to time T6. Preferably, the third wiring 108 is kept at a fixed potential during a period from time T1 to time T3 and a period from time T4 to time T6.

In FIG. 1B, data is written to the memory cell 100 in the period from time T1 to time T2. This period is also referred to as a writing period. The data is retained until next data is written. A period from time T2 to time T5 is also referred to as a data retention period. During a period from time T2 to time T3 and a period from time T4 to time T5 in the data retention period, power is supplied to the memory cell 100. During a period from time T3 to time T4, the power supply to the memory cell 100 is stopped. This period is also referred to as a power supply stop period. During the period from time T5 to time T6, data is read out from the memory cell 100. This period is also referred to as a reading period.

When a potential of a signal is higher than a certain potential (in general, an intermediate value of amplitude of the signal), the potential of the signal is called an H-level potential. When a potential of a signal is lower than the certain potential, the potential of the signal is called an L-level potential. Note that an H-level potential of a signal during a certain period is not always completely the same as an H-level potential of the signal during another period. Similarly, an L-level potential of a signal during a certain period is not always completely the same as an L-level potential of the signal during another period.

At time T1, the WWL input to the fifth wiring 110 (write word line) is changed from an L-level potential to an H-level potential, whereby the first transistor 101 is turned on.

When data "1" is written to the memory cell 100, just before, just after, or at the same timing as this timing, BL(1) to be input to the first wiring 106 (bit line) is changed from an L-level potential to an H-level potential. As a result, FN(1) becomes an H-level potential. When an H-level potential of BL(1) is VDD, FN(1) of the node 112 (floating node) is a potential slightly lower than VDD. When an H-level potential of WWL input to the fifth wiring 110 (write word line) is higher than or equal to the sum of a threshold voltage $V_{th(101)}$ of the first transistor 101 and VDD, FN(1) is substantially VDD.

When data "0" is written to the memory cell 100. BL(0) input to the first wiring 106 (bit line) is kept an L level. As a result, FN(0) becomes an L-level potential. When an L-level potential of BL(0) is GND, FN(0) of the node 112 (floating node) is substantially GND.

At time T2, the WWL input to the fifth wiring 110 (write word line) is changed from an H-level potential to an L-level potential, whereby the first transistor 101 is turned off. As a result, electric charges at the node 112 (floating node) are held. When data "1" is written to the memory cell 100, the H-level potential is held in the memory cell. That is, data "1" is retained in the memory cell 100. When data "0" is written to the memory cell 100, the L-level potential is held in the memory cell. That is, data "0" is retained in the memory cell 100. For example, the first transistor 101 is a transistor including an oxide semiconductor layer where a channel formation region is formed. An off-state current of such a transistor is extremely small. Thus, the amount of electric charges at the node 112 is hardly changed while the first transistor 101 is off. Therefore, the memory cell 100 can retain data for a long period.

At time T3, power supply to the memory cell 100 is stopped. At this time, power supply to the semiconductor device may be stopped. SL of the second wiring 107 (source line) becomes GND, and RWL of the sixth wiring 111 (read word line) becomes an L-level potential. For example, the first transistor 101 is an enhancement-mode transistor (also referred to as a normally-off transistor) including an oxide semiconductor layer where a channel formation region is formed. Since such a transistor is off when voltage is not applied between a gate and a source thereof, the memory cell 100 can retain data for a long period even while power supply to the memory cell 100 is stopped.

At time T4, power supply to the memory cell 100 is restarted. SL of the second wiring 107 (source line) becomes VDD, and RWL of the sixth wiring 111 (read word line) becomes an H-level potential. Before time T5, the first wiring 106 (bit line) is precharged to have an L-level potential. In this embodiment, the potential of the first wiring 106 is set to GND. After that, the first wiring 106 (bit line) is brought into a floating state. A certain element (e.g., a wiring, an electrode, or a node) in a floating state means that the element does not give and receive electrical charges even when a potential of the element changes.

At time T5, RWL of the sixth wiring 111 (read word line) is set to an L-level potential, and CL of the fourth wiring 109 (capacitor line) is set to VDD. Since RWL is an L-level potential, the third transistor 105 is turned on. CL of the fourth wiring 109 (capacitor line) increases from GND to VDD, so that a potential of the node 112 (floating node) also increases by $\Delta V$ due to capacitive coupling. When data "1" is written to the memory cell 100, the second transistor 102 is off. Therefore, BL(1) of the first wiring 106 (bit line) does not change and remains at GND. When data "0" is written to the memory cell 100, the second transistor 102 is on. Thus, current flows from the second wiring 107 to the first wiring 106, and BL(0) of the first wiring 106 (bit line) increases to VDD. Thus, when data "1" is written to the memory cell 100, in other words, when the potential of the first wiring 106 (bit line) during the writing period is an H-level potential, the signal is read out from the first wiring 106 (bit line) as an L-level potential. When data "0" is written to the memory cell 100, in other words, when the potential of the first wiring 106 (bit line) during the writing period is an L-level potential, the signal is read out from the first wiring 106 (bit line) as an H-level potential.

At time T6. RWL of the sixth wiring 111 (read word line) is set to an H-level potential, and CL of the fourth wiring 109 (capacitor line) is set to an L-level potential. The third transistor 105 is turned off; consequently, data readout from the memory cell 100 is completed. When CL of the fourth wiring 109 (capacitor line) decreases from VDD to GND, the potential of the node 112 (floating node) also decreases by $\Delta V$ due to capacitive coupling.

When data "1" is written to the memory cell 100, actually, electric charges held at the node 112 (floating node) keep decreasing during a period from time T2 to time T5. Since the first transistor 101 described in this embodiment is an enhancement-mode transistor (also referred to as a normally-off transistor) including an oxide semiconductor layer where a channel formation region is formed and thus has a significantly small off-state current, electric charges held at the node 112 (floating node) decrease very slowly. Accordingly, change in FN(1) of the node 112 (floating node) is gradual.

However, in the case where the period from time T2 to time T5 (in particular, the period from time T3 to time T4) is 10 years or longer (in particular, several tens of years or longer), FN(1) of the node 112 (floating node) greatly decreases from VDD in some cases. When the threshold voltage of the second transistor 102 is $V_{th(102)}$ and FN(1) of the node 112 (floating node) is lower than VDD–$|V_{th(102)}|$, the second transistor 102 is turned on. Therefore, data written to the memory cell 100 cannot be read out correctly. In the memory cell 100 described in this embodiment, however, even when FN(1) of the node 112 (floating node) is lower than VDD–$|V_{th(102)}|$ before time T5, it increases by $\Delta V$ at time T5; thus, FN(1) of the node 112 (floating node) becomes higher than VDD–$|V_{th(102)}|$, so that data written to the memory cell 100 can be read out correctly. Consequently, after 10 years or longer of the stop of power supply to the memory cell 100 or the semiconductor device, data can be read out correctly from the memory cell 100.

The larger $\Delta V$ is, the longer the data retention time in the memory cell 100 can be when data "1" is written to the memory cell 100. However, when data "0" is written to the memory cell 100 and $\Delta V$ is too large, FN(0) of the node 112 (floating node) is higher than VDD–$|V_{th(102)}|$ and thus the second transistor 102 is turned off, so that data cannot be read out correctly from the memory cell 100. At time T5, GND is applied to the second electrode of the first capacitor 103, and VDD is applied to the second electrode of the second capacitor 104. The node 112 (floating node) is in a floating state, and the first capacitor 103 and the second capacitor 104 are connected in series. In the case where capacitance of the first capacitor 103 is represented by Csf, capacitance of the second capacitor 104 is represented by Csd, and the parasitic capacitance formed at the node 112 (floating node) is much smaller than the capacitances of these capacitors, the increase $\Delta V$ in potential of the node 112 (floating node) is expressed by the equation: $\Delta V=(VDD-GND)\times Csd/(Csf+Csd)$. That is, the increase $\Delta V$ in potential of the node 112 (floating node) is determined depending on the capacitance ratio between the first capacitor 103 and the second capacitor 104. In this embodiment, the capacitance ratio between the first capacitor 103 and the second capacitor 104 is 1:1, and $\Delta V=(VDD-GND)/2$.

In the case where the memory cell 100 does not include the first capacitor 103, $\Delta V=VDD-GND$, FN(0) of the node 112 (floating node) is higher than VDD–$|V_{th(102)}|$, and thus the second transistor 102 is turned off, so that data cannot be read out correctly from the memory cell 100. In order to read out data correctly from the memory cell 100, a potential applied to the fourth wiring 109 during the period from time T5 to time T6 needs to be lower than VDD. That is, the potential applied to the fourth wiring 109 needs to be lower than VDD and higher than GND. For this reason, the semiconductor device needs a power supply circuit that generates such a potential. The power supply circuit consumes electrical power, therefore, power consumption of the semiconductor device is increased. For reducing the power consumption, VDD used in the semiconductor device is required to be low. Moreover, when VDD is low, for example, 1.2 V, the power supply circuit is required to generate a potential lower than VDD, for example, 0.6 V. It is difficult to manufacture a power supply circuit that stably supplies such a low potential. A semiconductor device including the memory cell 100 described in this embodiment can retain data for a long period without including the power supply circuit. Accordingly, a reduction in power consumption of the semiconductor device can be achieved.

Figure 2:
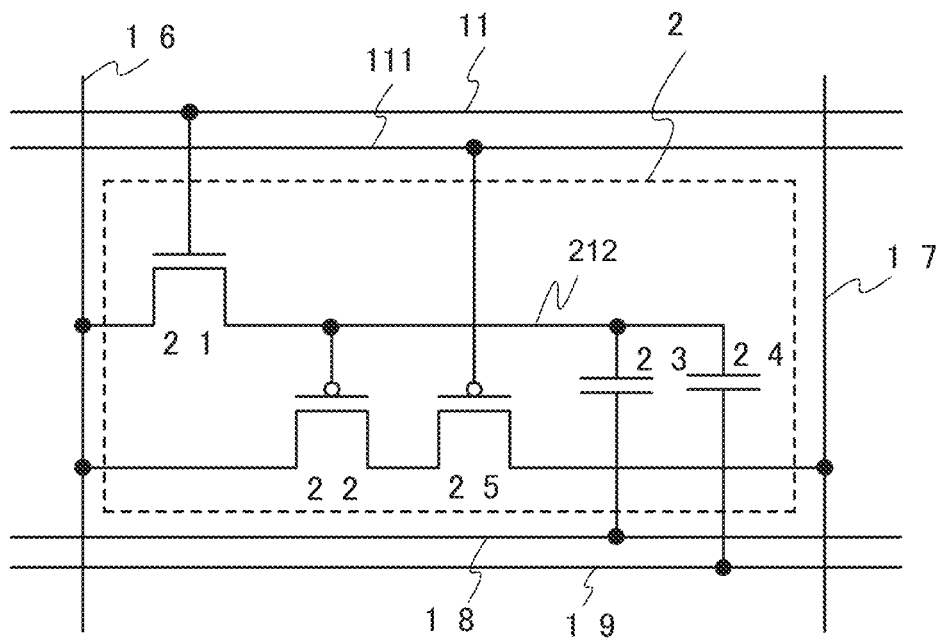
FIG. 2 is a circuit diagram of a memory cell.

FIG. 2 illustrates a memory cell 200, which is different from the memory cell 100, included in the semiconductor device described in this embodiment. The memory cell 200 illustrated in FIG. 2 includes a first transistor 201, a second transistor 202, a first capacitor 203, a second capacitor 204, and a third transistor 205.

A first terminal of the first transistor 201 is electrically connected to the first wiring 106. A second terminal of the first transistor 201 is electrically connected to a gate of the second transistor 202. The second terminal of the first transistor 201 is electrically connected to a first electrode of the first capacitor 203. The second terminal of the first transistor 201 is electrically connected to a first electrode of the second capacitor 204. A first terminal of the second transistor 202 is electrically connected to a first terminal of the third transistor 205. A second terminal of the second transistor 202 is electrically connected to the first wiring 106. A second terminal of the third transistor 205 is electrically connected to the second wiring 107. A second electrode of the first capacitor 203 is electrically connected to the third wiring 108. A second electrode of the second capacitor 204 is electrically connected to the fourth wiring 109. A gate of the first transistor 201 is electrically connected to the fifth wiring 110. A gate of the third transistor 205 is electrically connected to the sixth wiring 111.

The second terminal of the first transistor 201, the gate of the second transistor 202, the first electrode of the first capacitor 203, and the first electrode of the second capacitor 204 are electrically connected to one another. Part of or the whole electrical pathway of this connection is referred to as a node 212. The node 212 is, in practice, a wiring or an electrode, or part thereof. The node 212 may include part of the second terminal of the first transistor 201, part of the gate of the second transistor 202, part of the first electrode of the first capacitor 203, and part of the first electrode of the second capacitor 204.

The first transistor 201, the second transistor 202, the first capacitor 203, the second capacitor 204, the third transistor 205, and the node 212 in the second memory cell 200 correspond to the first transistor 101, the second transistor 102, the first capacitor 103, the second capacitor 104, the third transistor 105, and the node 112 in the memory cell 100, respectively. A difference between the memory cell 100 and the memory cell 200 is as follows: the first terminal of the second transistor 102 in the memory cell 100 is connected to the second wiring 107 without passing through the third transistor 105; in contrast, a first terminal of the second transistor 202 in the memory cell 200 is connected to the second wiring 107 through the third transistor 205. The operation of the memory cell 200 is similar to that of the memory cell 100. The second transistor 202 and the third transistor 205 are electrically connected in series.

Figure 3A:
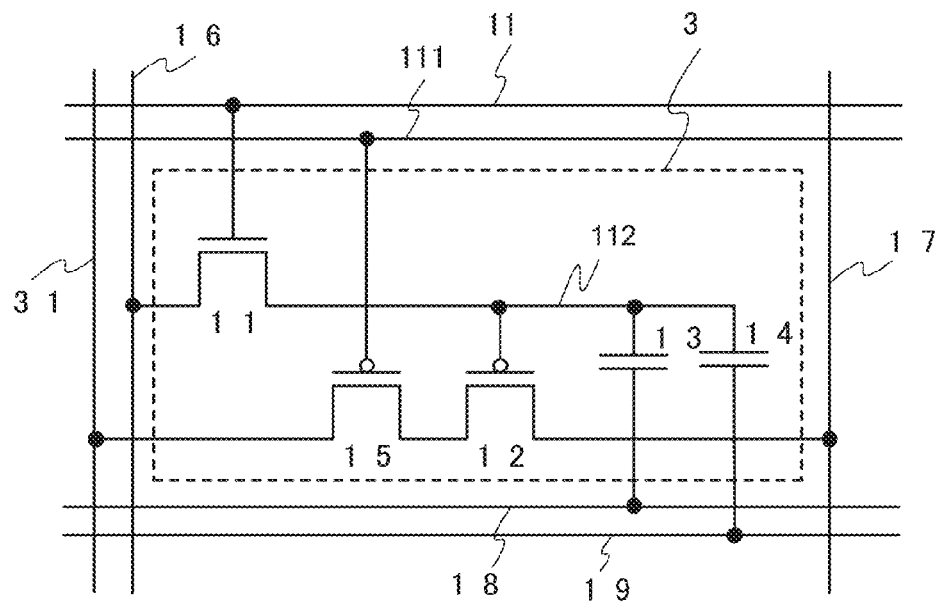
FIGS. 3A and 3B are circuit diagrams of memory cells.
Figure 3B:
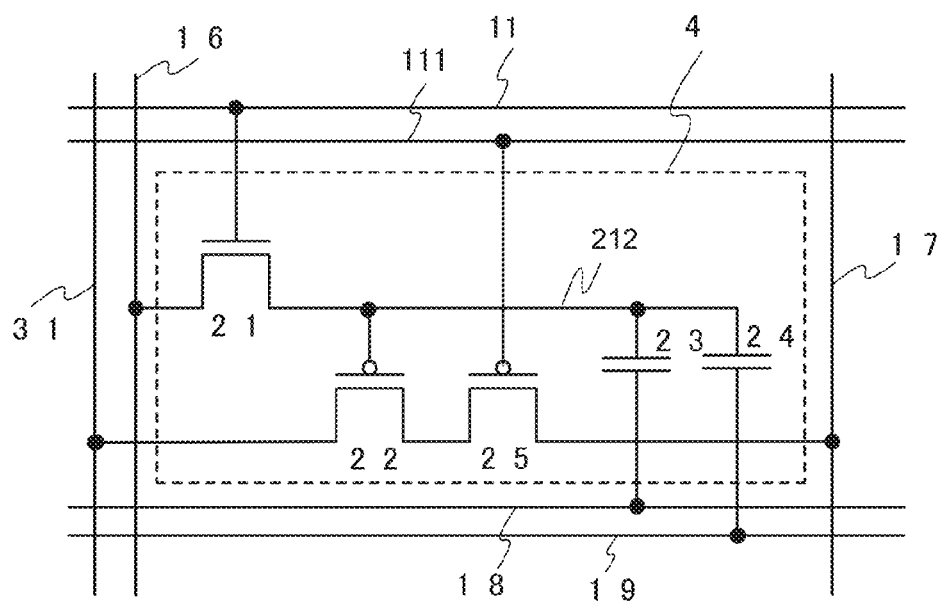

FIGS. 3A and 3B illustrate a memory cell 300 and a memory cell 400, respectively, which are different from the memory cell 100 and the memory cell 200, included in the semiconductor device described in this embodiment.

A difference between the memory cell 100 and the memory cell 300 is as follows: a second terminal of the third transistor 105 in the memory cell 100 is electrically connected to the first wiring 106; the second terminal of the third transistor 105 in the memory cell 300 is electrically connected to the seventh wiring 301. For connections except for this point in the memory cell 300, the description of the connections in the memory cell 100 can be referred to.

A difference between the memory cell 200 and the memory cell 400 is as follows: a second terminal of the second transistor 202 in the memory cell 200 is electrically connected to the first wiring 106; the second terminal of the second transistor 202 in the memory cell 400 is electrically connected to the seventh wiring 301. For connections except for this point in the memory cell 400, the description of the connections in the memory cell 200 can be referred to.

The first wiring 106 illustrated in FIGS. 3A and 3B is also referred to as a write bit line. The seventh wiring 301 is also referred to as a read bit line.

Figure 4:
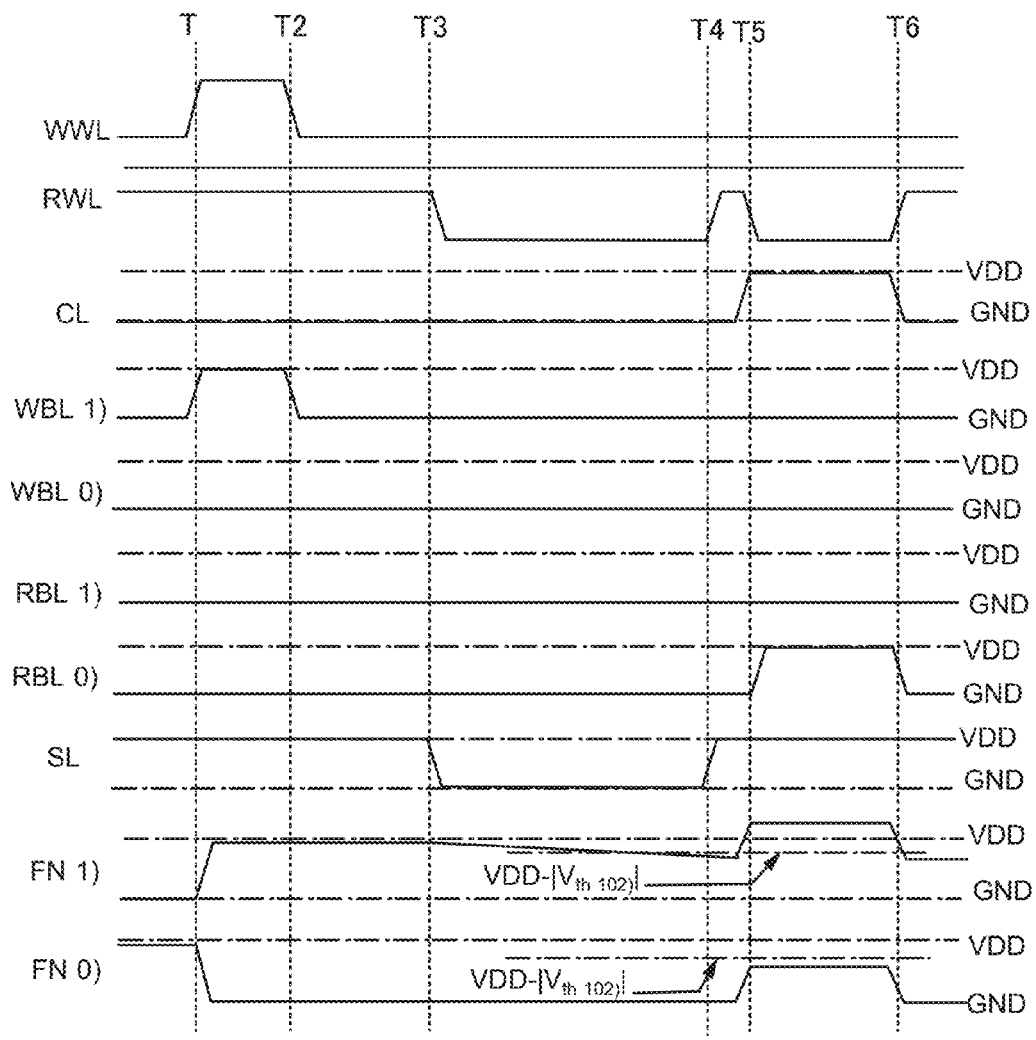
FIG. 4 is a timing chart of a memory cell.

Since the memory cell 300 and the memory cell 400 operate in a manner similar to that of the memory cell 100, for the operations of the memory cells 300 and 400, description of the operation of the memory cell 100 can be referred to. A difference between the operations of the memory cells 300 and 400 and the operation of the memory cell 100 is described with reference to a timing chart of FIG. 4. In FIG. 4, a signal of the write bit line for writing data "i" to the memory cell 300 and the memory cell 400 is denoted by WBL(1); a signal of the write bit line for writing data "0" to the memory cell 300 and the memory cell 400 is denoted by WBL(0); a signal of the read bit line for writing data "1" to the memory cell 300 and the memory cell 400 is denoted by RBL(1); and a signal of the read bit line for writing data "0" to the memory cell 300 and the memory cell 400 is denoted by RBL(0). During a period from time T1 to time T4, the signal of the first wiring 106 (bit line) in the memory cell 100 has the same waveform as the signal of the first wiring 106 (write bit line) in the memory cell 300 and in the memory cell 400. At and after time T4, the signal of the first wiring 106 (bit line) in the memory cell 100 has the same waveform as the signal of the seventh wiring 301 (read bit line) in the memory cell 300 and in the memory cell 400. In the memory cell 100, the first wiring 106 (bit line) is precharged before time T5 to have an L-level potential. In the memory cell 300 and the memory cell 400, the potential of the seventh wiring 301 (read bit line) is set to an L-level potential, and then, the seventh wiring 301 (read bit line) is brought into a floating state. Thus, data retained in the memory cell 300 or 400 is read out from the seventh wiring 301 (read bit line).

Figure 5:
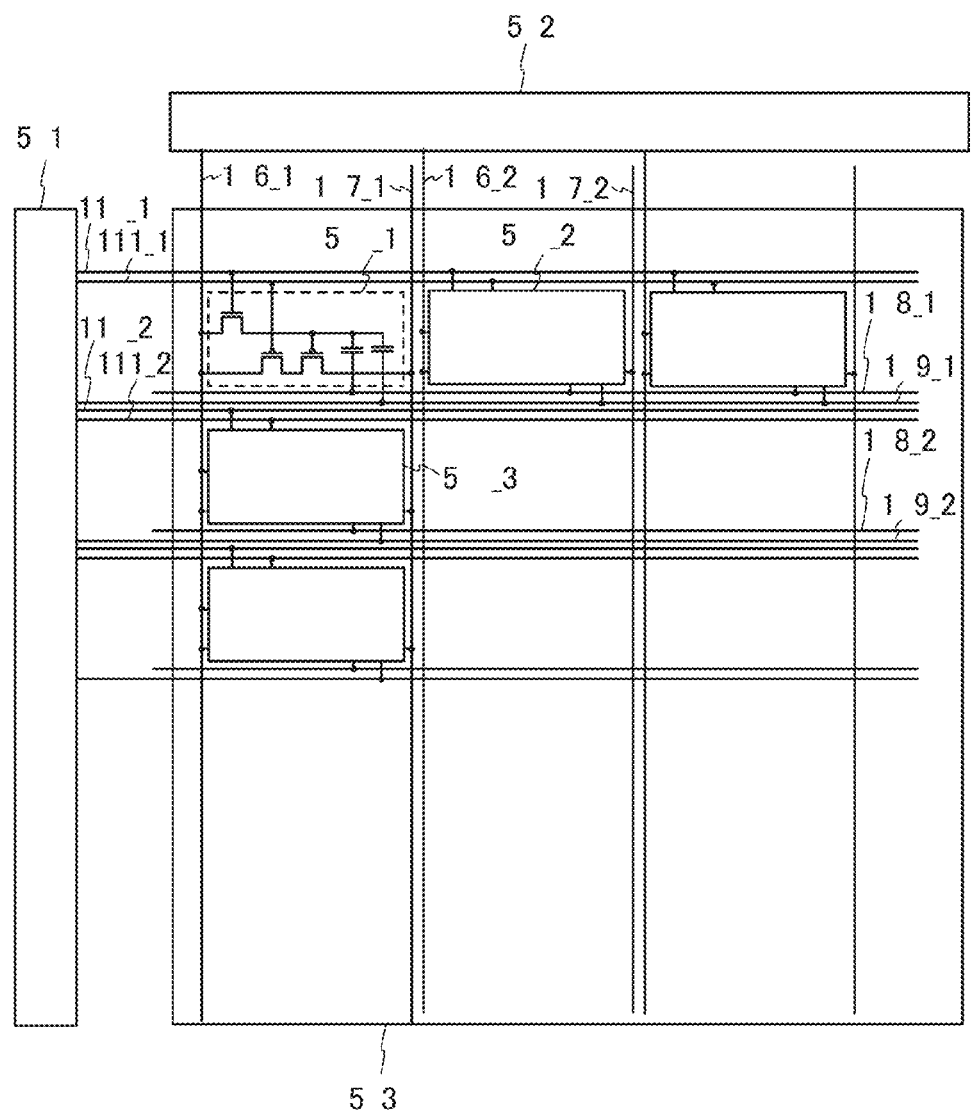
FIG. 5 is a block diagram of a memory device.

FIG. 5 illustrates a structure of a memory device in which the memory cell 100 described in this embodiment is used as a memory cell in a random access memory (RAM).

Figure 21:
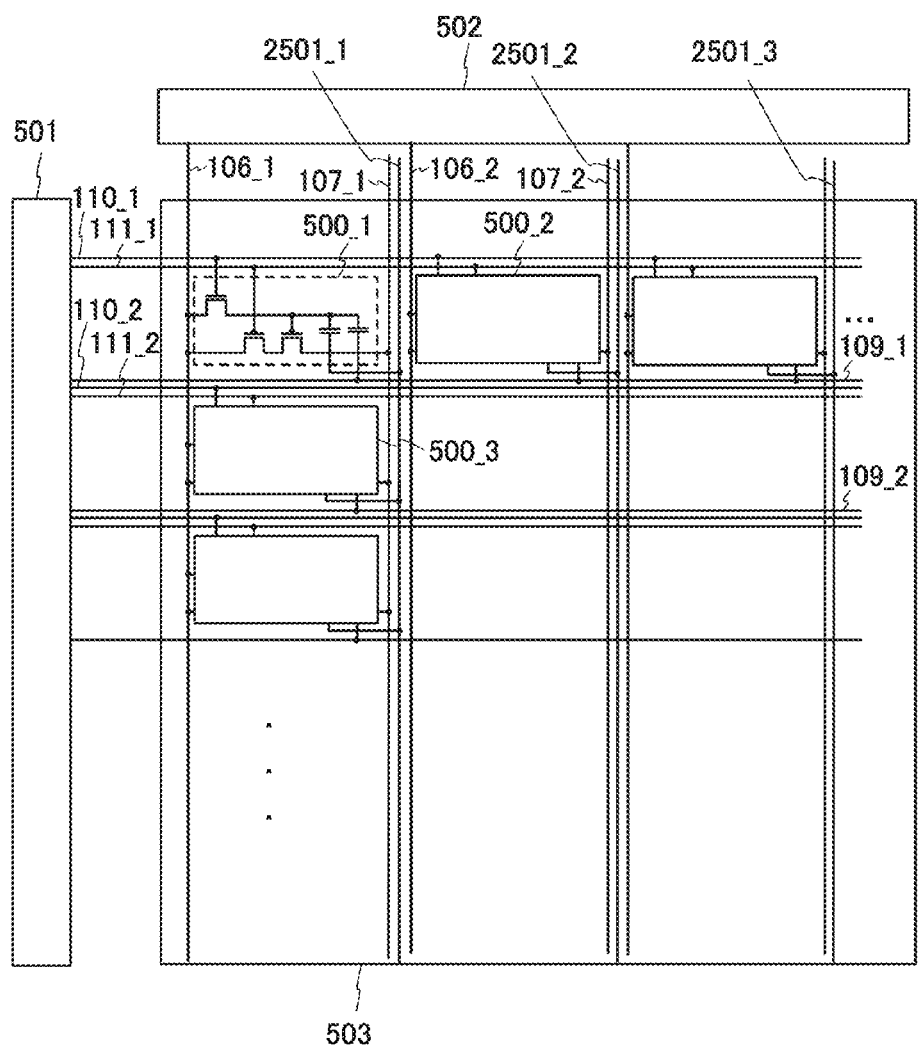
FIG. 21 is a block diagram of a memory device.

The random access memory illustrated in FIG. 5 includes a row driver 501, a column driver 502, and a memory cell array 503. A plurality of memory cells are arranged in a matrix in the memory cell array 503. A plurality of first wirings are electrically connected to the column driver 502. A plurality of fourth wirings, a plurality of fifth wirings, and a plurality of sixth wirings are electrically connected to the row driver 501. A memory cell 500_1 is disposed in the first row and the first column, a memory cell 500_2 is disposed in the first row and the second column, and a memory cell 500_3 is disposed in the second row and the first column. A first wiring 106_1 and a second wiring 107_1 are electrically connected to memory cells in the first column. A first wiring 106_2 and a second wiring 107_2 are electrically connected to memory cells in the second column. A third wiring 108_1, a fourth wiring 109_1, a fifth wiring 110_1, and a sixth wiring 111_1 are electrically connected to memory cells in the first row. A third wiring 108_2, a fourth wiring 109_2, a fifth wiring 110_2, and a sixth wiring 111_2 are electrically connected to memory cells in the second row. Although the memory cell 100 is used as each of the memory cell 500_1, the memory cell 500_2, and the memory cell 500_3 in FIG. 5, the memory cell 200 can also be used. Note that as illustrated in FIG. 21, the third wiring may be extended in the direction parallel to the first wiring and the second wiring. In FIG. 21, a third wiring 2501_1 is electrically connected to memory cells in the first column; a third wiring 2501_2 is electrically connected to memory cells in the second column; and a third wiring 2501_3 is electrically connected to memory cells in the third column.

The row driver 501 has a function of selectively turning on transistors of memory cells (which correspond to the first transistor 101 and the third transistor 105 in the memory cell 100 and the first transistor 201 and the third transistor 205 in the memory cell 200) in each row and a function of selectively changing potentials of nodes of the memory cells (which correspond to the node 112 in the memory cell 100 and the node 212 in the memory cell 200) in each row. Specifically, the row driver 501 supplies a signal to the fifth wiring 110_1, the fifth wiring 110_2, the sixth wiring 111_1, and the sixth wiring 111_2. With the row driver 501, the memory device can perform data writing to and data readout from the memory cells by selecting the memory cells row by row. The row driver 501 may include a decoder.

The column driver 502 has a function of precharging potentials of the first wiring 106_1 and the first wiring 106_2, a function of bringing the first wiring 106_1 and the first wiring 106_2 into an electrically floating state, a function of supplying potentials in accordance with data to the first wiring 106_1 and the first wiring 106_2, and a function of outputting data retained in a plurality of memory cells to the outside. With the column driver 502, the memory device can perform data writing to and data readout from the plurality of memory cells. The column driver 502 may include a decoder.

Figure 6:
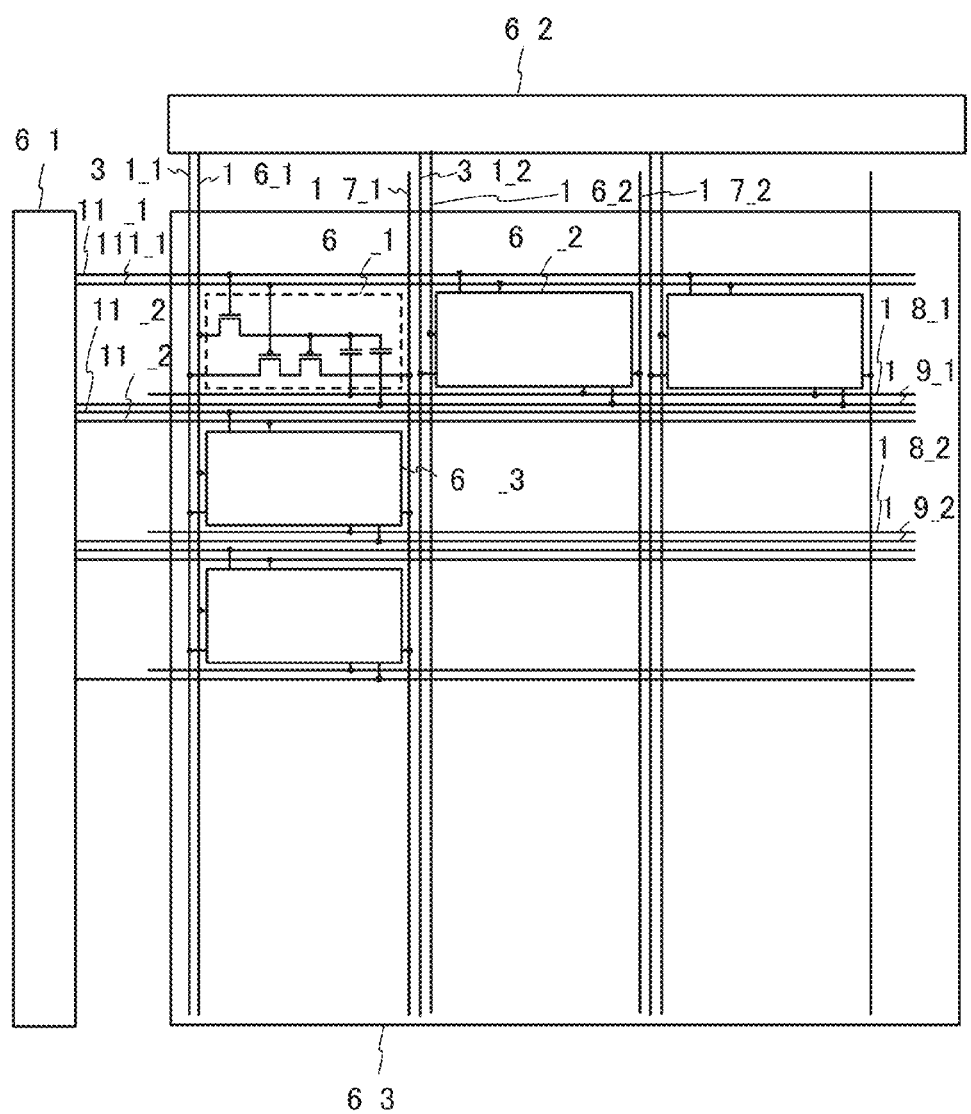
FIG. 6 is a block diagram of a memory device.

FIG. 6 illustrates a structure of a random access memory which is different from that illustrated in FIG. 5. The random access memory illustrated in FIG. 6 includes a row driver 601, a column driver 602, and a memory cell array 603. A plurality of memory cells are arranged in a matrix in the memory cell array 603. A plurality of first wirings and a plurality of seventh wirings are electrically connected to the column driver 602. A plurality of fourth wirings, a plurality of fifth wirings, and a plurality of sixth wirings are electrically connected to the row driver 601. A memory cell 600_1 is disposed in the first row and the first column, a memory cell 600_2 is disposed in the first row and the second column, and a memory cell 600_3 is disposed in the second row and the first column. The first wiring 106_1, the second wiring 107_1, and a seventh wiring 301_1 are electrically connected to memory cells in the first column. The first wiring 106_2, the second wiring 107_2, and a seventh wiring 301_2 are electrically connected to memory cells in the second column. The fourth wiring 109_1, the fifth wiring 110_1, and the sixth wiring 111_1 are electrically connected to memory cells in the first row. The fourth wiring 109_2, the fifth wiring 110_2, and the sixth wiring 111_2 are electrically connected to memory cells in the second row. Although the memory cell 300 is used as each of the memory cell 600_1, the memory cell 600_2, and the memory cell 600_3 in FIG. 6, the memory cell 400 can also be used.

The row driver 601 has a function of selectively turning on transistors of memory cells (which correspond to the first transistor 101 and the third transistor 105 in the memory cell 300 and the first transistor 201 and the third transistor 205 in the memory cell 400) in each row and a function of selectively changing potentials of nodes of the memory cells (which correspond to the node 112 in the memory cell 100 and the node 212 in the memory cell 200) in each row. Specifically, the row driver 601 supplies a signal to the fifth wiring 110_1, the fifth wiring 110_2, the sixth wiring 111_1, and the sixth wiring 111_2. With the row driver 601, the memory device can perform data writing to and data readout from the memory cells by selecting the memory cells row by row. The row driver 601 may include a decoder.

The column driver 602 has a function of precharging potentials of the seventh wiring 301_1 and the seventh wiring 301_2, a function of bringing the seventh wiring 301_1 and the seventh wiring 301_2 into an electrically floating state, a function of supplying potentials in accordance with data to the first wiring 106_1 and the first wiring 106_2, and a function of outputting data retained in a plurality of memory cells to the outside. With the column driver 602, the memory device can perform data writing to and data readout from the plurality of memory cells. The column driver 602 may include a decoder.

Next, a structure of the memory cell of this embodiment is described.

Cross-sectional structures of the memory cell 100 and the memory cell 200 are described with reference to FIG. 7A. A semiconductor substrate 701 includes an N-type well 702, an impurity region 703, an impurity region 704, an impurity region 705, and an element isolation insulating region 706. An insulating layer 707 is formed over the semiconductor substrate. A conductive layer 709 and an insulating layer 708 are formed over the insulating layer 707. A semiconductor layer 710 is formed over the insulating layer 708. A conductive layer 711 and a conductive layer 712 are formed over the semiconductor layer 710 and the insulating layer 708. An insulating layer 713 is formed over the semiconductor layer 710, the conductive layer 711, and the conductive layer 712. A conductive layer 714, a conductive layer 715, and a conductive layer 716 are formed over the insulating layer 713. An insulating layer 717 is formed over the insulating layer 713, the conductive layer 714, the conductive layer 715, and the conductive layer 716. A conductive layer 718 is formed over the insulating layer 717.

The conductive layer 711 and the conductive layer 712 are formed by patterning the same conductive layer, and thus include the same material. The conductive layer 714, the conductive layer 715, and the conductive layer 716 are formed by patterning the same conductive layer, and thus include the same material.

Note that in this specification, one film refers to a film formed under substantially the same conditions throughout the film formation. One layer may be a single film or a stacked-layer film. In the case where one layer is a stacked-layer film, a plurality of films are successively formed and patterned in the same step to have the same shape or substantially the same shapes.

The conductive layer 714 has at least a function of a gate of a transistor 719. Accordingly, the conductive layer 714 includes the gate of the transistor 719. The semiconductor layer 710 includes a channel formation region of the transistor 719. The conductive layer 714 and the semiconductor layer 710 overlap each other with the insulating layer 713 positioned therebetween. The insulating layer 713 has a function of a gate insulating layer of the transistor 719. The transistor 719 corresponds to the first transistor 101 in FIG. 1A. A region of the semiconductor layer 710 in contact with the conductive layer 711, a region of the conductive layer 711 in contact with the semiconductor layer 710, or both the regions include the first terminal of the first transistor 101. A region of the semiconductor layer 710 in contact with the conductive layer 712, a region of the conductive layer 712 in contact with the semiconductor layer 710, or both the regions include the second terminal of the first transistor 101.

The conductive layer 715 has at least a function of an electrode of the capacitor 721. The conductive layer 712 has at least a function of an electrode of the capacitor 721. The capacitor 721 corresponds to the first capacitor 103 in FIG. 1A. The conductive layer 712 has a function of the first electrode of the first capacitor 103. The conductive layer 715 has a function of the second electrode of the first capacitor 103.

The conductive layer 716 has at least a function of an electrode of the capacitor 722. The conductive layer 712 has at least a function of an electrode of the capacitor 722. The capacitor 722 corresponds to the second capacitor 104 in FIG. 1A. The conductive layer 712 has a function of the first electrode of the second capacitor 104. The conductive layer 716 has a function of the second electrode of the second capacitor 104.

An electrostatic capacitance of a capacitor is determined by an area of the capacitor and a thickness and a dielectric constant of a dielectric between electrodes of the capacitor. The capacitor 721 and the capacitor 722 use the same insulating film as a dielectric as illustrated in FIG. 7A; thus, the capacitance ratio between the capacitor 721 and the capacitor 722 can be readily controlled. Therefore, it is easier to control the increase ΔV in potential of the node 112 in data readout.

The conductive layer 709 has at least a function of a gate of the transistor 720. That is, the conductive layer 709 includes the gate of the transistor 720. The N-type well 702 includes at least a channel formation region of the transistor 720. The conductive layer 709 overlaps with the N-type well 702 with the insulating layer 707 positioned therebetween. The insulating layer 707 has a function of a gate insulating layer of the transistor 720. The transistor 720 corresponds to the second transistor 102 in FIG. 1A. The impurity region 703 includes the second terminal of the second transistor 102. The impurity region 704 includes the first terminal of the second transistor 102.

A region of the impurity region 705 in contact with the conductive layer 711, a region of the conductive layer 711 in contact with the impurity region 705, or both the regions include the second terminal of the third transistor 105 illustrated in FIG. 1A.

The first wiring 106 in FIG. 1A includes the conductive layer 718, the conductive layer 711, or both the conductive layers. The fourth wiring 109 in FIG. 1A includes the conductive layer 716. That is, the conductive layer 716 has a function of the fourth wiring 109 and a function of the second electrode of the second capacitor 104. The third wiring 108 in FIG. 1A includes the conductive layer 715.

Figure 7A:
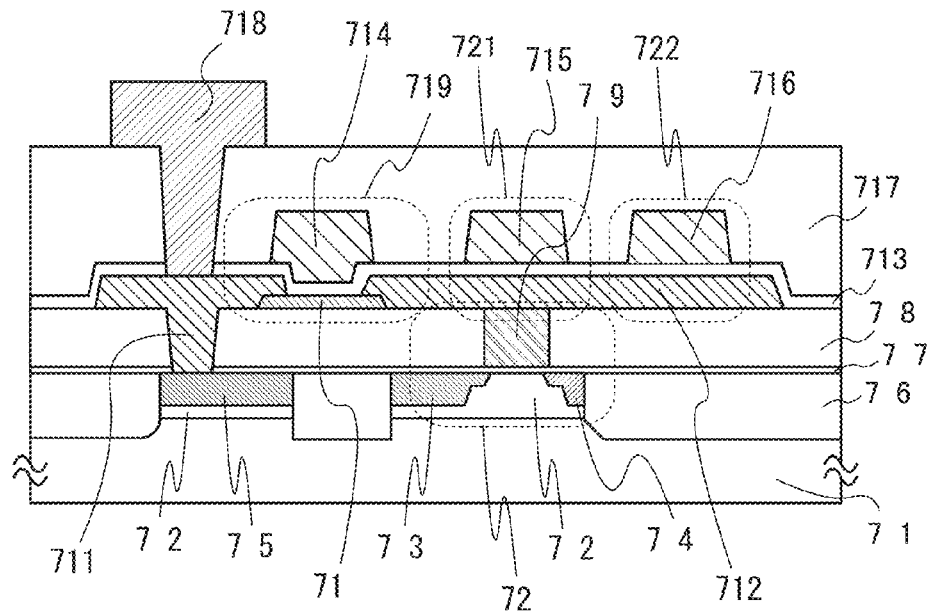
FIGS. 7A and 7B are cross-sectional views of semiconductor devices.
Figure 7B:
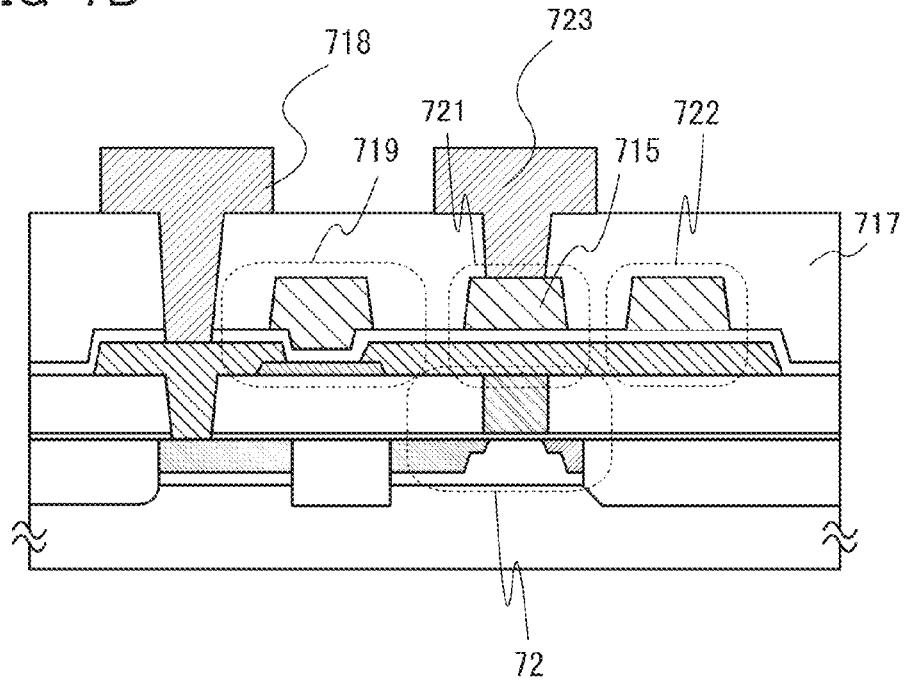

Note that a conductive layer 723 may be formed over the insulating layer 717 as illustrated in FIG. 7B. In FIG. 7B, the third wiring 108 includes the conductive layer 715, the conductive layer 723, or both the conductive layers. Note that description of FIG. 7A can be referred to for components in FIG. 7B which are the same as those in FIG. 7A.

The conductive layer 718 and the conductive layer 723 are formed by patterning the same conductive layer, and thus include the same material.

Figure 8A:
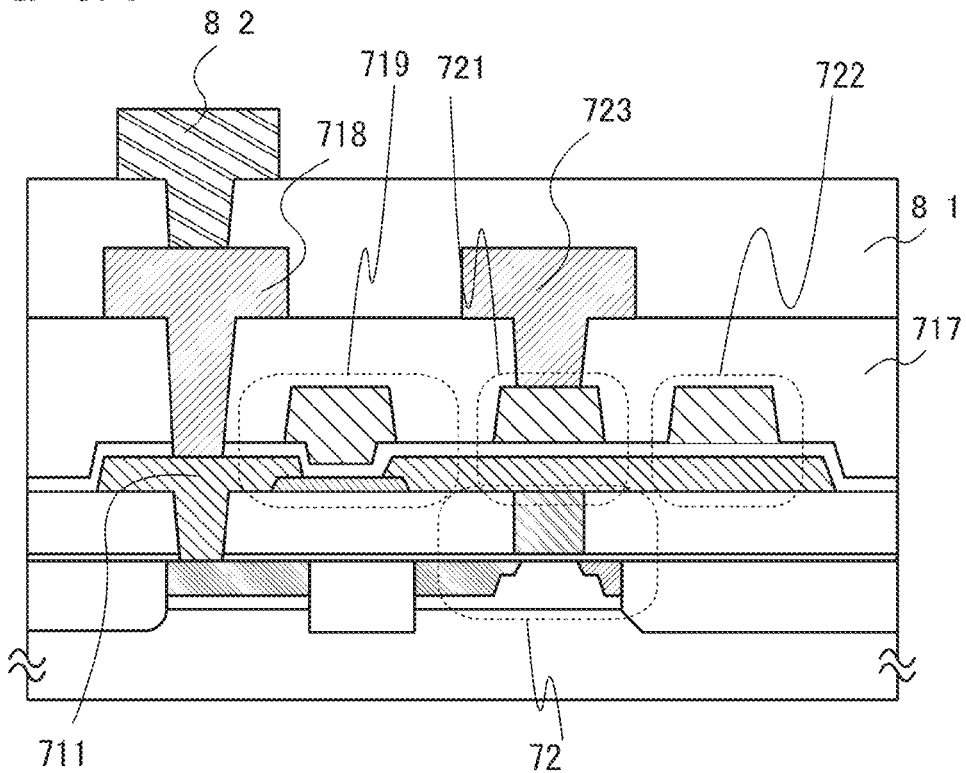
FIGS. 8A and 8B are cross-sectional views of semiconductor devices.

As illustrated in FIG. 8A, an insulating layer 801 may be formed over the conductive layer 718 and the conductive layer 723 and a conductive layer 802 may be formed over the insulating layer 801. In FIG. 8A, the first wiring 106 includes at least one of the conductive layer 711, the conductive layer 718, and the conductive layer 802. Note that description of FIGS. 7A and 7B can be referred to for components in FIG. 8A which are the same as those in FIGS. 7A and 7B.

Figure 8B:
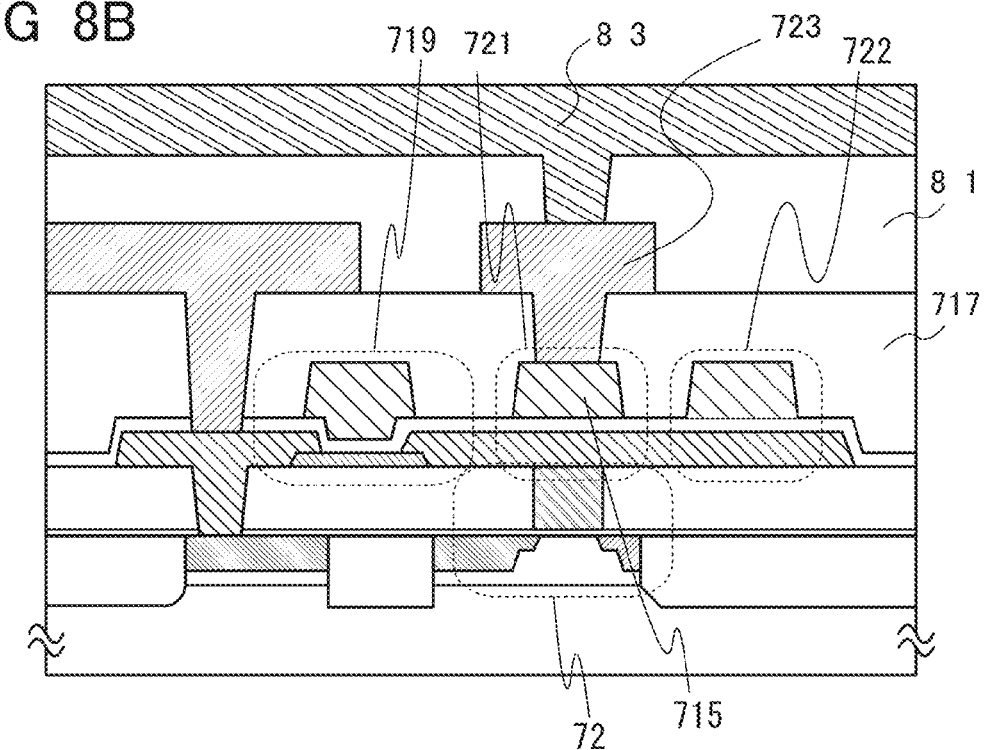

As illustrated in FIG. 8B, the insulating layer 801 may be formed over the conductive layer 718 and the conductive layer 723 and a conductive layer 803 may be formed over the insulating layer 801. In FIG. 8B, the third wiring 108 includes at least one of the conductive layer 715, the conductive layer 723, and the conductive layer 803. Note that description of FIGS. 7A and 7B can be referred to for components in FIG. 8B which are the same as those in FIGS. 7A and 7B.

Figure 18:
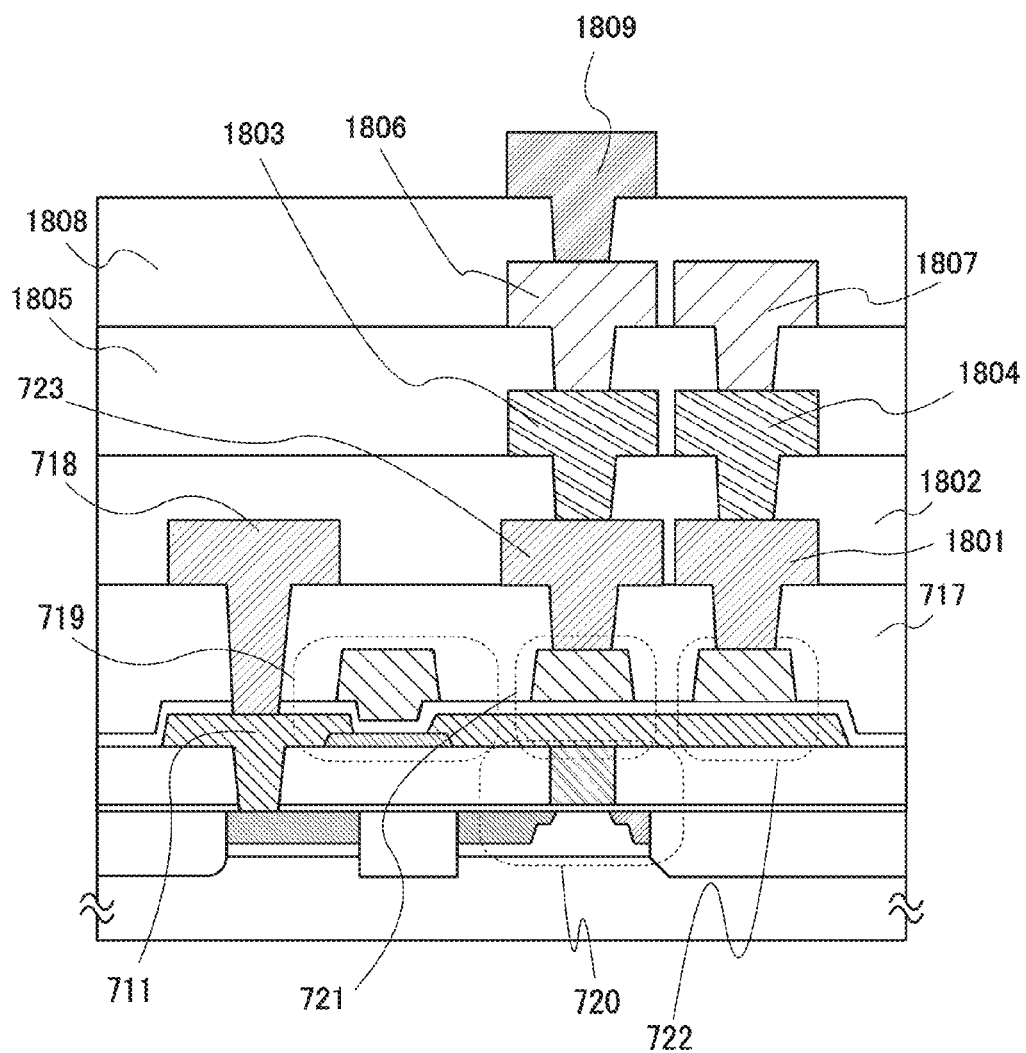
FIG. 18 is a cross-sectional view of a semiconductor device.

A structure illustrated in FIG. 18 may be employed in which a conductive layer 1801 is formed over the insulating layer 717; an insulating layer 1802 is formed over the conductive layer 718, the conductive layer 723, and the conductive layer 1801; a conductive layer 1803 and a conductive layer 1804 are formed over the insulating layer 1802; an insulating layer 1805 is formed over the conductive layer 1803 and the conductive layer 1804; a conductive layer 1806 and a conductive layer 1807 are formed over the insulating layer 1805; an insulating layer 1808 is formed over the conductive layer 1806 and the conductive layer 1807; and a conductive layer 1809 is formed over the insulating layer 1808. In FIG. 18, the third wiring 108 includes at least one of the conductive layer 715, the conductive layer 723, the conductive layer 1803, the conductive layer 1806, and the conductive layer 1809. Note that description of FIGS. 7A and 7B can be referred to for components in FIG. 18 which are the same as those in FIGS. 7A and 7B.

The transistor 719, the transistor 720, the capacitor 721, and the capacitor 722 in FIGS. 7A and 7B, FIGS. 8A and 8B, and FIG. 18 correspond to the first transistor 201, the second transistor 202, the first capacitor 203, and the second capacitor 204 in FIG. 2, respectively. In that case, the impurity region 703 and the impurity region 705 seem to be separated in the cross sections of FIGS. 7A and 7B, FIGS. 8A and 8B, and FIG. 18, but are continuous in practice. Therefore, a region of the impurity region 705 in contact with the conductive layer 711, a region of the conductive layer 711 in contact with the impurity region 705, or both the regions include the second terminal of the second transistor 202 in FIG. 2.

Figure 9A:
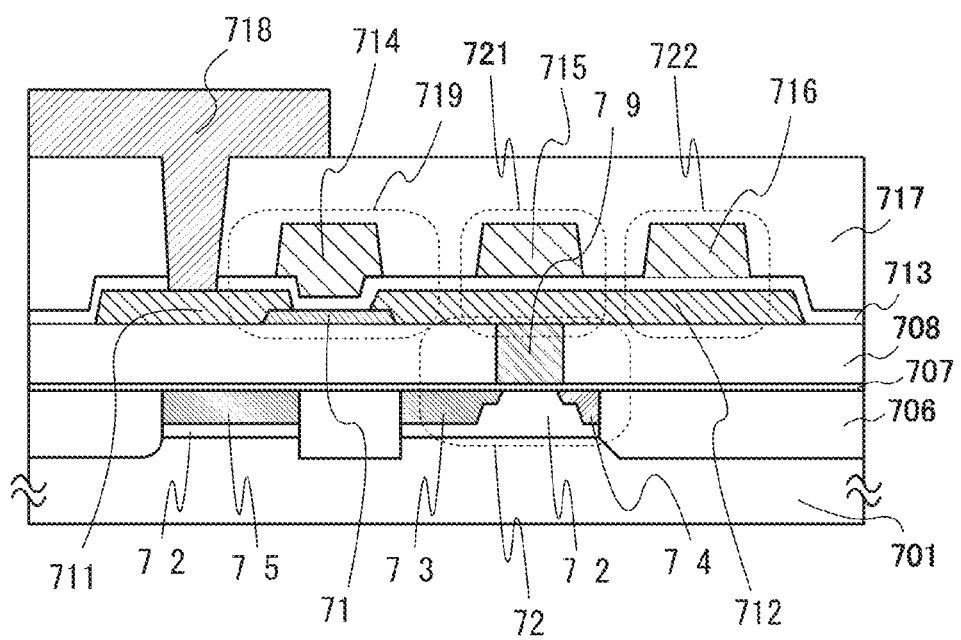
FIGS. 9A and 9B are cross-sectional views of a semiconductor device.
Figure 9B:
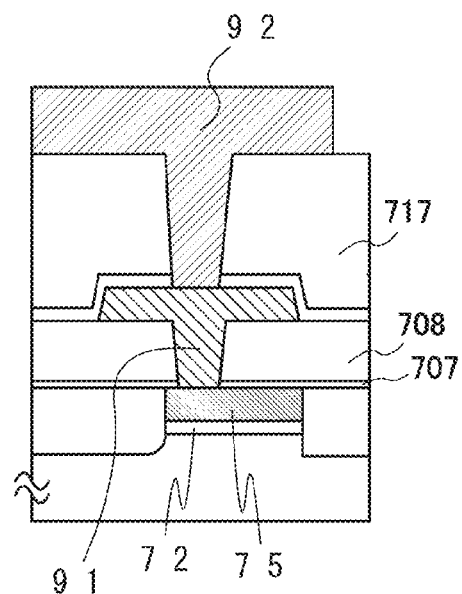

Cross-sectional structures of the memory cell 300 and the memory cell 400 are described with reference to FIGS. 9A and 9B. Description of components in FIG. 9A which are the same as those in FIG. 7A is omitted. In FIG. 9A, no contact hole for connecting the impurity region 705 and the conductive layer 711 is formed in the insulating layer 708 and the insulating layer 707. FIG. 9B is a cross-sectional view of a portion different from that of FIG. 9A. A conductive layer 901 is formed over the insulating layer 708, and a conductive layer 902 is formed over the insulating layer 717. A region of the impurity region 705 in contact with the conductive layer 901, a region of the conductive layer 901 in contact with the impurity region 705, or both the regions include the second terminal of the third transistor 105 illustrated in FIG. 3A. The seventh wiring 301 in FIG. 3A includes at least one of the conductive layer 901 and the conductive layer 902.

The conductive layer 718 and the conductive layer 902 are formed by patterning the same conductive layer, and thus include the same material.

Figure 10:
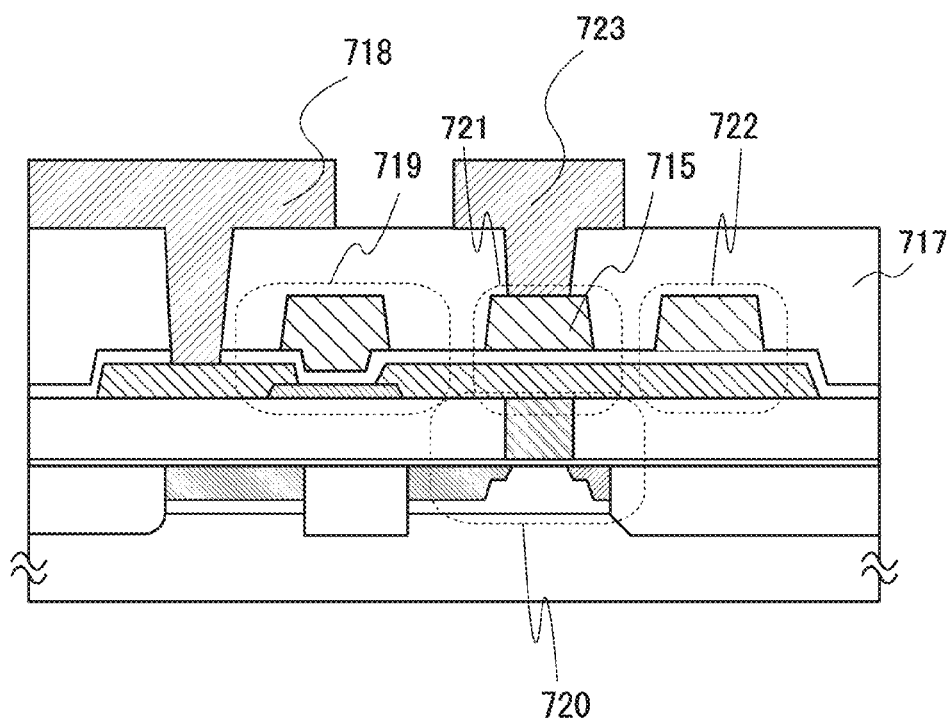
FIG. 10 is a cross-sectional view of a semiconductor device.

As illustrated in FIG. 10, the conductive layer 723 may be formed over the insulating layer 717. In FIG. 10, the third wiring 108 includes at least one of the conductive layer 715 and the conductive layer 723. Note that description of FIG. 9A can be referred to for components in FIG. 10 which are the same as those in FIG. 9A.

Figure 11A:
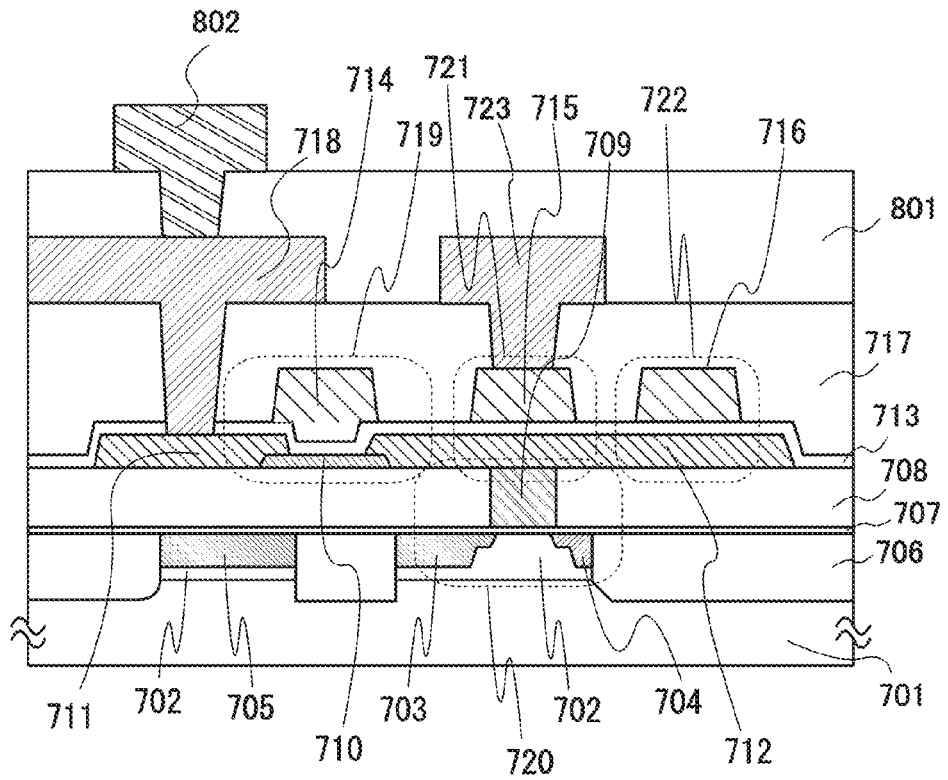
FIGS. 11A and 11B are cross-sectional views of a semiconductor device.
Figure 11B:
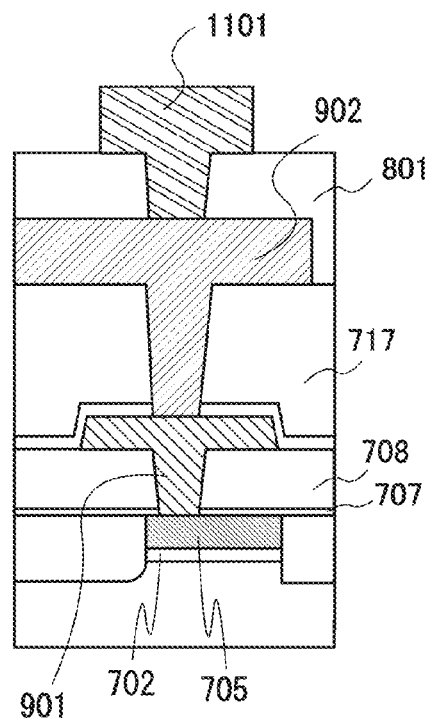

As illustrated in FIG. 11A, the insulating layer 801 may be formed over the conductive layer 718 and the conductive layer 723 and the conductive layer 802 may be formed over the insulating layer 801. In FIG. 11A, the first wiring 106 includes at least one of the conductive layer 711, the conductive layer 718, and the conductive layer 802. Note that description of FIG. 9A and FIG. 10 can be referred to for components in FIG. 11A which are the same as those in FIG. 9A and FIG. 10. FIG. 11B is a cross-sectional view of a portion different from that of FIG. 11A. The conductive layer 901 is formed over the insulating layer 708, the conductive layer 902 is formed over the insulating layer 717, the insulating layer 801 is formed over the conductive layer 902, and a conductive layer 1101 is formed over the insulating layer 801. A region of the impurity region 705 in contact with the conductive layer 901, a region of the conductive layer 901 in contact with the impurity region 705, or both the regions include the second terminal of the third transistor 105 illustrated in FIG. 3A. The seventh wiring 301 in FIG. 3A includes at least one of the conductive layer 901, the conductive layer 902, and the conductive layer 1101.

The conductive layer 802 and the conductive layer 1101 are formed by patterning the same conductive layer, and thus include the same material.

Figure 12:
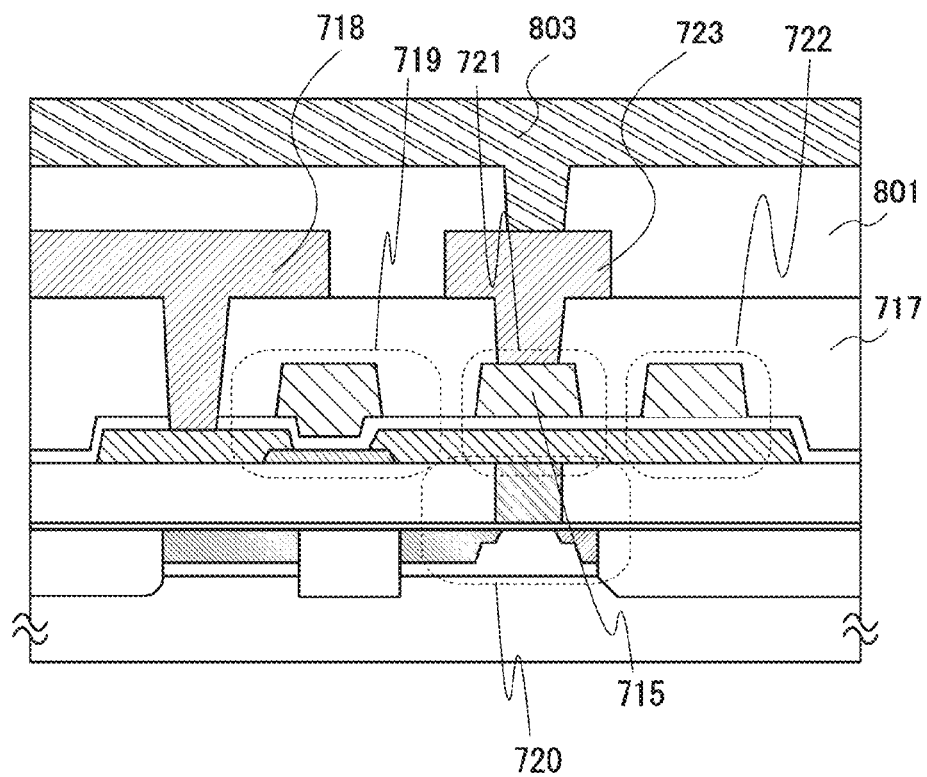
FIG. 12 is a cross-sectional view of a semiconductor device.

A structure illustrated in FIG. 12 may be employed in which the insulating layer 801 is formed over the conductive layer 718 and the conductive layer 723, and a conductive layer 803 is formed over the insulating layer 801. In FIG. 12, the third wiring 108 includes at least one of the conductive layer 715, the conductive layer 723, and the conductive layer 803. Note that description of FIG. 9A can be referred to for components in FIG. 12 which are the same as those in FIG. 9A.

Figure 19:
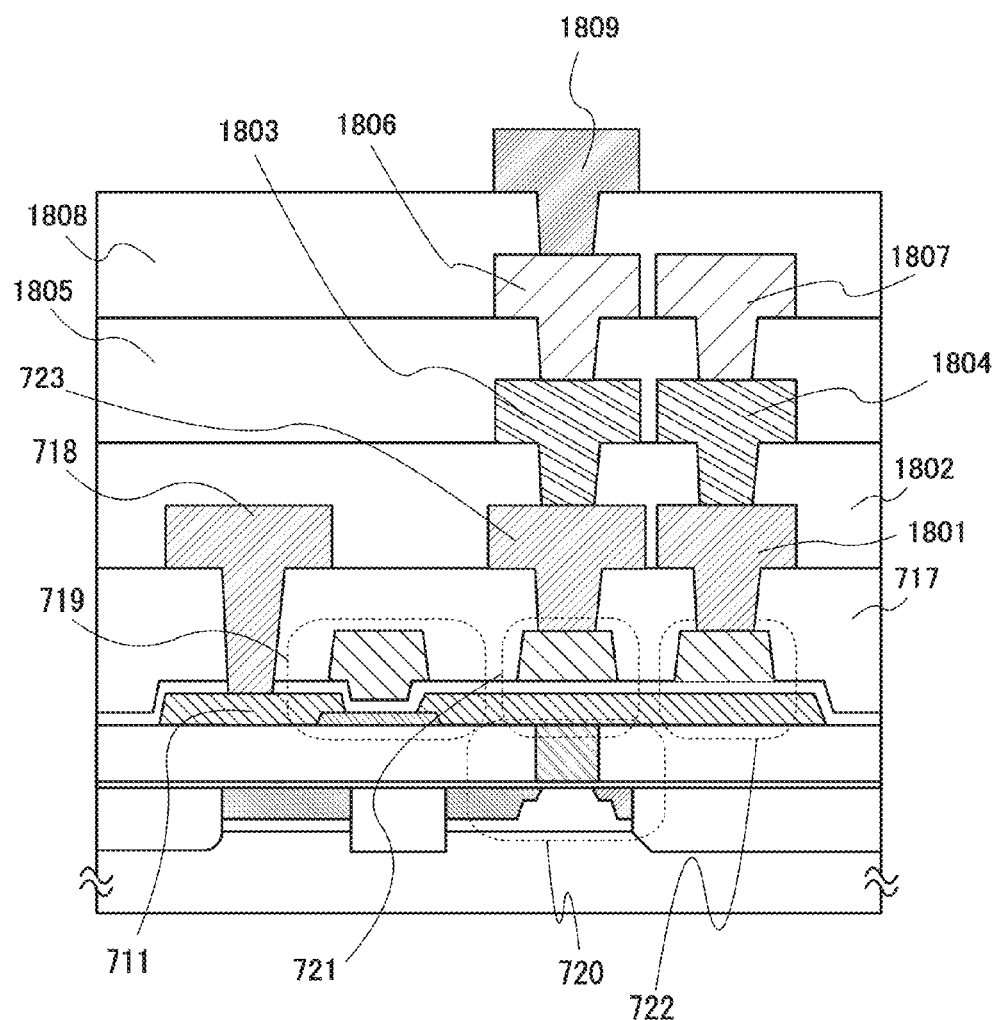
FIG. 19 is a cross-sectional view of a semiconductor device.

A structure illustrated in FIG. 19 may be employed in which the conductive layer 1801 is formed over the insulating layer 717; the insulating layer 1802 is formed over the conductive layer 718, the conductive layer 723, and the conductive layer 1801; the conductive layer 1803 and the conductive layer 1804 are formed over the insulating layer 1802; the insulating layer 1805 is formed over the conductive layer 1803 and the conductive layer 1804; the conductive layer 1806 and the conductive layer 1807 are formed over the insulating layer 1805; the insulating layer 1808 is formed over the conductive layer 1806 and the conductive layer 1807; and the conductive layer 1809 is formed over the insulating layer 1808. In FIG. 19, the third wiring 108 includes at least one of the conductive layer 715, the conductive layer 723, the conductive layer 1803, the conductive layer 1806, and the conductive layer 1809. Note that description of FIG. 9A and FIG. 10 can be referred to for components in FIG. 19 which are the same as those in FIG. 9A and FIG. 10.

The transistor 719, the transistor 720, the capacitor 721, and the capacitor 722 in FIG. 9A, FIG. 10, FIG. 11A, FIG. 12, and FIG. 19 correspond to the first transistor 201, the second transistor 202, the first capacitor 203, and the second capacitor 204 in FIG. 3B, respectively. In that case, the impurity region 703 and the impurity region 705 seem to be separated in the cross sections of FIG. 9A, FIG. 10, FIG. 11A, FIG. 12, and FIG. 19, but are continuous in practice. Therefore, a region of the impurity region 705 in contact with the conductive layer 711, a region of the conductive layer 711 in contact with the impurity region 705, or both the regions include the second terminal of the second transistor 202 in FIG. 3B.

Next, layouts of the third wiring 108 are described using memory devices in FIGS. 13A and 13B and FIGS. 14A and 14B.

Figure 13A:
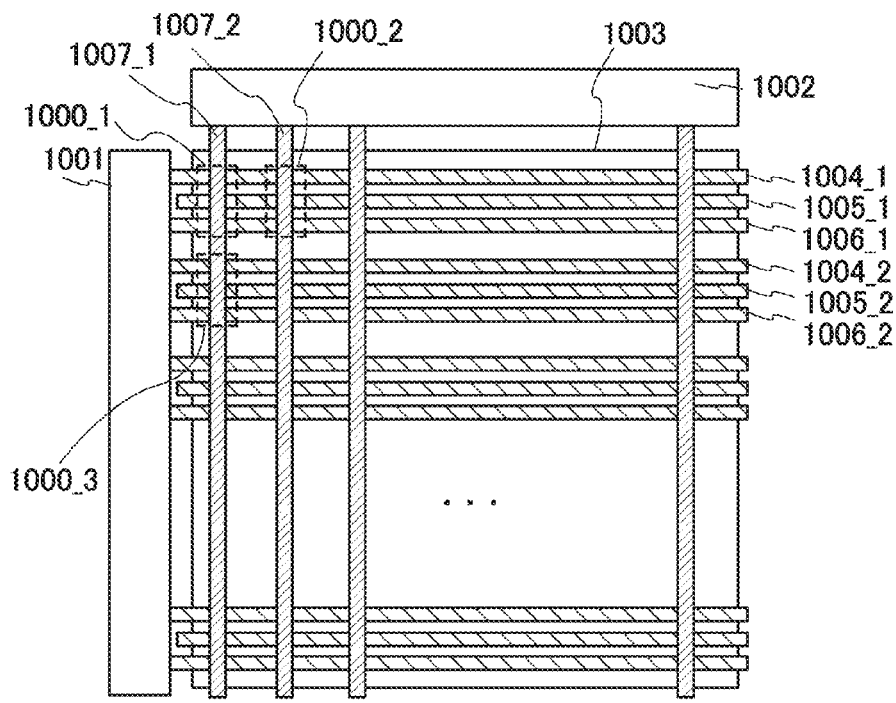
FIGS. 13A and 13B are block diagrams of memory devices.

A memory device illustrated in FIG. 13A includes a row driver 1001, a column driver 1002, and a memory cell array 1003. The memory cell array 1003 is formed in a rectangular region where a plurality of memory cells are arranged in a matrix. A plurality of first conductive layers (which include a first conductive layer 1007_1 and a first conductive layer 1007_2) extend from a first side of the rectangular region to a second side thereof. A plurality of second conductive layers (which include a second conductive layer 1004_1 and a second conductive layer 1004_2), a plurality of third conductive layers (which include a third conductive layer 1005_1 and a third conductive layer 1005_2), and a plurality of fourth conductive layers (a fourth conductive layer 1006_1 and a fourth conductive layer 1006_2) extend from a third side of the rectangular region to a fourth side thereof. The plurality of first conductive layers are electrically connected to the column driver 1002. The plurality of second conductive layers and the plurality of fourth conductive layers are electrically connected to the row driver 1001. A memory cell 1000_1 is disposed in a first row and a first column, a memory cell 1000_2 is disposed in the first row and a second column, and a memory cell 1000_3 is disposed in a second row and the first column. The first conductive layer 1007_1 is electrically connected to memory cells in the first column. The first conductive layer 1007_2 is electrically connected to memory cells in the second column. The third conductive layer 1005_1, the fourth conductive layer 1006_1, and the second conductive layer 1004_1 are electrically connected to memory cells in the first row. The third conductive layer 1005_2, the fourth conductive layer 1006_2, and the second conductive layer 1004_2 are electrically connected to memory cells in the second row.

The memory cell 100, the memory cell 200, the memory cell 300, or the memory cell 400 can be used as the memory cell 1000_1, the memory cell 1000_2, and the memory cell 1000_3. Each of the first conductive layers 1007_1 and 1007_2 corresponds to the conductive layer 718 in FIG. 7A and FIG. 9A. Each of the second conductive layers 1004_1 and 1004_2 corresponds to the conductive layer 714 in FIG. 7A and FIG. 9A. Each of the third conductive layers 1005_1 and 1005_2 corresponds to the conductive layer 715 in FIG. 7A and FIG. 9A. Each of the fourth conductive layers 1006_1 and 1006_2 corresponds to the conductive layer 716 in FIG. 7A and FIG. 9A.

Figure 13B:
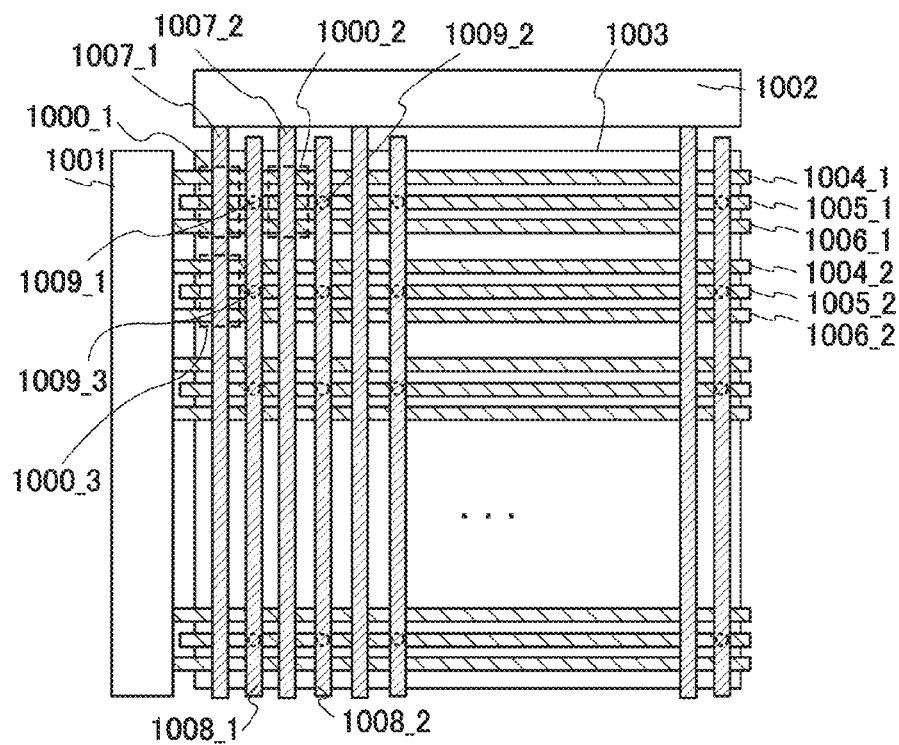

A memory device illustrated in FIG. 13B further includes a plurality of fifth conductive layers (which include a fifth conductive layer 1008_1 and a fifth conductive layer 1008_2) in addition to the components of the memory device illustrated in FIG. 13A. Furthermore, a plurality of contact holes (which include a contact hole 1009_1, a contact hole 1009_2, and a contact hole 1009_3) are arranged in a matrix in the rectangular region. The description of FIG. 13A can be referred to for components in FIG. 13B which are the same as those in FIG. 13A. The plurality of fifth conductive layers (which include the fifth conductive layer 1008_1 and the fifth conductive layer 1008_2) extend from the first side of the rectangular region to the second side thereof. The fifth conductive layer 1008_1 is connected to the third conductive layer 1005_1 through the contact hole 1009_1. In other words, the fifth conductive layer 1008_1 is in contact with the third conductive layer 1005_1 in the contact hole 1009_1. The fifth conductive layer 1008_2 is connected to the third conductive layer 1005_1 through the contact hole 1009_2. In other words, the fifth conductive layer 1008_2 is in contact with the third conductive layer 1005_1 in the contact hole 1009_2. The fifth conductive layer 1008_1 is connected to the third conductive layer 1005_2 through the contact hole 1009_3. In other words, the fifth conductive layer 1008_1 is in contact with the third conductive layer 1005_2 in the contact hole 1009_3. Each of the fifth conductive layers 1008_1 and 1008_2 corresponds to the conductive layer 723 in FIG. 7B and FIG. 10.

Figure 14A:
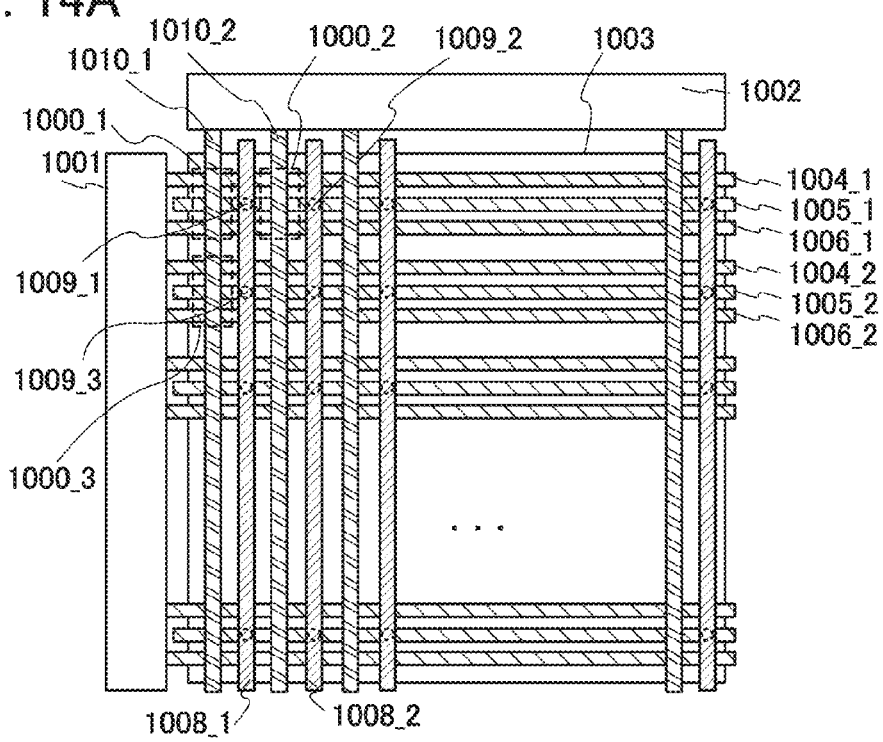
FIGS. 14A and 14B are block diagrams of memory devices.

A memory device illustrated in FIG. 14A further includes a plurality of sixth conductive layers (which include a sixth conductive layer 1010_1 and a sixth conductive layer 1010_2) over the plurality of first conductive layers (which include the first conductive layer 1007_1 and the first conductive layer 1007_2) in addition to the components of the memory device illustrated in FIG. 13B. Since the plurality of first conductive layers (which include the first conductive layer 1007_1 and the first conductive layer 1007_2) and the plurality of sixth conductive layers (which include the sixth conductive layer 1010_1 and the sixth conductive layer 1010_2) overlap with one another, the plurality of first conductive layers (which include the first conductive layer 1007_1 and the first conductive layer 1007_2) are not illustrated in FIG. 14A. Each of the sixth conductive layers 1010_1 and 1010_2 corresponds to the conductive layer 802 in FIG. 8A and FIG. 11A.

In the case where the first wiring 106 includes the sixth conductive layer 1010_1 or the sixth conductive layer 1010_2, the sixth conductive layer 1010_1 or the sixth conductive layer 1010_2 and the fourth conductive layer 1006_1 or the fourth conductive layer 1006_2 overlap with each other with the insulating layer 717 and the insulating layer 801 positioned therebetween (see FIG. 8A and FIG. 11A). Therefore, a parasitic capacitance generated in a portion where the first wiring 106 and the fourth wiring 109 overlap with each other can be reduced.

Figure 14B:
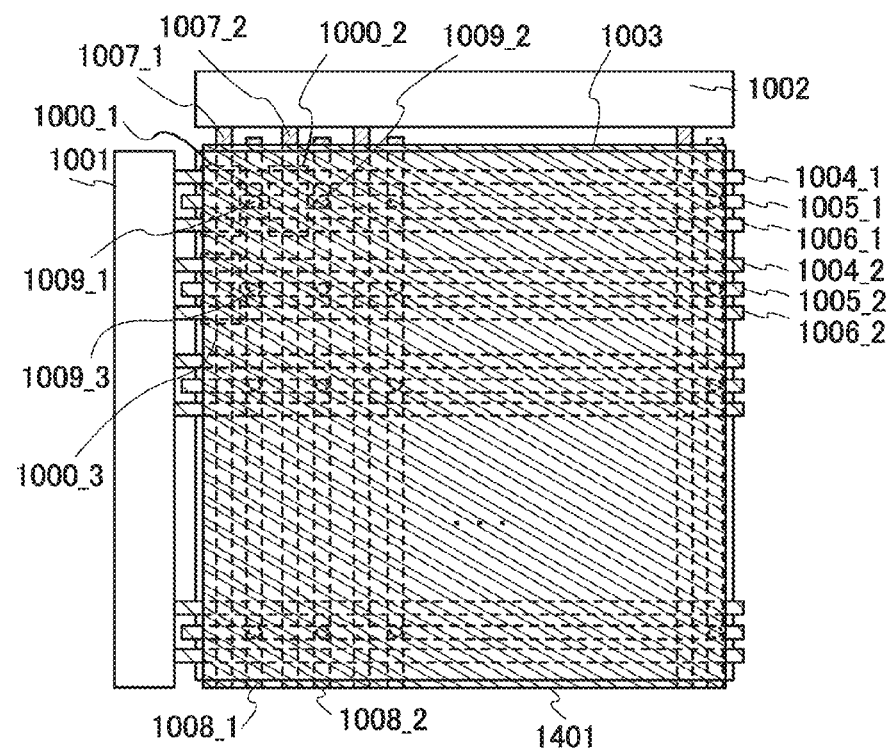

A memory device illustrated in FIG. 14B further includes a seventh conductive layer 1401 over the plurality of first conductive layers (which include the first conductive layer 1007_1 and the first conductive layer 1007_2) and the plurality of fifth conductive layers (which include the fifth conductive layer 1008_1 and the fifth conductive layer 1008_2) in addition to the components of the memory device illustrated in FIG. 13B. The seventh conductive layer 1401 corresponds to the conductive layer 803 in FIG. 8B and FIG. 12. The seventh conductive layer 1401 overlaps with the plurality of memory cells arranged in a matrix.

Figure 20:
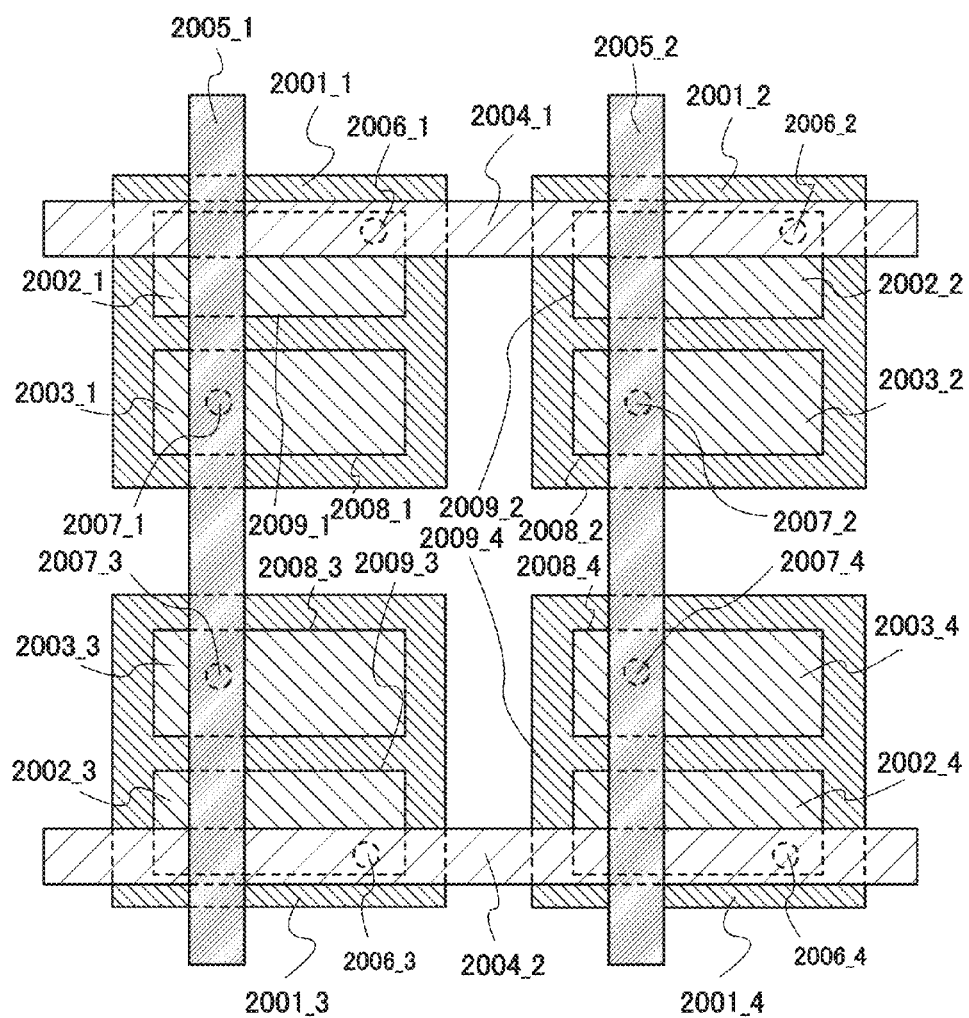
FIG. 20 is a layout view of a memory cell.

Next, a layout of a memory device with the memory cell structure illustrated in FIG. 18 or FIG. 19 is described with reference to FIG. 20. In particular, a layout of first capacitors, second capacitors, capacitor wirings, and common wirings in memory cells in two rows and two columns is described in detail. A conductive layer 2002_1 and a conductive layer 2003_1 are formed over a conductive layer 2001_1. A conductive layer 2002_2 and a conductive layer 2003_2 are formed over a conductive layer 2001_2. A conductive layer 2002_3 and a conductive layer 2003_3 are formed over a conductive layer 2001_3. A conductive layer 2002_4 and a conductive layer 2003_4 are formed over a conductive layer 2001_4.

A conductive layer 2004_1 is formed over the conductive layer 2002_1 and the conductive layer 2002_2 with an insulating layer positioned therebetween. A contact hole 2006_1 and a contact hole 2006_2 are formed in the insulating layer. The conductive layer 2002_1 is electrically connected to the conductive layer 2001_1 through the contact hole 2006_1. A conductive layer 2004_2 is formed over the conductive layer 2002_3 and the conductive layer 2002_4 with an insulating layer positioned between the conductive layer 2004_2 and the conductive layers 2002_3 and 2002_4. A contact hole 2006_3 and a contact hole 2006_4 are formed in the insulating layer. The conductive layer 2002_2 is electrically connected to the conductive layer 2001_2 through the contact hole 2006_2.

A conductive layer 2005_1 and a conductive layer 2005_2 are formed over the conductive layer 2004_1 and the conductive layer 2004_2 with an insulating layer positioned between the conductive layers 2005_1 and 2005_2 and the conductive layers 2004_1 and 2004_2. A contact hole 2007_1, a contact hole 2007_2, a contact hole 2007_3, and a contact hole 2007_4 are formed in the insulating layer. The conductive layer 2005_1 is electrically connected to the conductive layer 2003_1 through the contact hole 2007_1, and to the conductive layer 2003_3 through the contact hole 2007_3. The conductive layer 2005_2 is electrically connected to the conductive layer 2003_2 through the contact hole 2007_2, and to the conductive layer 2003_4 through the contact hole 2007_4.

The conductive layer 2003_1 and the conductive layer 2001_1 overlap with each other with an insulating layer positioned therebetween to form a capacitor 2008_1. The conductive layer 2003_2 and the conductive layer 2001_2 overlap with each other with an insulating layer positioned therebetween to form a capacitor 2008_2. The conductive layer 2003_3 and the conductive layer 2001_3 overlap with each other with an insulating layer positioned therebetween to form a capacitor 2008_3. The conductive layer 2003_4 and the conductive layer 2001_4 overlap with each other with an insulating layer positioned therebetween to form a capacitor 2008_4.

The conductive layer 2002_1 and the conductive layer 2001_1 overlap with each other with an insulating layer positioned therebetween to form a capacitor 2009_1. The conductive layer 2002_2 and the conductive layer 2001_2 overlap with each other with an insulating layer positioned therebetween to form a capacitor 2009_2. The conductive layer 2002_3 and the conductive layer 2001_3 overlap with each other with an insulating layer positioned therebetween to form a capacitor 2009_3. The conductive layer 2002_4 and the conductive layer 2001_4 overlap with each other with an insulating layer positioned therebetween to form a capacitor 2009_4.

Each of the capacitor 2008_1, the capacitor 2008_2, the capacitor 2008_3, and the capacitor 2008_4 corresponds to the first capacitor 103 in FIG. 1A, FIG. 2, and FIGS. 3A and 3B and the capacitor 721 in FIG. 18 and FIG. 19. Each of the capacitor 2009_1, the capacitor 2009_2, the capacitor 2009_3, and the capacitor 2009_4 corresponds to the second capacitor 104 in FIG. 1A, FIG. 2, and FIGS. 3A and 3B and the capacitor 722 in FIG. 18 and FIG. 19. Each of the conductive layer 2004_1 and the conductive layer 2004_2 corresponds to the conductive layer 1807 in FIG. 18 and FIG. 19. Each of the conductive layer 2005_1 and the conductive layer 2005_2 corresponds to the conductive layer 1809 in FIG. 18 and FIG. 19.

Figure 15:
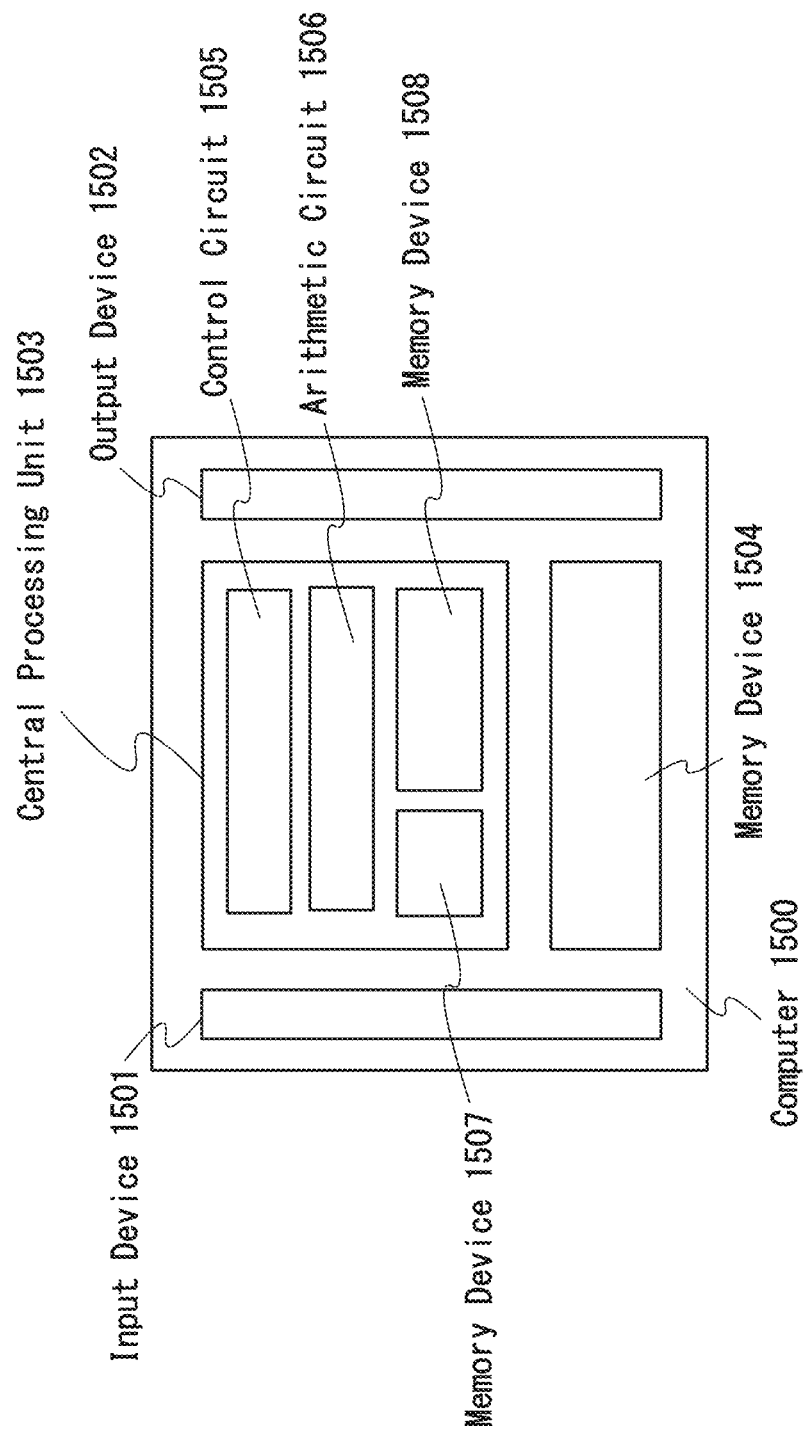
FIG. 15 is a block diagram of a computer.

FIG. 15 illustrates an example of a computer as a semiconductor device. A computer 1500 includes an input device 1501, an output device 1502, a central processing unit 1503, and a memory device 1504. The central processing unit 1503 includes a control circuit 1505, an arithmetic circuit 1506, a memory circuit (register) 1507, and a memory circuit (cache memory) 1508. The input device 1501 has a function of inputting data from the outside to the computer 1500. The arithmetic circuit 1506 has a function of performing a calculation using input data. The output device 1502 has a function of outputting data from the computer 1500 to the outside. The control circuit 1505 has a function of outputting control signals to the input device 1501, the output device 1502, and the memory device (main memory) 1504 for controlling the respective devices. The memory device (register) 1507 retains data used for calculations by the arithmetic circuit 1506. The memory device (cache memory) 1508 is used to store often-used information in the memory device (main memory) 1504. The higher access is possible by the memory device (cache memory) 1508 than by the memory device (main memory) 1504, which increases the processing speed of the central processing unit 1503. Note that the main memory has a larger capacitance than the cache memory, and the cache memory has a larger capacitance than the register. The cache memory and the register operate at a higher speed than the main memory. The memory cell 100, the memory cell 200, the memory cell 300, and the memory cell 400 can be used for at least one of the memory circuit (register) 1507, the memory circuit (cache memory) 1508, and the memory device (main memory) 1504.

Examples of electronic devices are described as semiconductor devices. Examples of electronic devices include mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic devices are shown in FIGS. 16A and 16F.

Figure 16A:
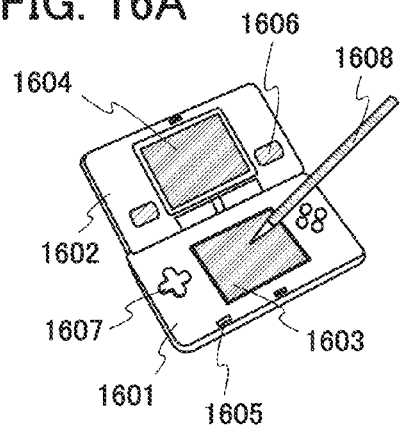
FIGS. 16A to 16F illustrate examples of electronic devices.

FIG. 16A illustrates a portable game machine including a housing 1601, a housing 1602, a display portion 1603, a display portion 1604, a microphone 1605, a speaker 1606, an operation key 1607, a stylus 1608, and the like. Although the portable game machine in FIG. 16A has the two display portions 1603 and 1604, the number of display portions included in a portable game machine is not limited to this.

Figure 16B:
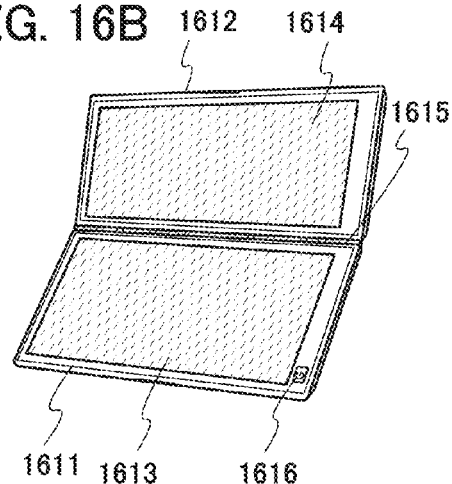

FIG. 16B illustrates a portable data terminal including a first housing 1611, a second housing 1612, a first display portion 1613, a second display portion 1614, a joint 1615, an operation key 1616, and the like. The first display portion 1613 is provided in the first housing 1611, and the second display portion 1614 is provided in the second housing 1612. The first housing 1611 and the second housing 1612 are connected to each other with the joint 1615, and the angle between the first housing 1611 and the second housing 1612 can be changed with the joint 1615. An image on the first display portion 1613 may be switched depending on the angle between the first housing 1611 and the second housing 1612 at the joint 1615. A display device with a position input function may be used as at least one of the first display portion 1613 and the second display portion 1614. Note that the position input function can be added by provision of a touch panel in a display device. Alternatively, the position input function can be added by provision of a photoelectric conversion element called a photosensor in a pixel area of a display device.

Figure 16C:
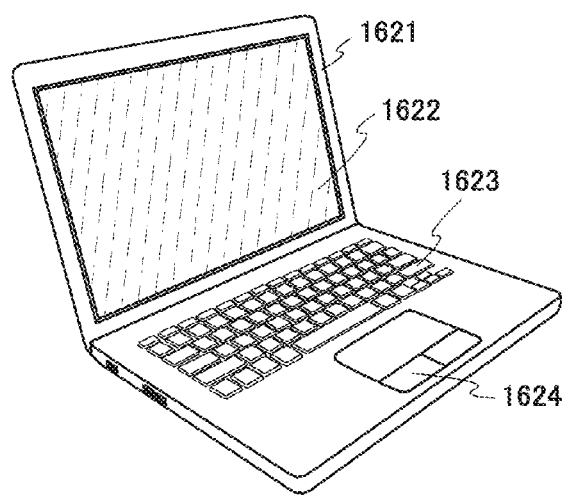

FIG. 16C illustrates a laptop personal computer, which includes a housing 1621, a display portion 1622, a keyboard 1623, a pointing device 1624, and the like.

Figure 16D:
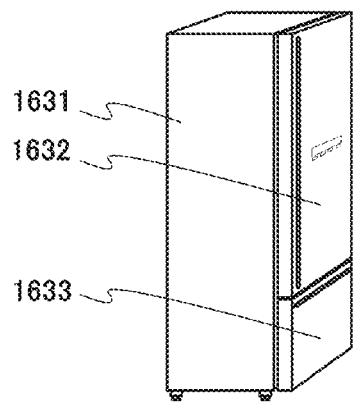

FIG. 16D illustrates the electric refrigerator-freezer including a housing 1631, a door for a refrigerator 1632, a door for a freezer 1633, and the like.

Figure 16E:
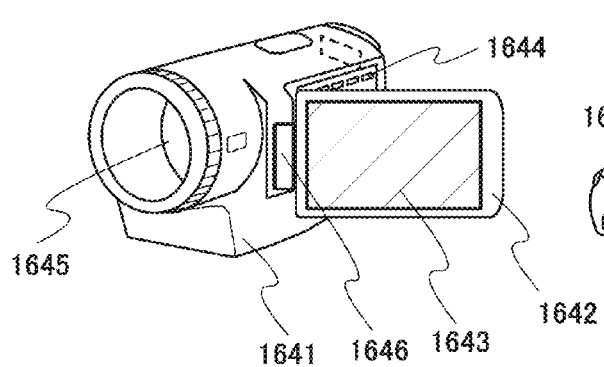
Figure 16F:
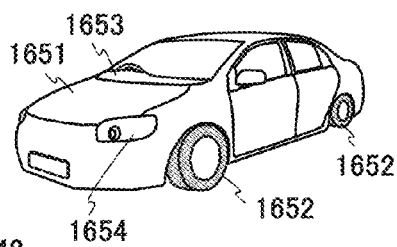

FIG. 16E illustrates a video camera, which includes a first housing 1641, a second housing 1642, a display portion 1643, operation keys 1644, a lens 1645, a joint 1646, and the like. The operation keys 1644 and the lens 1645 are provided for the first housing 1641, and the display portion 1643 is provided for the second housing 1642. The first housing 1641 and the second housing 1642 are connected to each other with the joint 1646, and the angle between the first housing 1641 and the second housing 1642 can be changed with the joint 1646. Images displayed on the display portion 1643 may be switched in accordance with the angle at the joint 1646 between the first housing 1641 and the second housing 1642.

FIG. 16F illustrates a car including a car body 1651, wheels 1652, a dashboard 1653, lights 1654, and the like.

Each of the above-mentioned portable game machine, portable data terminal, laptop personal computer, electric refrigerator-freezer, video camera, and car includes a computer including at least one of the memory cells 100, 200, 300, and 400.

Embodiment 2

An example of a manufacturing process of the semiconductor device in FIGS. 7A and 7B is described with reference to FIGS. 17A to 17D. Patent Document 1 can be referred to for the details.

Figure 17A:
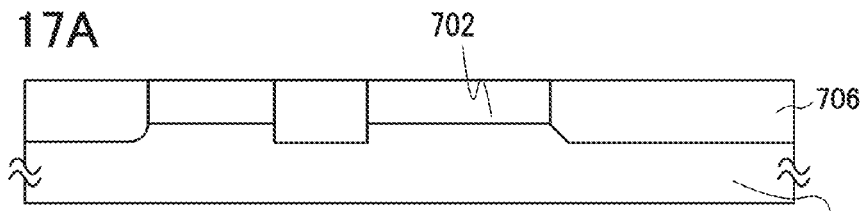
FIGS. 17A to 17D are cross-sectional views illustrating a manufacturing process of a semiconductor device.

The element isolation insulating region 706 and the N-type well 702 are provided in the semiconductor substrate 701 which is single crystal, polycrystalline, or amorphous (FIG. 17A).

The insulating layer 707 and the conductive layer 709 are formed, and the impurity region 703, the impurity region 704, and the impurity region 705 are formed in the N-type well 702. These impurity regions are P-type impurity regions. A layer including a material having higher conductivity such as a silicide may be stacked over these impurity regions. These impurity regions may include an extension region.

Furthermore, the insulating layer 708 is provided. The insulating layer 708 is a single layer or a multilayer, and preferably is capable of supplying oxygen to an upper layer and preventing hydrogen and water from moving from a lower layer to the upper layer. Then, the insulating layer 708 is removed partly and planarized, and a top surface of the conductive layer 709 is exposed.

Figure 17B:
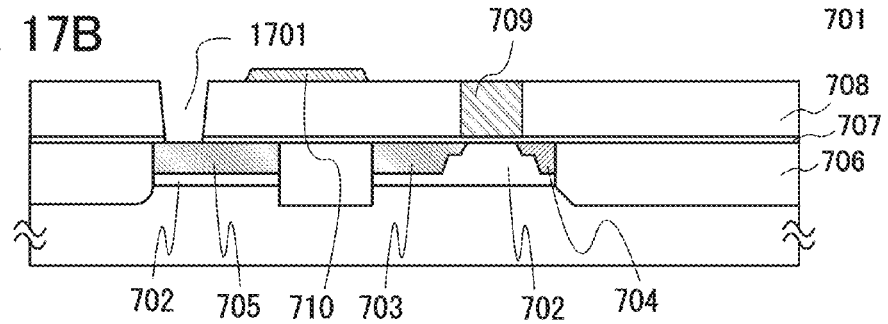

The semiconductor layer 710 is provided over the insulating layer 708. Note that a semiconductor other than an oxide semiconductor may be used. For example, a silicon layer having a thickness of 2 nm or less may be used. A contact hole 1701 is formed in the insulating layer 708 (FIG. 17B).

A conductive material is deposited to form a conductive layer part of which fills in the contact hole 1701. At this time, the semiconductor layer 710 is covered with the conductive layer. The conductive layer has a single-layer or multilayer structure. Furthermore, the surface of the conductive layer is planarized. Then, the conductive layer is selectively etched to form the conductive layer 711. Note that the conductive layer 711 may have a structure in which a contact plug is included in the contact hole 1701.

Figure 17C:
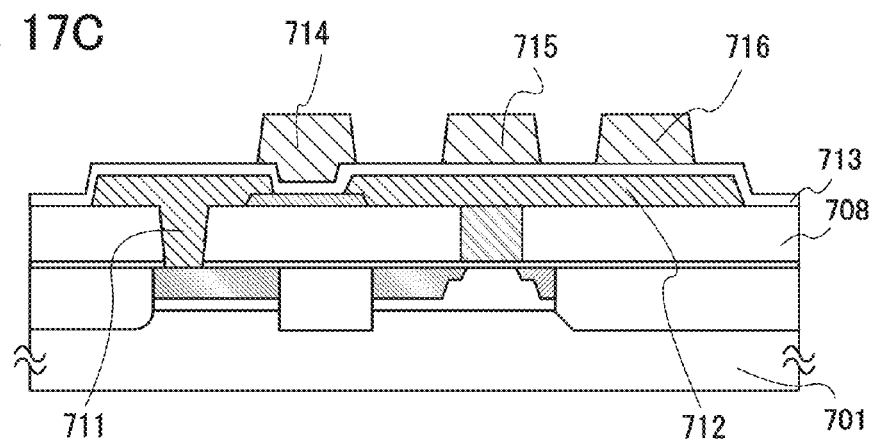

The insulating layer 713 is formed to cover the conductive layer 711. A conductive material is deposited to form a conductive layer. The conductive material has a single-layer or multilayer structure, and preferably is capable of preventing hydrogen and water from moving from the upper layer to the lower layer. The conductive layer is selectively etched to form the conductive layers 714, 715, and 716 (FIG. 17C).

An insulating layer is formed and a surface thereof is planarized to form the insulating layer 717. Then, a contact hole is formed in the insulating layer 717. A conductive material is deposited to form a conductive layer part of which fills in the contact hole. The conductive layer is etched to form the conductive layer 718. The conductive layer 718 may have a structure in which a contact plug is included in the contact hole.

Figure 17D:
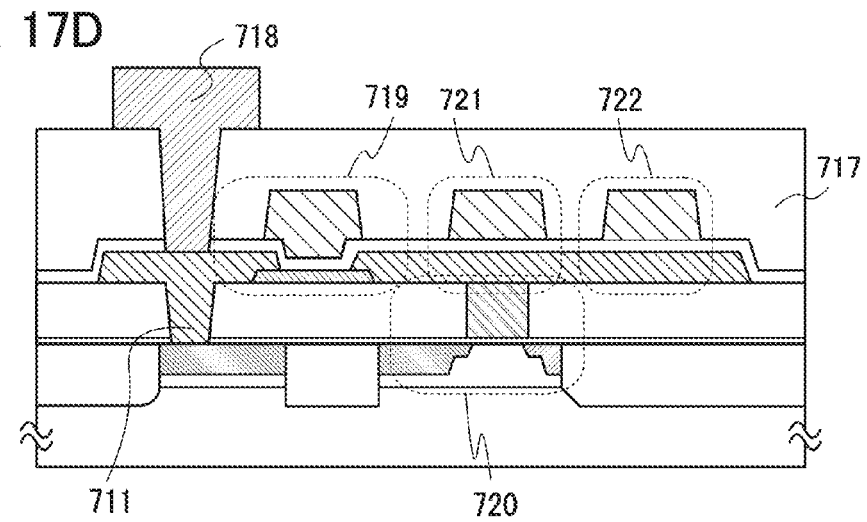

Thus, the transistor 719, the transistor 720, the capacitor 721, and the capacitor 722 as illustrated in FIG. 17D can be formed.

Embodiment 3

Described is a design example of a memory device with a storage capacity of 1 kbit, which is a specific mode of the semiconductor device described in Embodiment 1.

Figure 22:
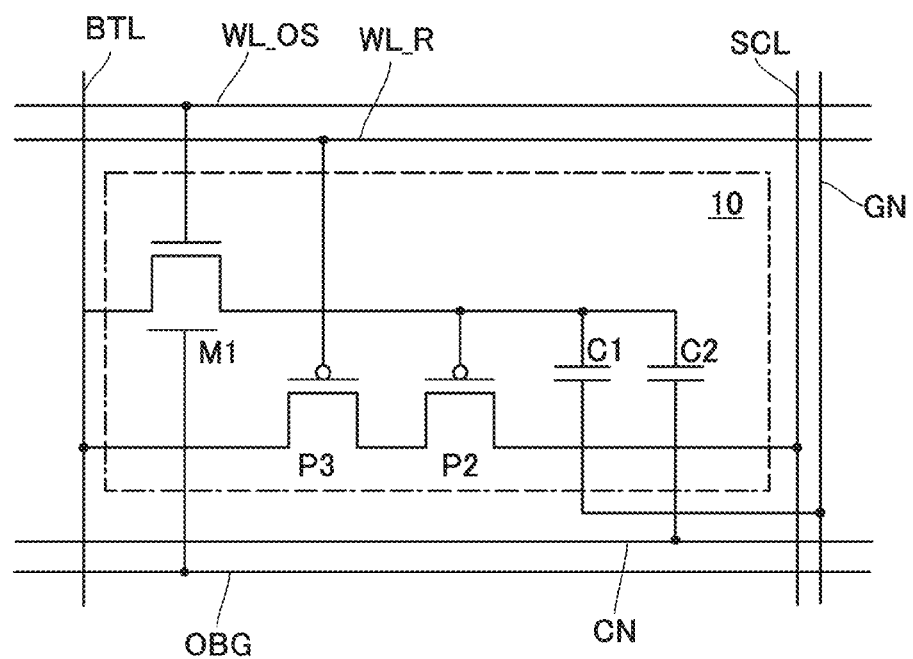
FIG. 22 is a circuit diagram of a memory cell.

FIG. 22 is a circuit diagram of a memory cell. A memory cell 10 illustrated in FIG. 22 has a circuit configuration similar to that of the memory cell 100, and includes a transistor M1 (first transistor), a transistor P2 (second transistor), a transistor P3 (third transistor), a capacitor C1 (first capacitor), and a capacitor C2 (second capacitor). The memory cell 10 is electrically connected to a wiring BTL (first wiring 106), a wiring SCL (second wiring), a wiring GN (third wiring), a wiring CN (fourth wiring), a wiring WL_OS (fifth wiring), a wiring WL_R (sixth wiring), and a wiring OBG (eighth wiring). The memory cell 10 differs from the memory cell 100 in that the transistor M1 includes a back gate and this back gate is electrically connected to the wiring OBG.

Figure 23:
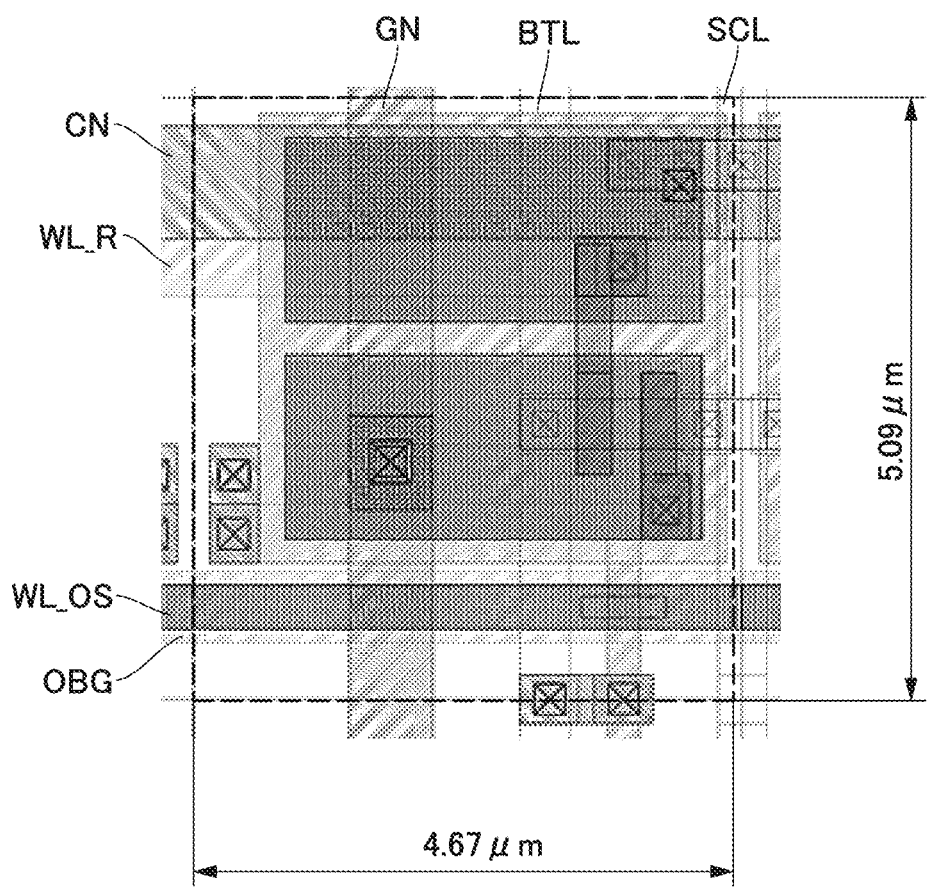
FIG. 23 is a layout view of a memory cell.

FIG. 23 is a layout view of the memory cell 10. The design values of the memory cell 10 are described below.

The size of the memory cell 10 is 4.67 μm (H)×5.09 μm (V). The area and capacitance of the capacitor C1 are equal to those of the capacitor C2. The area is 3.55 μm×1.56 μm, and the capacitance is 15.46 fF. The size (channel width W/channel length L) of each of the transistors P2 and P3 is 0.3 μm/0.42 μm, and the size (W/L) of the transistor M1 is 0.18 μm/0.28 μm.

Figure 24:
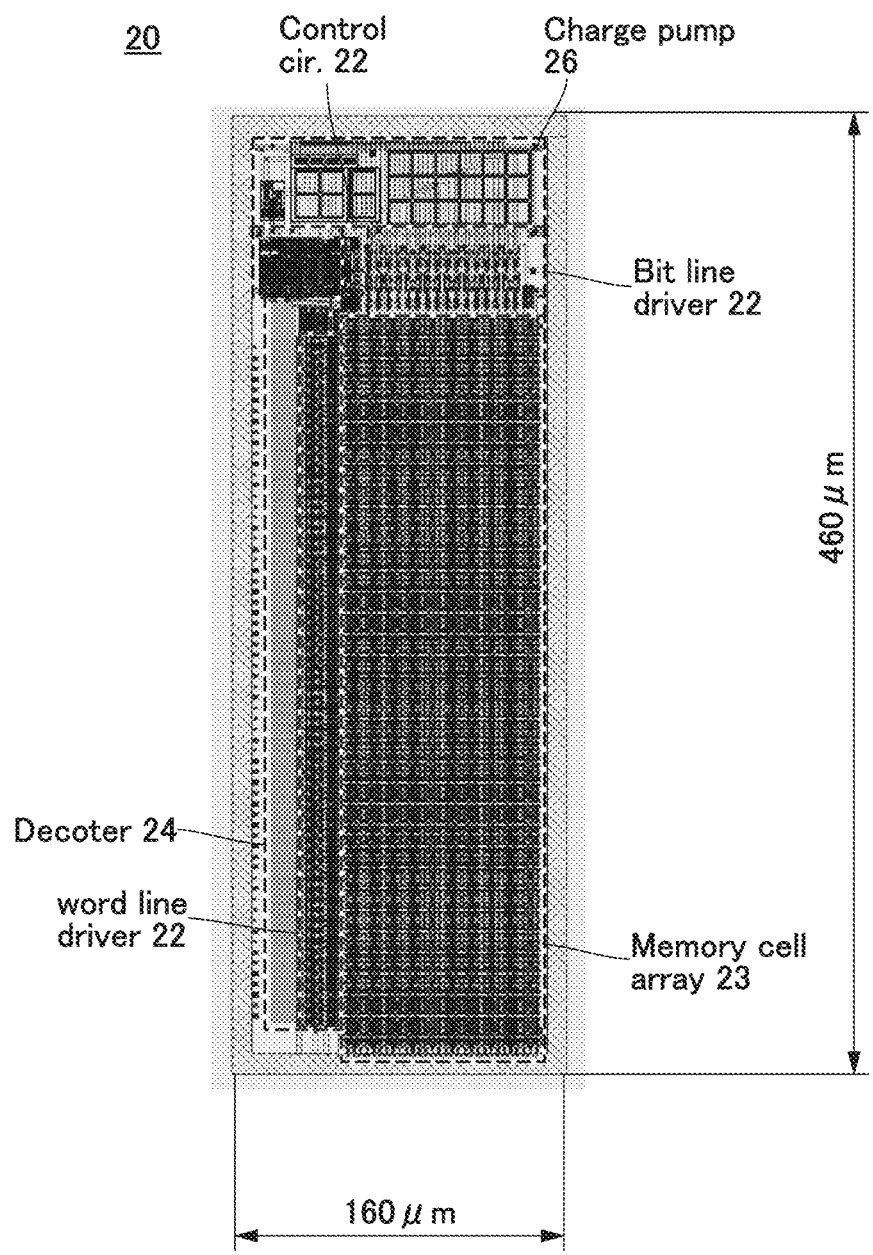
FIG. 24 is a layout view of a memory device.

FIG. 24 is a layout view of a memory device to which the memory cell 10 illustrated in FIG. 23 is applied. Memory cells in a memory device 20 illustrated in FIG. 24 are designed under the same design rule as the memory cell 10 illustrated in FIG. 23. The size is 160 μm (H)×460 μm (V). In the case where the memory cell 10 is a single level cell (SLC), it has a storage capacity of 1040 bits (16×(64+1)).

The memory device 20 includes a word line driver 21, a bit line driver 22, a memory cell array 23, a decoder 24, a control circuit 25, and a charge pump 26. The power supply lines are configured to be three independent systems. The power supply potentials are VDDM, VSSM, and VBG. VDDM is a high power supply potential, and VSSM is a low power supply potential. For example, VDDM can be 1.2 V and VSSM can be the grounded potential. VBG is lower than VSSM. VSSM is input to the wiring GN, and VBG is input to the wiring OBG. The charge pump 26 generates a voltage VDDH that is higher than VDDM. VDDH is a potential for making the potential of the wiring WL_OS an H level.

Figure 25:
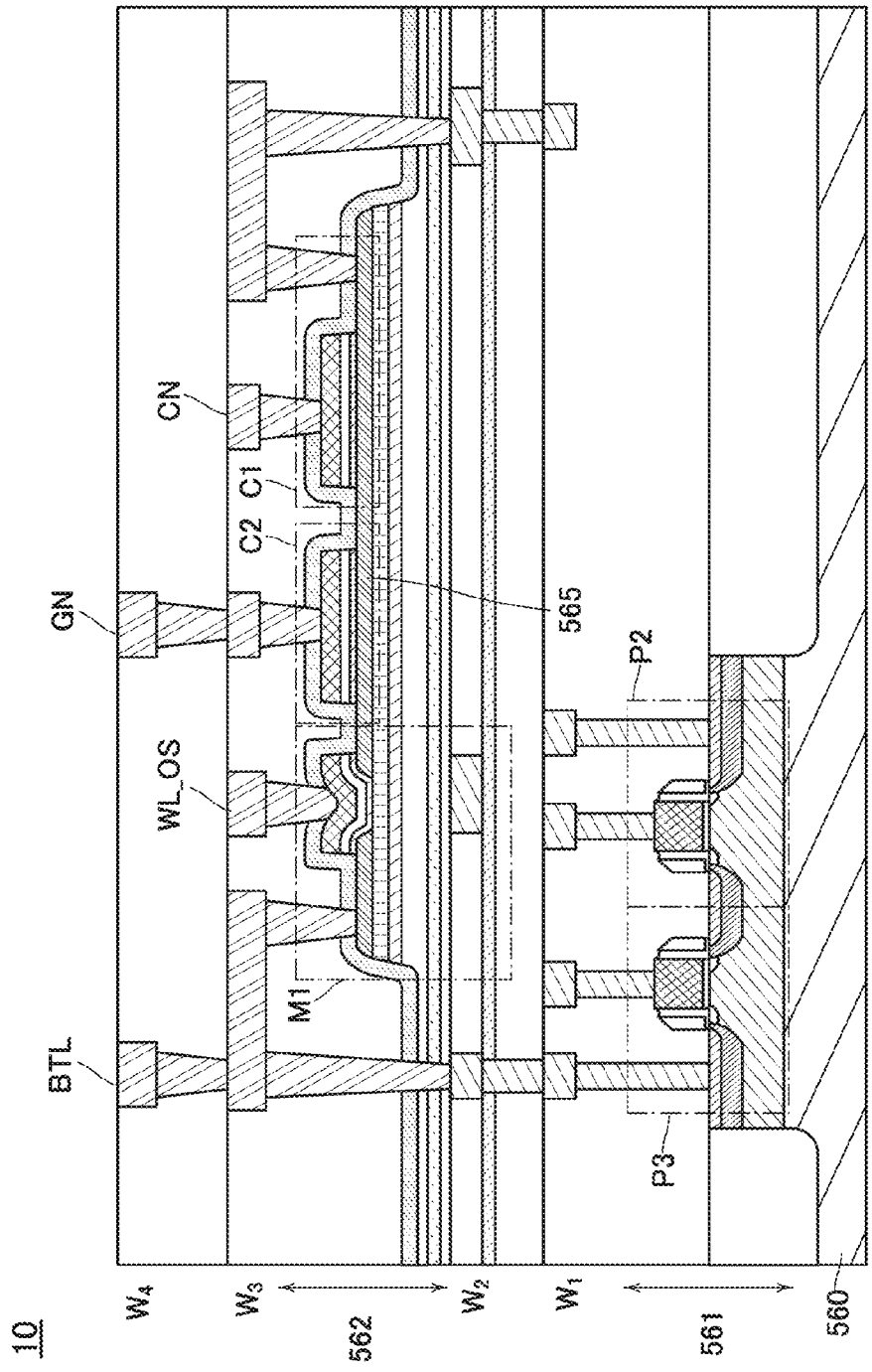
FIG. 25 is a schematic cross-sectional view of a semiconductor device.

FIG. 25 is a schematic cross-sectional view of the memory cell 10. The memory cell 10 is formed using a single crystal silicon wafer 560. Reference numerals 561 and 562 denote element layers, and reference numerals $W_1$ to $W_4$ represent wiring layers. In the element layer 561, Si transistors (the transistors P2 and P3) are formed. In the element layer 562, a transistor using an oxide semiconductor (a transistor M1) is formed. In the element layer 562, the transistor M1 and the capacitors C1 and C2 are formed. The transistor M1 and the capacitors C1 and C2 share a conductive layer 565 over the oxide semiconductor layer region. The wiring layers $W_1$ to $W_4$ electrically connect the transistors P2, P3, and M1 and the capacitors C1 and C2; thus, the memory cell 20 in FIG. 22 is formed.

Embodiment 4

A transistor using an oxide semiconductor (hereinafter referred to as an OS transistor) is described.

Structure Example 1 of OS Transistor

Figure 26A:
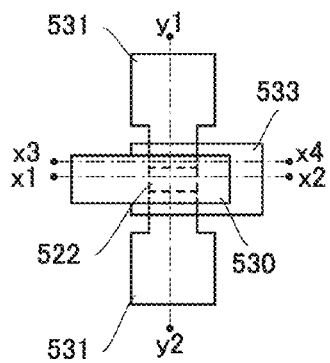
FIG. 26A is a top view illustrating a structure example of an OS transistor.
Figure 26B:
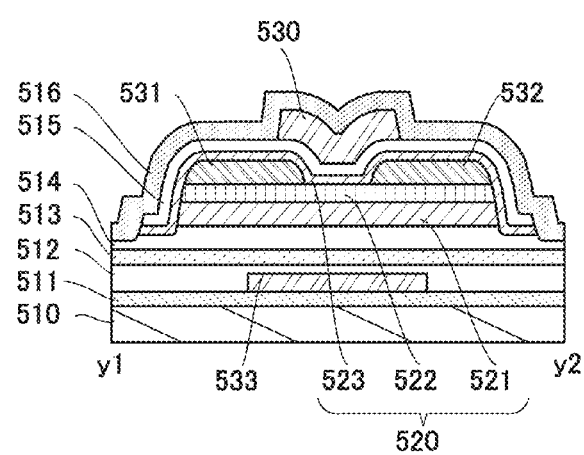
FIG. 26B is a cross-sectional view taken along the line y1-y2 in FIG. 26A.
Figure 26C:
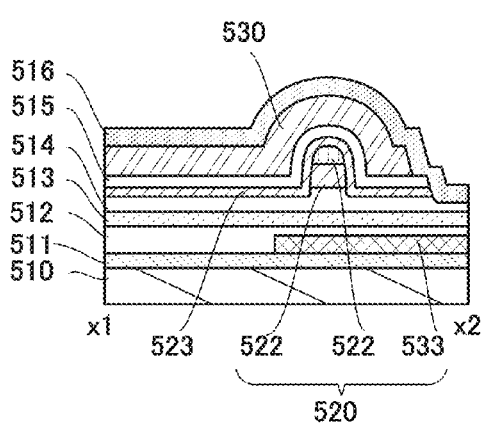
FIG. 26C is a cross-sectional view taken along the line x1-x2 in FIG. 26A.
Figure 26D:
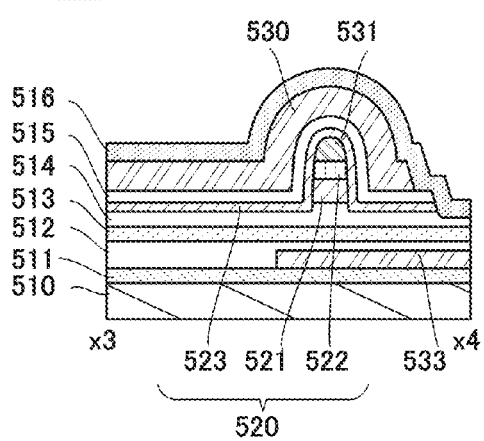
FIG. 26D is a cross-sectional view taken along the line x3-x4 in FIG. 26A.

FIGS. 26A to 26D illustrate a structure example of an OS transistor. FIG. 26A is a top view illustrating a structure example of an OS transistor. FIG. 26B is a cross-sectional view taken along line y1-y2 in FIG. 26A. FIG. 26C is a cross-sectional view taken along line x1-x2 in FIG. 26A. FIG. 26D is a cross-sectional view taken along line x3-x4 in FIG. 26A. In some cases, the direction of line y1-y2 is referred to as a channel length direction, and the direction of line x1-x2 is referred to as a channel width direction. Accordingly, FIG. 26B illustrates a cross-sectional structure of the OS transistor in the channel length direction, and FIGS. 26C and 26D each illustrate a cross-sectional structure of the OS transistor in the channel width direction. Note that to clarify the device structure, FIG. 26A does not illustrate some components.

An OS transistor 581 is formed over an insulating surface, here, over an insulating layer 511. The insulating layer 511 is formed over a surface of a substrate 510. The OS transistor 581 is covered with an insulating layer 516. Note that it is possible to regard the insulating layer 516 as a component of the OS transistor 581. The OS transistor 581 includes an insulating layer 512, an insulating layer 513, an insulating layer 514, an insulating layer 515, semiconductor layers 521 to 523, a conductive layer 530, a conductive layer 531, a conductive layer 532, and a conductive layer 533. Here, the semiconductor layers 521 to 523 are collectively referred to as a semiconductor region 520.

The conductive layer 530 functions as a gate electrode, and the conductive layer 533 functions as a back gate electrode. The conductive layers 531 and 532 function as a source electrode and a drain electrode. The insulating layer 511 has a function of electrically isolating the substrate 510 and the conductive layer 533 from each other. The insulating layer 515 forms a gate insulating layer, and the insulating layers 513 and 514 form a gate insulating layer on the back channel side.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases.

For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

As illustrated in FIGS. 26B and 26C, the semiconductor region 520 includes a region where the semiconductor layer 521, the semiconductor layer 522, and the semiconductor layer 523 are stacked in that order. The insulating layer 515 covers this stack region. The conductive layer 530 overlaps with the stack region with the insulating layer 513 positioned therebetween. The conductive layers 531 and 532 are provided over the stack formed of the semiconductor layers 521 and 523 and are in contact with a top surface of this stack and a side surface positioned in the channel length direction of the stack. The stack of the semiconductor layers 521 and 522 and the conductive layers 531 and 532 are formed by etching using the same mask.

The semiconductor layer 523 is formed to cover the semiconductor layers 521 and 522 and the conductive layers 531 and 532. The insulating layer 515 covers the semiconductor layer 523. Here, the semiconductor layer 523 and the insulating layer 515 are etched using the same mask.

The conductive layer 530 is formed to surround, in the channel width direction, the region where the semiconductor layers 521 to 523 are stacked with the insulating layer 515 positioned therebetween (see FIG. 26C). Therefore, a gate electric field in a vertical direction and a gate electric field in a lateral direction are applied to this stack region. In the OS transistor 581, the gate electric field refers to an electric field generated by voltage applied to the conductive layer 530 (gate electrode layer). Accordingly, the whole stack region of the semiconductor layers 521 to 523 can be electrically surrounded by the gate electric fields, so that a channel is formed in the whole semiconductor layer 522 (bulk) in some cases. A device structure of a transistor in which, like the transistor 581, a semiconductor layer where a channel is formed is electrically surrounded by electric fields of a gate electrode can be called a surrounded channel (s-channel) structure. The OS transistor 581 can have high on-state current due to the s-channel structure. The s-channel structure can improve frequency characteristics of the OS transistor 581. Specifically, the s-channel structure can improve cutoff frequency.

The s-channel structure, because of its high on-state current, is suitable for a semiconductor device such as large-scale integration (LSI) that needs a scaled down transistor. Since high on-state current can be obtained, the s-channel structure is suitable for a transistor that needs to operate at high frequency. A semiconductor device including the transistor can operate at high frequency.

Scaling down of the OS transistor can provide a small highly integrated semiconductor device. The OS transistor preferably has, for example, a region where channel length is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm. In addition, the OS transistor preferably has, for example, a region where channel width is greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, even still more preferably greater than or equal to 10 nm and less than 30 nm.

<Insulating Layer>

The insulating layers 511 to 516 are each formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that in this specification, an oxynitride refers to a compound that contains more oxygen than nitrogen, and a nitride oxide refers to a compound that contains more nitrogen than oxygen. In this specification and the like, an oxide that is used for an insulating material includes an oxide with a nitrogen concentration of less than 1 atomic.

Since the insulating layer 514 and the insulating layer 515 are in contact with the semiconductor region 520, the insulating layers 514 and 515 preferably contain an oxide, particularly, an oxide material from which part of oxygen is released by heating. The insulating layers 514 and 515 each preferably contain an oxide containing oxygen more than that in the stoichiometric composition. Part of oxygen is released by heating from an oxide film containing oxygen more than that in the stoichiometric composition. Oxygen released from the insulating layers 514 and 515 is supplied to the semiconductor region 520 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C., and lower than or equal to 700° C., or higher than or equal to 100° C., and lower than or equal to 500° C.

The insulating layer 513 has a passivation function of preventing a reduction in oxygen contained in the insulating layer 514. The reduction in oxygen is caused by bonding of the oxygen contained in the insulating layer 514 to metal contained in the conductive layer 533. The insulating layer 516 has a passivation function of preventing a reduction in oxygen contained in the insulating layer 514.

The insulating layers 511, 513, and 516 each preferably have a function of blocking oxygen, hydrogen, water, an alkali metal, an alkaline earth metal, and the like. The insulating layers 511, 513, and 516 can prevent outward diffusion of oxygen from the semiconductor region 520 and entry of hydrogen, water, or the like into the semiconductor region 520 from the outside. The insulating layers 511, 513, and 516 may each be formed using, for example, at least one insulating film of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like so that they can have such a function.

<Conductive Layer>

The conductive film 674 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. The conductive layer is preferably formed using a low-resistance conductive material such as aluminum or copper. The conductive layer is particularly preferably formed using a Cu—Mn alloy because manganese oxide formed at the interface with an insulator containing oxygen has a function of preventing Cu diffusion.

The conductive layers 531 and 532 in the OS transistor 582 are formed using a hard mask used for forming the stack of the semiconductor layers 521 and 522. Therefore, the conductive layers 531 and 532 do not have regions in contact with the side surfaces of the semiconductor layers 521 and 522. For example, through the following steps, the semiconductor layers 521 and 522 and the conductive layers 531 and 532 can be formed. A two-layer oxide semiconductor film including the semiconductor layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the semiconductor layers 521 and 522. Then, the hard mask is etched to form the conductive layers 531 and 532.

<Semiconductor Layer>

The semiconductor layer 522 is an oxide semiconductor containing indium (In), for example. The semiconductor layer 522 has high carrier mobility (electron mobility) by containing indium, for example. The semiconductor layer 522 preferably contains an element M. The element M is preferably aluminum (Al), gallium (Ga), yttrium (Y), tin (Sn), or the like. Other elements which can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor layer 522 preferably contains zinc (Zn). When the oxide semiconductor contains zinc, the oxide semiconductor is easily to be crystallized, for example.

Note that the semiconductor layer 522 is not limited to the oxide semiconductor containing indium. The semiconductor layer 522 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide. For the semiconductor layer 522, an oxide with a wide energy gap may be used. For example, the energy gap of the semiconductor layer 522 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. It is preferable that the semiconductor region 520 be formed with an CAAC-OS to be described later. Alternatively, it is preferable that at least the semiconductor layer 522 be formed with an CAAC-OS.

For example, the semiconductor layer 521 and the semiconductor layer 523 include one or more, or two or more elements other than oxygen included in the semiconductor layer 522. Since the semiconductor layer 521 and the semiconductor layer 523 each include one or more, or two or more elements other than oxygen included in the semiconductor layer 522, an interface state is less likely to be formed at the interface between the semiconductor layer 521 and the semiconductor layer 522 and the interface between the semiconductor layer 522 and the semiconductor layer 523.

In the case of using an In-M-Zn oxide as the semiconductor layer 521, when a summation of In and M is assumed to be 100 atomic, the proportions of In and M are preferably set to be less than 50 atomic and greater than 50 atomic, respectively further preferably less than 25 atomic and greater than 75 atomic, respectively. In the case where the semiconductor layer 521 is formed by a sputtering method, a sputtering target with the above composition is preferably used. For example, In:M:Zn is preferably 1:3:2.

In the case of using an In-M-Zn oxide as the semiconductor layer 522, when the summation of In and M is assumed to be 100 atomic, the proportions of In and M are preferably set to be greater than 25 atomic and less than 75 atomic, respectively, further preferably greater than 34 atomic and less than 66 atomic, respectively. In the case where the semiconductor layer 522 is formed by a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the semiconductor layer 522 may be 4:2:3 or in the neighborhood of 4:2:3.

In the case of using an In-M-Zn oxide as the semiconductor layer 523, when the summation of In and M is assumed to be 100 atomic, the proportions of In and M are preferably set to be less than 50 atomic and greater than 50 atomic, respectively, further preferably less than 25 atomic and greater than 75 atomic, respectively. Note that the semiconductor layer 523 may be an oxide that is a type the same as that of the semiconductor layer 521. Note that the semiconductor layer 521 and/or the semiconductor layer 523 do/does not necessarily contain indium in some cases. For example, the semiconductor layer 521 and/or the semiconductor layer 523 may be gallium oxide.

(Energy Band Structure)

Figure 27A:
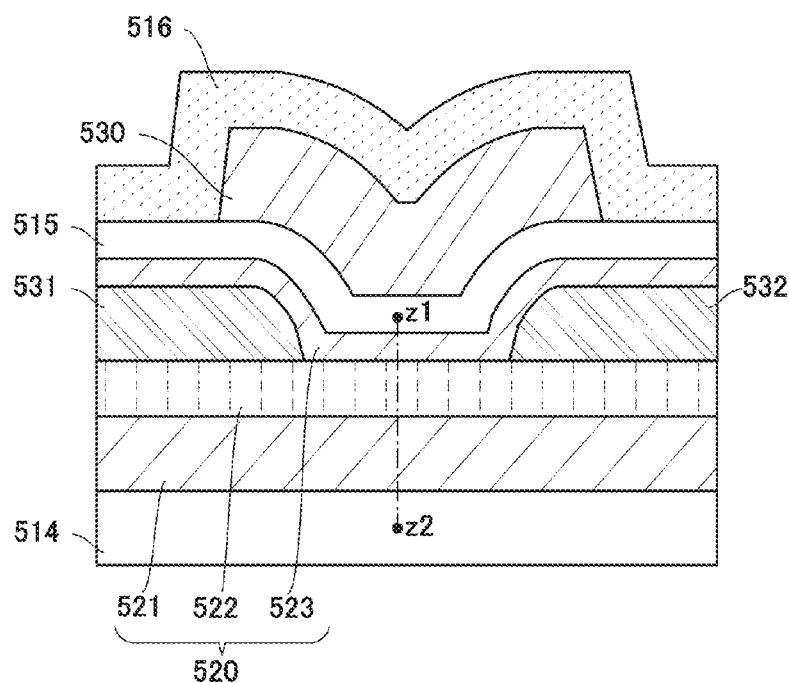
FIG. 27A is a partial enlarged view of FIG. 26B.
Figure 27B:
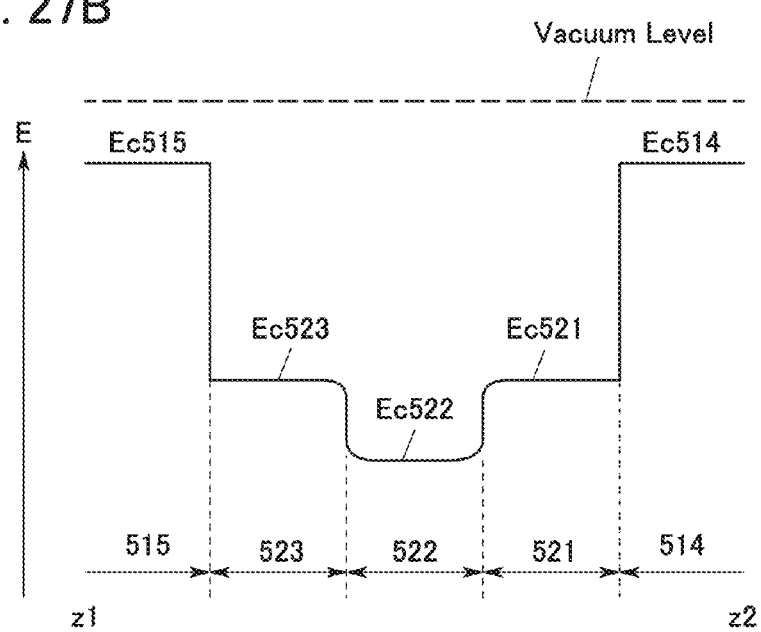
FIG. 27B is an energy band diagram of an OS transistor.

The function and effect of the semiconductor region 520 in which the semiconductor layers 521, 522, and 523 are stacked are described with reference to FIGS. 27A and 27B. FIG. 27A is a partial enlarged view of an active layer (a channel portion) of the OS transistor 581 in FIG. 26B. FIG. 27B illustrates an energy band structure in a region of the active layer of the OS transistor 581, and illustrates an energy band structure in a portion taken along the dotted line Z1-Z2 in FIG. 27A.

In FIG. 27B, Ec514, Ec521, Ec522, Ec523, and Ec515 indicate the energy at the bottom of the conduction band of the insulating layer 514, the semiconductor layer 521, the semiconductor layer 522, the semiconductor layer 523, and the insulating layer 515, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer. The energy difference between the vacuum level and the top of the valence band can be measured using an ultraviolet photoelectron spectroscopy (UPS) device.

Since the insulating layer 515 and the insulating layer 516 are insulators, Ec512 and Ec513 are closer to the vacuum level than Ec521, Ec522, and Ec523 (i.e., the insulating layer 515 and the insulating layer 516 have a lower electron affinity than the semiconductor layers 521, 522, and 523).

As the semiconductor layer 522, an oxide having an electron affinity higher than those of the semiconductor layers 521 and 523 is used. For example, as the semiconductor layer 522, an oxide having an electron affinity higher than those of the semiconductor layers 521 and 523 by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor layer 523 preferably includes an indium gallium oxide. The gallium atomic ratio [Ga/(In+Ga)] is, for example, higher than or equal to 70, preferably higher than or equal to 80, further preferably higher than or equal to 90. At this time, when a gate voltage is applied, a channel is formed in the semiconductor layer 522 having the highest electron affinity in the semiconductor layer 521, the semiconductor layer 522, and the semiconductor layer 523.

Here, a mixed region of the semiconductor layer 521 and the semiconductor layer 522 exists between the semiconductor layer 521 and the semiconductor layer 522 in some cases. In addition, a mixed region of the semiconductor layer 522 and the semiconductor layer 523 exists between the semiconductor layer 522 and the semiconductor layer 523 in some cases. The mixed region has a low interface state density. For that reason, the stack of the semiconductor layer 521, the semiconductor layer 522, and the semiconductor layer 523 has a band structure where energy at each interface and in the vicinity of the interface is changed continuously (continuous junction).

At this time, electrons move mainly in the semiconductor layer 522, not in the semiconductor layer 521 and the semiconductor layer 523. As described above, when the interface state density at the interface between the semiconductor layer 521 and the semiconductor layer 522 and the interface state density at the interface between the semiconductor layer 522 and the semiconductor layer 523 are decreased, electron movement in the semiconductor layer 522 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large. The electron movement is also inhibited, for example, in the case where the density of defect states is high in a region where a channel is formed.

To increase the on-state current of the OS transistor 581, for example, root mean square (RMS) roughness with a measurement area of 1 μm×1 μm of a top surface or a bottom surface of the semiconductor layer 522 (a formation surface; here, the semiconductor layer 521) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope.

For example, in the case where the semiconductor layer 522 contains oxygen vacancies (also denoted by Vo), donor levels are formed by entry of hydrogen into sites of oxygen vacancies in some cases. A state in which hydrogen enters sites of oxygen vacancies is denoted by $V_oH$ in the following description in some cases. $V_oH$ is a factor of decreasing the on-state current of the transistor because $V_oH$ scatters electrons. Note that sites of oxygen vacancies become more stable by entry of oxygen than by entry of hydrogen. Thus, by decreasing oxygen vacancies in the semiconductor layer 522, the on-state current of the transistor can be increased in some cases.

For example, at a certain depth in the semiconductor layer 522 or in a certain region of the semiconductor layer 522, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor layer 522, for example, there is a method in which excess oxygen in the insulating layer 515 is moved to the semiconductor layer 522 through the semiconductor layer 521. In this case, the semiconductor layer 521 is preferably a layer having an oxygen-transmitting property (a layer through which oxygen passes or is transmitted).

In the case where the OS transistor 581 has an s-channel structure, a channel is formed in the whole of the semiconductor layer 522. Therefore, as the semiconductor layer 522 has a larger thickness, a channel region becomes larger. In other words, the thicker the semiconductor layer 522 is, the larger the on-state current of the OS transistor 581 is.

Moreover, the thickness of the semiconductor layer 523 is preferably as small as possible to increase the on-state current of the OS transistor 581. The thickness of the semiconductor layer 523 is less than 10 nm, preferably less than or equal to 5 nm, more preferably less than or equal to 3 nm, for example. Meanwhile, the semiconductor layer 523 has a function of blocking entry of elements other than oxygen (such as hydrogen and silicon) included in the adjacent insulator into the semiconductor layer 522 where a channel is formed. For this reason, it is preferable that the semiconductor layer 523 have a certain thickness. The thickness of the semiconductor layer 523 is greater than or equal to 0.3 nm, preferably greater than or equal to 1 nm, further preferably greater than or equal to 2 nm, for example. The semiconductor layer 523 preferably has an oxygen blocking property to suppress outward diffusion of oxygen released from the insulating layer 515 and the like.

To improve reliability of the OS transistor 581, it is preferable that the thickness of the semiconductor layer 521 be large and the thickness of the semiconductor layer 523 be small. For example, the semiconductor layer 521 has a region with a thickness, for example, greater than or equal to 10 nm, preferably greater than or equal to 20 nm, further preferably greater than or equal to 40 nm, still further preferably greater than or equal to 60 nm. When the thickness of the semiconductor layer 521 is made large, a distance from an interface between the adjacent insulator and the semiconductor layer 521 to the semiconductor layer 522 in which a channel is formed can be large. Since the productivity of the semiconductor device might be decreased, the semiconductor layer 521 has a region with a thickness, for example, less than or equal to 200 nm, preferably less than or equal to 120 nm, further preferably less than or equal to 80 nm.

In order that the OS transistor 581 have stable electrical characteristics, it is effective to make the semiconductor layer 522 intrinsic or substantially intrinsic by reducing the concentration of impurities in the semiconductor region 520. Note that in this specification and the like, the carrier density of a substantially intrinsic oxide semiconductor film is higher than or equal to $1 \times 10^{-9}/cm^3$ and lower than $8 \times 10^{11}/cm^3$, preferably lower than $1 \times 10^{11}/cm^3$, more preferably lower than $1 \times 10^{10}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the semiconductor layers 521, 522, and 523 and at interfaces between the semiconductor layers.

For example, a region with a silicon concentration of $1 \times 10^{16}$ atoms/cm$^3$ or greater and less than $1 \times 10^{19}$ atoms/cm$^3$ exists between the semiconductor layer 522 and the semiconductor layer 521. The silicon concentration is preferably greater than or equal to $1 \times 10^{16}$ atoms/cm$^3$ and less than $5 \times 10^{18}$ atoms/cm$^3$, and more preferably greater than or equal to $1 \times 10^{16}$ atoms/cm$^3$ and less than $2 \times 10^{18}$ atoms/cm$^3$. In addition, a region with a silicon concentration of greater than or equal to $1 \times 10^{16}$ atoms/cm$^3$ and less than $1 \times 10^{19}$ atoms/cm$^3$ exists between the semiconductor layer 522 and the semiconductor layer 523. The silicon concentration is preferably greater than or equal to $1 \times 10^{16}$ atoms/cm$^3$ and less than $5 \times 10^{18}$ atoms/cm$^3$, and more preferably greater than or equal to $1 \times 10^{16}$ atoms/cm$^3$ and less than $2 \times 10^{18}$ atoms/cm$^3$. The silicon concentration can be measured by, for example, SIMS.

In order to reduce the concentration of hydrogen in the semiconductor layer 522, it is preferable to reduce the concentrations of hydrogen in the semiconductor layer 521 and the semiconductor layer 523. Each of the semiconductor layers 521 and 523 has a region with a hydrogen concentration of greater than or equal to $1 \times 10^{16}$ atoms/cm$^3$ and less than or equal to $2 \times 10^{20}$ atoms/cm$^3$. The hydrogen concentration is preferably greater than or equal to $1 \times 10^{16}$ atoms/cm$^3$ and less than or equal to $5 \times 10^{19}$ atoms/cm$^3$, more preferably greater than or equal to $1 \times 10^{16}$ atoms/cm$^3$ and less than or equal to $1 \times 10^{19}$ atoms/cm$^3$, and further more preferably greater than or equal to $1 \times 10^{16}$ atoms/cm$^3$ and less than or equal to $5 \times 10^{18}$ atoms/cm$^3$. The hydrogen concentration can be measured by, for example, SIMS.

In order to reduce the concentration of nitrogen in the semiconductor layer 522, it is preferable to reduce the concentrations of nitrogen in the semiconductor layers 521 and 523. Each of the semiconductor layers 521 and 523 has a region with a nitrogen concentration of greater than or equal to $1 \times 10^{16}$ atoms/cm$^3$ and less than $5 \times 10^{19}$ atoms/cm$^3$. The nitrogen concentration is preferably greater than or equal to $1 \times 10^{16}$ atoms/cm$^3$ and less than or equal to $5 \times 10^{18}$ atoms/cm$^3$, more preferably greater than or equal to $1 \times 10^{16}$ atoms/cm$^3$ and less than or equal to $1 \times 10^{18}$ atoms/cm$^3$, and further more preferably greater than or equal to $1 \times 10^{16}$ atoms/cm$^3$ and less than or equal to $5 \times 10^{17}$ atoms/cm$^3$. The nitrogen concentration can be measured by SIMS.

A transistor in which the above highly purified oxide semiconductor is used for a channel formation region exhibits extremely small off-state current. When voltage between a source and a drain is set at about 0.1 V, 5 V, or 10 V, for example, the off-state current standardized on the channel width of the transistor can be as small as several yoctoamperes per micrometer to several zeptoamperes per micrometer.

FIGS. 26A to 26D illustrate an example where the semiconductor region 520 includes three layers, but are not limited to this. For example, the semiconductor region 520 may have a two-layer structure without including the semiconductor layer 521 or the semiconductor layer 523. Alternatively, the semiconductor region 520 may have a four-layer structure in which a semiconductor layer similar to the semiconductor layers 521 to 523 is provided over or under the semiconductor layer 521 or 523. Further alternatively, the semiconductor region 520 may have an n-layer structure (n is an integer of 5 or more) in which a semiconductor layer similar to the semiconductor layers 521 to 523 is provided in two or more portions of a portion over the semiconductor layer 521, a portion under the semiconductor layer 521, a portion over the semiconductor layer 523, and a portion under the semiconductor layer 523.

In the case where the OS transistor 581 is a transistor without a back gate electrode, the conductive layer 533 is not provided. In that case, the insulating layers 512 and 513 are also not provided, and the insulating layer 513 is formed over the insulating layer 511.

<Substrate>

As the substrate 510, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. The semiconductor substrate may be a bulk semiconductor substrate or may be a silicon on insulator (SOI) substrate in which a semiconductor layer is provided for a semiconductor substrate with an insulating region positioned therebetween.

As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 510. As a method for providing a transistor over a flexible substrate, there is a method in which a transistor is formed over a non-flexible substrate (e.g., a semiconductor substrate), and then the transistor is separated and transferred to the substrate 510 that is a flexible substrate. In that case, a separation layer is preferably provided between the non-flexible substrate and the transistor. As the substrate 510, a sheet, a film, or foil containing a fiber may be used. The substrate 510 may have elasticity. The substrate 510 may have a property of returning to its original shape when bending or pulling is stopped. Alternatively, the substrate 510 may have a property of not returning to its original shape. The thickness of the substrate 510 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 510 has small thickness, the weight of the semiconductor device can be reduced. When the substrate 510 has small thickness, even in the case of using glass or the like, the substrate 510 may have elasticity or a property of returning to its original shape when bending or pulling is stopped. Therefore, an impact applied to the semiconductor device over the substrate 510, which is caused by dropping or the like, can be reduced. That is, a durable semiconductor device can be provided.

For the flexible substrate 510, metal, an alloy, resin, glass, or fiber thereof can be used, for example. The flexible substrate preferably has a lower coefficient of linear expansion because deformation due to an environment is suppressed. The flexible substrate is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate because of its low coefficient of linear expansion.

Structure Example 2 of OS Transistor

Figure 28A:
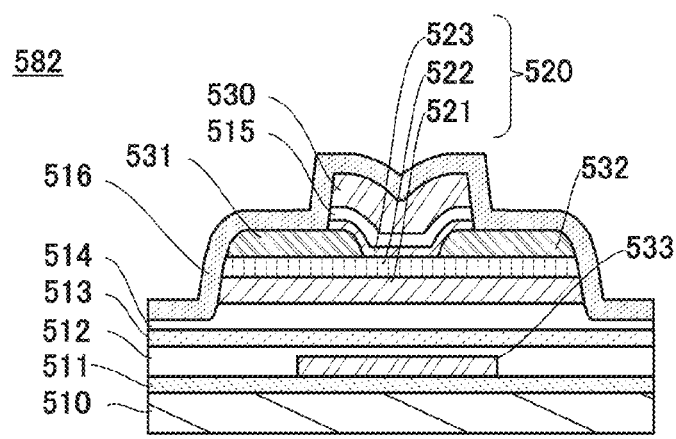
FIGS. 28A to 28C are cross-sectional views illustrating structure examples of OS transistors.

In the OS transistor 581 illustrated in FIG. 26A, the semiconductor layer 523 and the insulating layer 515 can be etched using the conductive layer 530 as a mask. FIG. 28A illustrates a structure example of an OS transistor formed through such a process. In the OS transistor 582 illustrated in FIG. 28A, edges of the semiconductor layer 523 and the insulating layer 515 are substantially aligned with an edge of the conductive layer 530. The semiconductor layer 523 and the insulating layer 513 exist only under the conductive layer 530.

Structure Example 3 of OS Transistor

Figure 28B:
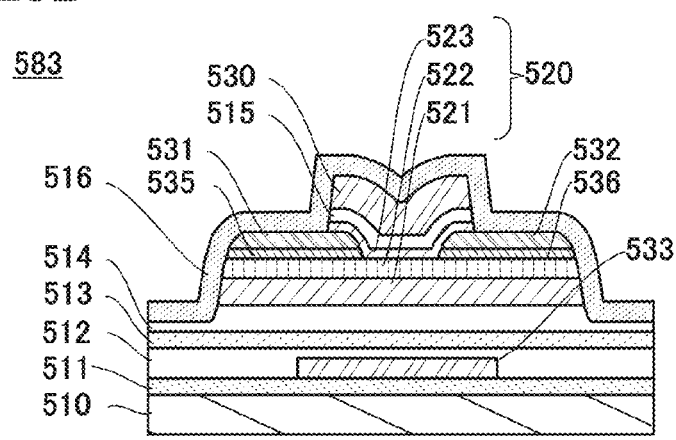

An OS transistor 583 illustrated in FIG. 28B has a device structure in which a conductive layer 535 and a conductive layer 536 are added to the OS transistor 582. A pair of electrodes which function as a source electrode and a drain electrode of the OS transistor 583 are formed of a stacked layer of the conductive layer 535 and the conductive layer 531 and a stacked layer of the conductive layer 536 and the conductive layer 532.

The conductive layers 535 and 536 are formed using a single-layer or multilayer conductor. The conductive layers 535 and 536 may have a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound may be used, for example, and a conductor containing aluminum, a conductor containing copper and titanium, a conductor containing copper and manganese, a conductor containing indium, tin, and oxygen, a conductor containing titanium and nitrogen, or the like may be used as the conductor.

The conductive layers 535 and 536 may have a property of transmitting visible light. Alternatively, the conductive layers 535 and 536 may have a property of not transmitting visible light, ultraviolet light, infrared light, or an X-ray by reflecting or absorbing it. In some cases, such a property can suppress a change in electrical characteristics of the OS transistor 582 due to stray light.

As each of the conductive layers 535 and 536, a layer which does not form a Schottky barrier with the semiconductor layer 522 or the like is preferably used in some cases. Accordingly, on-state characteristics of the OS transistor 583 can be improved.

As each of the conductive layers 535 and 536, a film having higher resistance than the conductive layers 531 and 532 is preferably used in some cases. In addition, the conductive layers 535 and 536 preferably have lower resistance than a channel of the OS transistor 583 (specifically, the semiconductor layer 522) in some cases. For example, the conductive layers 535 and 536 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 535 and 536 having a resistivity within the above range can reduce electric field concentration in a boundary portion between the channel and the drain. Therefore, a change in electrical characteristics of the OS transistor 583 can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive layers 535 and 536 (e.g., the layer on the drain side) is preferably provided in some cases.

Structure Example 4 of OS Transistor

Figure 28C:
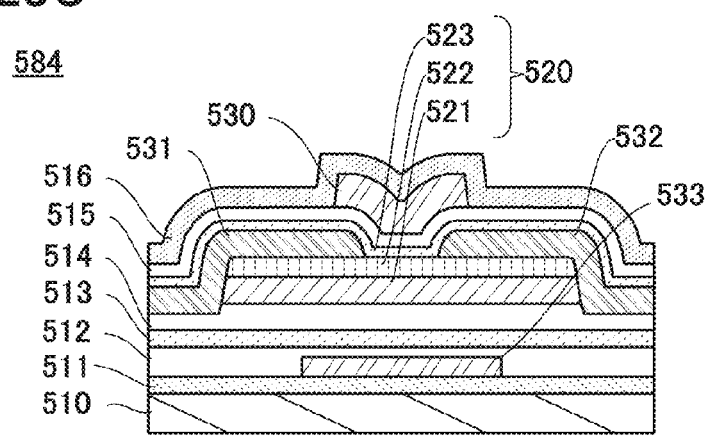

In the OS transistor 581 illustrated in FIGS. 26A to 26D, the conductive layer 531 and the conductive layer 532 may be in contact with side surfaces of the semiconductor layers 521 and 522. Such a structure example is illustrated in FIG. 28C. In an OS transistor 584 illustrated in FIG. 28C, the conductive layer 531 and the conductive layer 532 are in contact with the side surfaces of the semiconductor layers 521 and 522.

Embodiment 5

Structure of Oxide Semiconductor

The structure of an oxide semiconductor is described below. In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described. A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 29A:
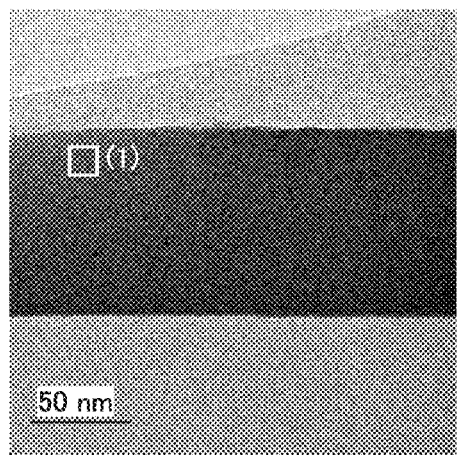
FIGS. 29A to 29C are Cs-corrected high-resolution TEM images of a cross section of a CAAC-OS and FIG. 29D is a schematic cross-sectional view of a CAAC-OS.

A CAAC-OS observed with TEM is described below. FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 29B:
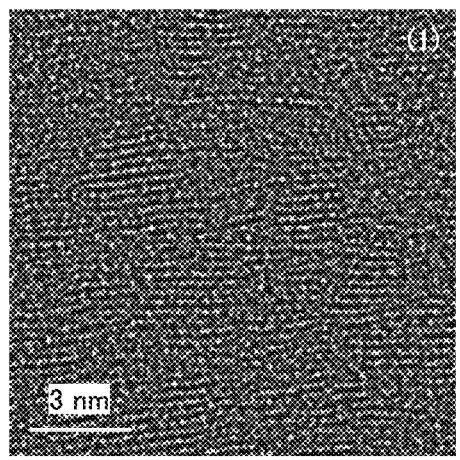

FIG. 29B is an enlarged Cs-corrected high-resolution TEM image of a region (1) in FIG. 29A. FIG. 29B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 29C:
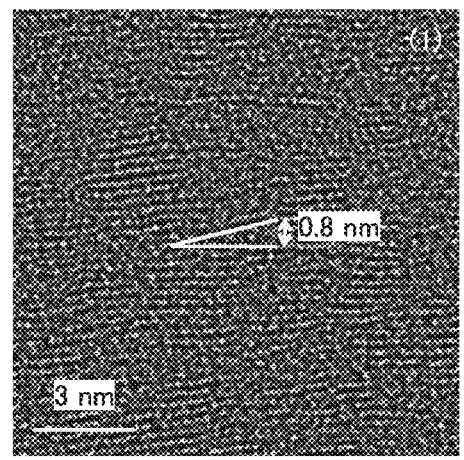

As shown in FIG. 29B, the CAAC-OS has a characteristic atomic arrangement. The characteristic atomic arrangement is denoted by an auxiliary line in FIG. 29C. FIGS. 29B and 29C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 29D:
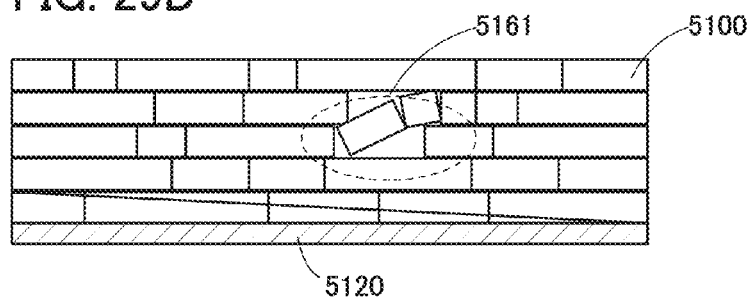

Here, according to the Cs-corrected high-resolution TEM images, the schematic arrangement of pellets 5100 of a CAAC-OS over a substrate 5120 is illustrated by such a structure in which bricks or blocks are stacked (see FIG. 29D). The part in which the pellets are tilted as observed in FIG. 29C corresponds to a region 5161 shown in FIG. 29D.

FIG. 30A shows a Cs-corrected high-resolution TEM image of a plane of the CAAC-OS observed from a direction substantially perpendicular to the sample surface. FIG. 30B. 30C, and 30D are enlarged Cs-corrected high-resolution TEM images of regions (1), (2), and (3) in FIG. 30A, respectively. FIGS. 30B, 30C, and 30D indicate that metal atoms are arranged in a triangular, quadrangular, or hexagonal configuration in a pellet. However, there is no regularity of arrangement of metal atoms between different pellets.

Figure 31A:
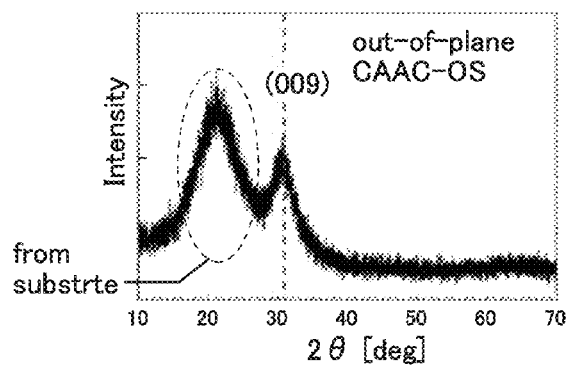
FIGS. 31A to 31C show results of structural analyses on a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 31A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 31B:
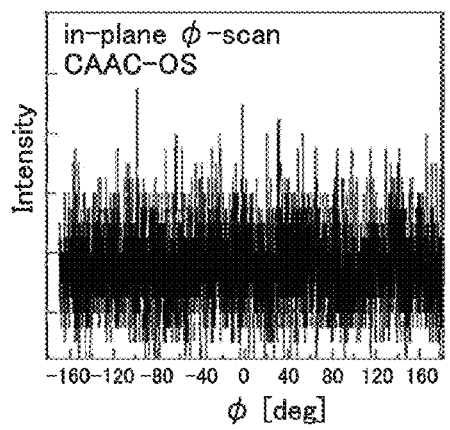
Figure 31C:
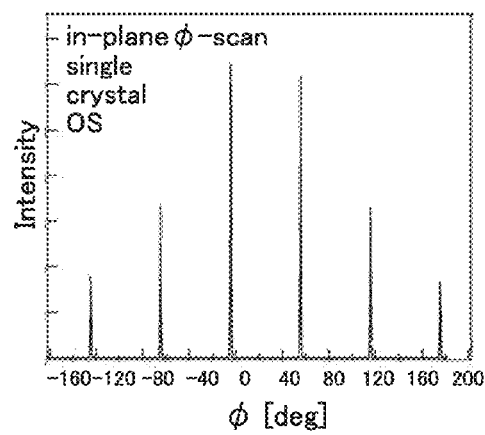

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 31B, a peak is not clearly observed. In contrast, in the case of a single crystal oxide semiconductor of $InGaZnO_4$, when φ scan is performed with 2θ fixed at around 56°, as shown in FIG. 31C, six peaks which are derived from crystal planes equivalent to the (110) plane are observed. Accordingly, the structural analysis using XRD shows that the directions of a-axes and b-axes are irregularly obtained in the CAAC-OS.

Figure 32A:
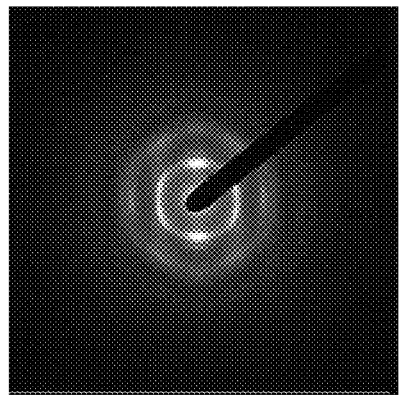
FIGS. 32A and 32B show electron diffraction patterns of a CAAC-OS.
Figure 32B:
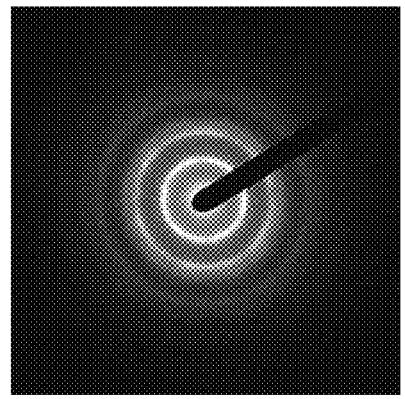

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 32A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32B shows a diffraction pattern obtained in such a manner that an electron beam with a probe diameter of 300 nm is incident on the same sample in a direction perpendicular to the sample surface. As shown in FIG. 32B, a ring-like diffraction pattern is observed. Thus, the electron diffraction also indicates that the a-axes and b-axes of the pellets included in the CAAC-OS do not have regular alignment. The first ring in FIG. 32B is considered to be derived from the (010) plane, the (100) plane, and the like of the InGaZnO$_4$ crystal. The second ring in FIG. 32B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed. The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples includes an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 33:
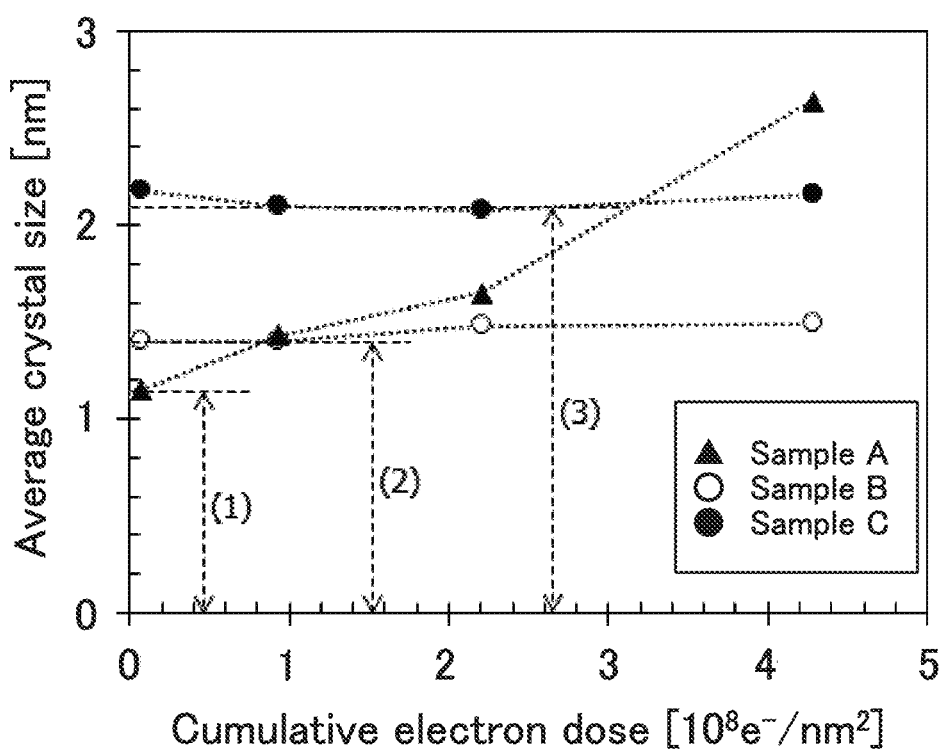
FIG. 33 shows a change in crystal part of an In—Ga—Zn oxide induced by electron irradiation.

FIG. 33 shows change in the average size of crystal parts (at 22 points to 45 points) in each sample. Note that the crystal part size corresponds to the length of a lattice fringe. FIG. 33 indicates that the crystal part size in the a-like OS increases with an increase in the cumulative electron dose. Specifically, as shown by (1) in FIG. 33, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 33, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6 and lower than 92.3 of the density of the single crystal oxide semiconductor having the same composition. The density of each of the nc-OS and the CAAC-OS is higher than or equal to 92.3 and lower than 100 of the density of the single crystal oxide semiconductor having the same composition. Note that it is difficult to deposit an oxide semiconductor having a density of lower than 78 of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher or equal 10 to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

As described above, oxide semiconductors have various structures and various properties. Note that an oxide semiconductor may be a stacked layer including two or more films of amorphous oxide semiconductor, a-like OS, nc-OS, and CAAC-OS, for example.

The CAAC-OS layer is formed by a sputtering method using a polycrystalline metal oxide target. The conditions described below are preferably employed for the formation of the CAAC-OS layer.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C., and lower than or equal to 740° C., preferably higher than or equal to 200° C., and lower than or equal to 500° C. By increasing the substrate heating temperature during the deposition, when the flat-plate-like or pellet-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol, preferably 100 vol.

The oxide semiconductor layer is not limited to a single-layer metal oxide layer and may have a stacked structure of a plurality of metal oxide layers. In a semiconductor layer in which first to third metal oxide layers are sequentially stacked, for example, the first metal oxide layer and the third metal oxide layer are each an oxide layer that contains at least one of the metal elements contained in the second metal oxide layer and whose lowest conduction band energy level is closer to the vacuum level than that of the second metal oxide layer by higher than or equal to 0.05 eV, 0.07 eV, 0.1 eV, or 0.15 eV and lower than or equal to 2 eV, 1 eV, 0.5 eV, or 0.4 eV. Further, the second metal oxide layer preferably contains at least indium in order to increase the carrier mobility.

In the transistor including the above oxide semiconductor layer, when a voltage is applied to the gate electrode so that an electric field is applied to the semiconductor layer, a channel region is formed in the second metal oxide layer whose lowest conduction band energy level is low in the semiconductor layer. That is, since the third metal oxide layer is provided between the second metal oxide layer and the gate insulating layer, a channel region can be formed in the second metal oxide layer that is insulated from the gate insulating layer.

Since the third metal oxide layer contains at least one of the metal elements contained in the second metal oxide layer, interface scattering is unlikely to occur at the interface between the second metal oxide layer and the third metal oxide layer. Thus, the movement of carriers is unlikely to be inhibited at the interface, which results in an increase in the field-effect mobility of the transistor.

Further, when an interface level is formed at the interface between the second metal oxide layer and the first metal oxide layer, a channel region is formed also in the vicinity of the interface, which causes a change in the threshold value of the transistor. However, since the first metal oxide layer contains at least one of the metal elements contained in the second metal oxide layer, an interface level is unlikely to be formed at the interface between the second metal oxide layer and the first metal oxide layer. Accordingly, the above structure allows reducing of variations in the electrical characteristics of the transistor, such as the threshold value.

Further, it is preferable that a plurality of metal oxide layers be stacked so that an interface level due to an impurity existing between the metal oxide layers, which inhibits carrier flow, is not formed at the interface between the metal oxide layers. This is because when an impurity exists between the stacked metal oxide layers, the continuity of the lowest conduction band energy level between the metal oxide layers is lost, and carriers are trapped or disappear by recombination in the vicinity of the interface. By reducing an impurity existing between the layers, a continuous junction (here, in particular, a U-shape well structure whose lowest conduction band energy level is changed continuously between the layers) is formed more easily than the case of merely stacking a plurality of metal oxide layers that share at least one main metal component.

In order to form such a continuous energy band, it is necessary to form layers continuously without being exposed to air, with use of a multi-chamber deposition apparatus (sputtering apparatus) including a load lock chamber. Each chamber in the sputtering apparatus is preferably evacuated to high vacuum (approximately $5 \times 10^{-7}$ Pa to approximately $1 \times 10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor layer as much as possible.

For example, the first metal oxide layer or the third metal oxide layer may be an oxide layer containing aluminum, silicon, titanium, gallium, germanium, yttrium, zirconium, tin, lanthanum, cerium, or hafnium at a higher atomic ratio than the second metal oxide layer. Specifically, the first metal oxide layer or the third metal oxide layer may be an oxide layer containing the above element at an atomic ratio 1.5 times or more, preferably twice or more, and more preferably three times or more that in the second metal oxide layer. The above element is strongly bonded to oxygen, and thus has a function of suppressing generation of oxygen vacancies in the oxide layer. That is, oxygen vacancies are less likely to be generated in the first metal oxide layer or the third metal oxide layer than in the second metal oxide layer. The first metal oxide layer and the third metal oxide layer each have a thickness of 3 nm to 100 nm, preferably 3 nm to 50 nm. The second metal oxide layer has a thickness of 3 nm to 200 nm, preferably 3 nm to 100 nm, and more preferably 3 nm to 50 nm.

In the three-layer semiconductor layer, the first metal oxide layer and the third metal oxide layer can be amorphous or crystalline. Note that the second metal oxide layer in which a channel region is formed preferably has a crystalline structure, in which case the transistor can have stable electrical characteristics.

This application is based on Japanese Patent Application serial no. 2014-242844 filed with Japan Patent Office on Dec. 1, 2014, the entire contents of which are hereby incorporated by reference.

What is claimed is:

1. A semiconductor device comprising:
a first transistor;
a second transistor;
a third transistor;
a first capacitor; and
a second capacitor,
wherein one of a source and a drain of the first transistor is electrically connected to a first wiring,
wherein the other of the source and the drain of the first transistor is electrically connected to a gate of the second transistor,
wherein the other of the source and the drain of the first transistor is electrically connected to a first electrode of the first capacitor,
wherein the other of the source and the drain of the first transistor is electrically connected to a first electrode of the second capacitor,
wherein one of a source and a drain of the second transistor is electrically connected to a second wiring,
wherein the third transistor and the second transistor are electrically connected in series,
wherein a second electrode of the first capacitor is electrically connected to a third wiring, and
wherein a second electrode of the second capacitor is electrically connected to a fourth wiring.

2. The semiconductor device according to claim 1,
wherein a gate of the first transistor is electrically connected to a fifth wiring, and
wherein a gate of the third transistor is electrically connected to a sixth wiring.

3. The semiconductor device according to claim 1,
wherein the other of the source and the drain of the second transistor is electrically connected to one of a source and a drain of the third transistor, and
wherein the other of the source and the drain of the third transistor is electrically connected to the first wiring.

4. The semiconductor device according to claim 1,
wherein the other of the source and the drain of the second transistor is electrically connected to one of a source and a drain of the third transistor, and
wherein the other of the source and the drain of the third transistor is electrically connected to a seventh wiring.

5. The semiconductor device according to claim 1,
wherein the one of the source and the drain of the second transistor is electrically connected to one of a source and a drain of the third transistor,
wherein the other of the source and the drain of the second transistor is electrically connected to the first wiring, and
wherein the other of the source and the drain of the third transistor is electrically connected to the second wiring.

6. The semiconductor device according to claim 1,
wherein the one of the source and the drain of the second transistor is electrically connected to one of a source and a drain of the third transistor,
wherein the other of the source and the drain of the second transistor is electrically connected to a seventh wiring, and
wherein the other of the source and the drain of the third transistor is electrically connected to the second wiring.

7. The semiconductor device according to claim 1, wherein the first transistor comprises an oxide semiconductor layer including a channel formation region.

8. A semiconductor device comprising:
a first memory cell;
a second memory cell; and
a third memory cell, wherein each of the first memory cell, the second memory cell, and the third memory cell comprises a first transistor, a second transistor, a third transistor, a first capacitor, and a second capacitor, wherein in the first memory cell, one of a source and a drain of the first transistor is electrically connected to a first wiring, wherein in the second memory cell, one of a source and a drain of the first transistor is electrically connected to a second wiring, wherein in the third memory cell, one of a source and a drain of the first transistor is electrically connected to the first wiring, wherein in each of the first memory cell, the second memory cell, and the third memory cell, the other of the source and the drain of the first transistor is electrically connected to a gate of the second transistor, wherein in each of the first memory cell, the second memory cell, and the third memory cell, the other of the source and the drain of the first transistor is electrically connected to a first electrode of the first capacitor, wherein in each of the first memory cell, the second memory cell, and the third memory cell, the other of the source and the drain of the first transistor is electrically connected to a first electrode of the second capacitor, wherein in the first memory cell, one of a source and a drain of the second transistor is electrically connected to a third wiring, wherein in the second memory cell, one of a source and a drain of the second transistor is electrically connected to a fourth wiring, wherein in the third memory cell, one of a source and a drain of the second transistor is electrically connected to the third wiring, wherein in each of the first memory cell, the second memory cell, and the third memory cell, the third transistor and the second transistor are electrically connected in series, wherein in the first memory cell, a second electrode of the first capacitor is electrically connected to a fifth wiring, wherein in the second memory cell, a second electrode of the first capacitor is electrically connected to the fifth wiring, wherein in the third memory cell, a second electrode of the first capacitor is electrically connected to the fifth wiring, wherein in the first memory cell, a second electrode of the second capacitor is electrically connected to a sixth wiring, wherein in the second memory cell, a second electrode of the second capacitor is electrically connected to the sixth wiring, and wherein in the third memory cell, a second electrode of the second capacitor is electrically connected to a seventh wiring.

9. The semiconductor device according to claim 8, wherein in the first memory cell, a gate of the first transistor is electrically connected to an eighth wiring, wherein in the second memory cell, a gate of the first transistor is electrically connected to the eighth wiring, wherein in the third memory cell, a gate of the first transistor is electrically connected to a ninth wiring, wherein in the first memory cell, a gate of the third transistor is electrically connected to a tenth wiring, wherein in the second memory cell, a gate of the third transistor is electrically connected to the tenth wiring, and wherein in the third memory cell, a gate of the third transistor is electrically connected to an eleventh wiring.

10. The semiconductor device according to claim 8, wherein in each of the first memory cell, the second memory cell, and the third memory cell, the other of the source and the drain of the second transistor is electrically connected to one of a source and a drain of the third transistor, wherein in the first memory cell, the other of the source and the drain of the third transistor is electrically connected to the first wiring, wherein in the second memory cell, the other of the source and the drain of the third transistor is electrically connected to the second wiring, and wherein in the third memory cell, the other of the source and the drain of the third transistor is electrically connected to the first wiring.

11. The semiconductor device according to claim 8, wherein in each of the first memory cell, the second memory cell, and the third memory cell, the other of the source and the drain of the second transistor is electrically connected to one of a source and a drain of the third transistor, wherein in the first memory cell, the other of the source and the drain of the third transistor is electrically connected to the third wiring, wherein in the second memory cell, the other of the source and the drain of the third transistor is electrically connected to the fourth wiring, and wherein in the third memory cell, the other of the source and the drain of the third transistor is electrically connected to the third wiring.

12. The semiconductor device according to claim 8, wherein in each of the first memory cell, the second memory cell, and the third memory cell, the other of the source and the drain of the second transistor is electrically connected to one of a source and a drain of the third transistor, wherein in the first memory cell, the other of the source and the drain of the third transistor is electrically connected to a twelfth wiring, wherein in the second memory cell, the other of the source and the drain of the third transistor is electrically connected to a thirteenth wiring, and wherein in the third memory cell, the other of the source and the drain of the third transistor is electrically connected to the twelfth wiring.

13. The semiconductor device according to claim 8, wherein in each of the first memory cell, the second memory cell, and the third memory cell, the one of the source and the drain of the second transistor is electrically connected to the one of the source and the drain of the third transistor, wherein in the first memory cell, the other of the source and the drain of the second transistor is electrically connected to a twelfth wiring, wherein in the second memory cell, the other of the source and the drain of the second transistor is electrically connected to a thirteenth wiring, wherein in the third memory cell, the other of the source and the drain of the second transistor is electrically connected to the twelfth wiring, wherein in the first memory cell, the other of the source and the drain of the third transistor is electrically connected to the third wiring, wherein in the second memory cell, the other of the source and the drain of the third transistor is electrically connected to the fourth wiring, and wherein in the third memory cell, the other of the source and the drain of the third transistor is electrically connected to the third wiring.

14. The semiconductor device according to claim 8, wherein in each of the first memory cell, the second memory cell, and the third memory cell, the first transistor comprises an oxide semiconductor layer including a channel formation region.

15. A method for driving a semiconductor device comprising a memory cell, the memory cell comprising:
   a first transistor;
   a second transistor;
   a third transistor;
   a first capacitor; and
   a second capacitor,
   wherein one of a source and a drain of the first transistor is electrically connected to a first wiring,
   wherein the other of the source and the drain of the first transistor is electrically connected to a gate of the second transistor,
   wherein the other of the source and the drain of the first transistor is electrically connected to a first electrode of the first capacitor,
   wherein the other of the source and the drain of the first transistor is electrically connected to a first electrode of the second capacitor,
   wherein one of a source and a drain of the second transistor is electrically connected to a second wiring,
   wherein the other of the source and the drain of the second transistor is electrically connected to one of a source and a drain of the third transistor, and
   wherein the other of a source and a drain of the third transistor is electrically connected to the first wiring,
   the method comprising the steps of:
   supplying a first potential to a second electrode of the first capacitor and a second electrode of the second capacitor when data is written to the memory cell; and
   supplying the first potential to the second electrode of the first capacitor and a second potential to the second electrode of the second capacitor.

16. The method for driving a semiconductor device, according to claim 15,
   wherein the first transistor is an N-channel transistor,
   wherein the second transistor is a P-channel transistor, and
   wherein the second potential is higher than the first potential.

17. The method for driving a semiconductor device, according to claim 15, wherein when the data is read out from the memory cell, the second potential is supplied to the second wiring.

* * * * *